United States Patent
Kawase

(10) Patent No.: US 9,651,583 B2
(45) Date of Patent: May 16, 2017

(54) MEASUREMENT MODULE, ELECTRONIC APPARATUS, POWER SUPPLY TAP, POWER SUPPLY UNIT, AND BUILT-IN MEASUREMENT MODULE

(71) Applicant: CANON DENSHI KABUSHIKI KAISHA, Chichibu-shi, Saitama (JP)

(72) Inventor: Masahiro Kawase, Chichibu (JP)

(73) Assignee: CANON DENSHI KABUSHIKI KAISHA, Tokyo (JP)

(*) Notice: Subject to any disclaimer, the term of this patent is extended or adjusted under 35 U.S.C. 154(b) by 207 days.

(21) Appl. No.: 14/479,159

(22) Filed: Sep. 5, 2014

(65) Prior Publication Data

US 2014/0375305 A1 Dec. 25, 2014

Related U.S. Application Data

(63) Continuation of application No. PCT/JP2013/001533, filed on Mar. 8, 2013.

(30) Foreign Application Priority Data

Mar. 16, 2012 (JP) ................. 2012-060949
Apr. 13, 2012 (JP) ................. 2012-092470

(51) Int. Cl.
*G01R 19/00* (2006.01)
*H01R 13/66* (2006.01)
(Continued)

(52) U.S. Cl.
CPC ....... *G01R 19/0038* (2013.01); *G01R 15/207* (2013.01); *H01R 13/6683* (2013.01); *G01R 21/06* (2013.01)

(58) Field of Classification Search
CPC ............. G01R 19/0038; G01R 15/207; H01R 13/6683
(Continued)

(56) References Cited

U.S. PATENT DOCUMENTS 5,485,292 A 1/1996 Wong et al.
5,889,403 A 3/1999 Kawase
(Continued)

FOREIGN PATENT DOCUMENTS

JP S58-156278 U 10/1983
JP 06-118102 A 4/1994
(Continued)

OTHER PUBLICATIONS

Japanese Office Action dated Jan. 20, 2017 in Japanese Application No. 2013-047099.

*Primary Examiner* — Christopher Mahoney
(74) *Attorney, Agent, or Firm* — Fitzpatrick, Cella, Harper & Scinto

(57) ABSTRACT

A measurement module includes a pair of input terminals, a pair of current paths connected to the pair of input terminals, and a pair of output terminals. A partition that is a non-magnetic insulating portion partitions an internal space of the measurement module into two spaces. Low-current components such as a magnetic detection element are disposed in a space different from a space in which the pair of current paths are housed. The presence of the partition allows the low-current components and the pair of current paths to be disposed close to one another, thus making it possible to reduce the size of the measurement module.

14 Claims, 48 Drawing Sheets

(51) Int. Cl.
  *G01R 15/20* (2006.01)
  *G01R 21/06* (2006.01)
(58) Field of Classification Search
  USPC .................................................. 324/140 R
  See application file for complete search history.

(56) References Cited

U.S. PATENT DOCUMENTS

| | | |
|---|---|---|
| 6,456,068 B1 | 9/2002 | Kawase |
| 6,642,705 B2 | 11/2003 | Kawase |
| 6,897,649 B2 | 5/2005 | Kawase |
| 6,989,666 B2 | 1/2006 | Kawase |
| 7,779,066 B2 | 8/2010 | Igarashi |
| 7,952,327 B2 | 5/2011 | Kudo et al. |
| 2008/0054907 A1* | 3/2008 | Kudo .................. G01R 31/025 324/426 |
| 2012/0239959 A1 | 9/2012 | Kiuchi et al. |
| 2012/0326716 A1 | 12/2012 | Kawase |
| 2013/0060494 A1 | 3/2013 | Tsuboi et al. |

FOREIGN PATENT DOCUMENTS

| | | |
|---|---|---|
| JP | H07-098335 A | 4/1995 |
| JP | 07-140179 A | 6/1995 |
| JP | 08-330644 A | 12/1996 |
| JP | 2002-243766 A | 8/2002 |
| JP | 2003-016339 A | 1/2003 |
| JP | 2006-184269 A | 7/2006 |
| JP | 2008-064536 A | 3/2008 |
| JP | 2009-150653 A | 7/2009 |
| JP | 2010-014477 A | 1/2010 |
| JP | 2010-261852 A | 11/2010 |
| JP | 2011-120324 A | 6/2011 |
| JP | 2012-068154 A | 4/2012 |
| WO | 2011-118184 A1 | 9/2011 |
| WO | 2011/148720 A1 | 12/2011 |
| WO | 2012/039514 A1 | 3/2012 |

* cited by examiner

F I G. 27
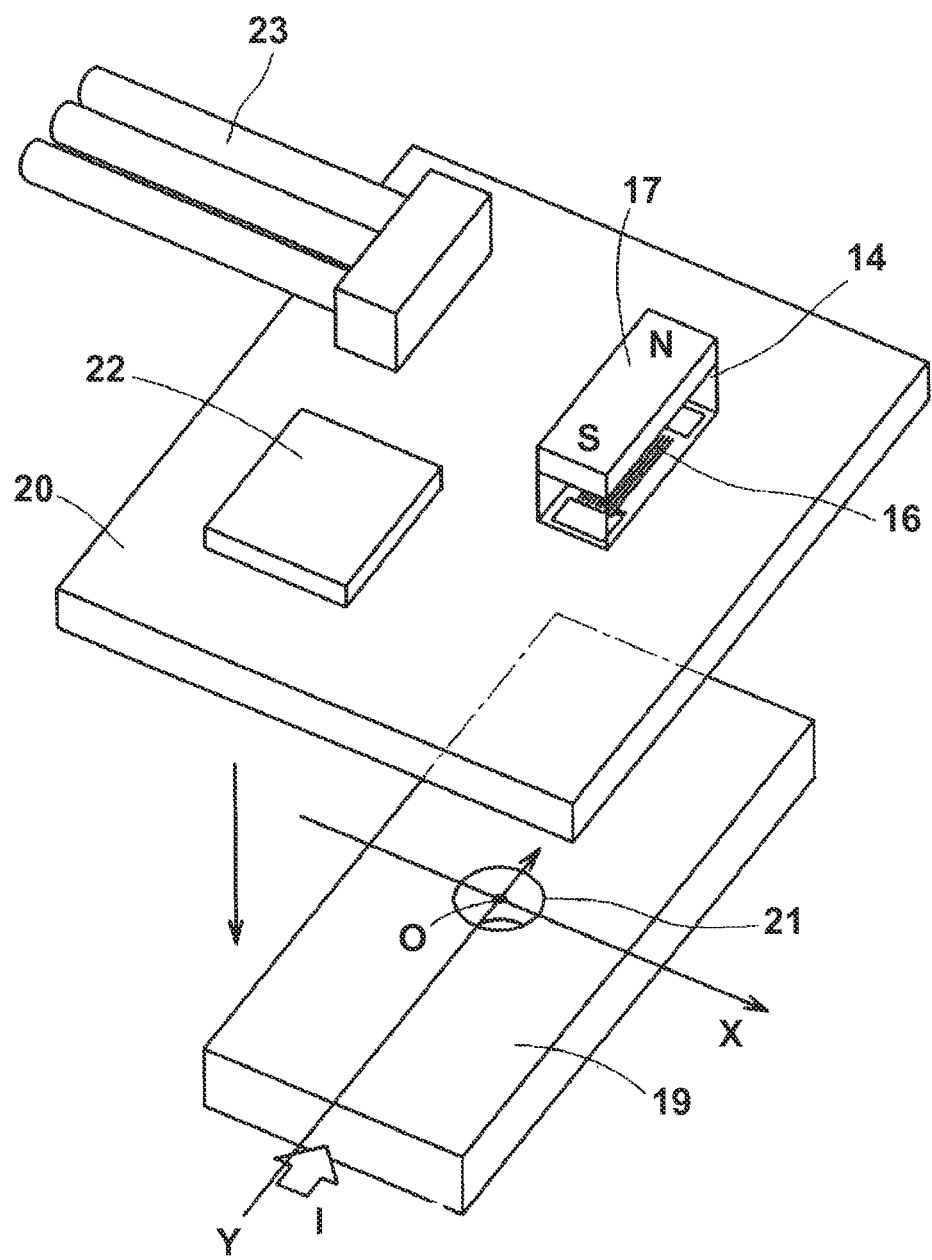

F I G. 49
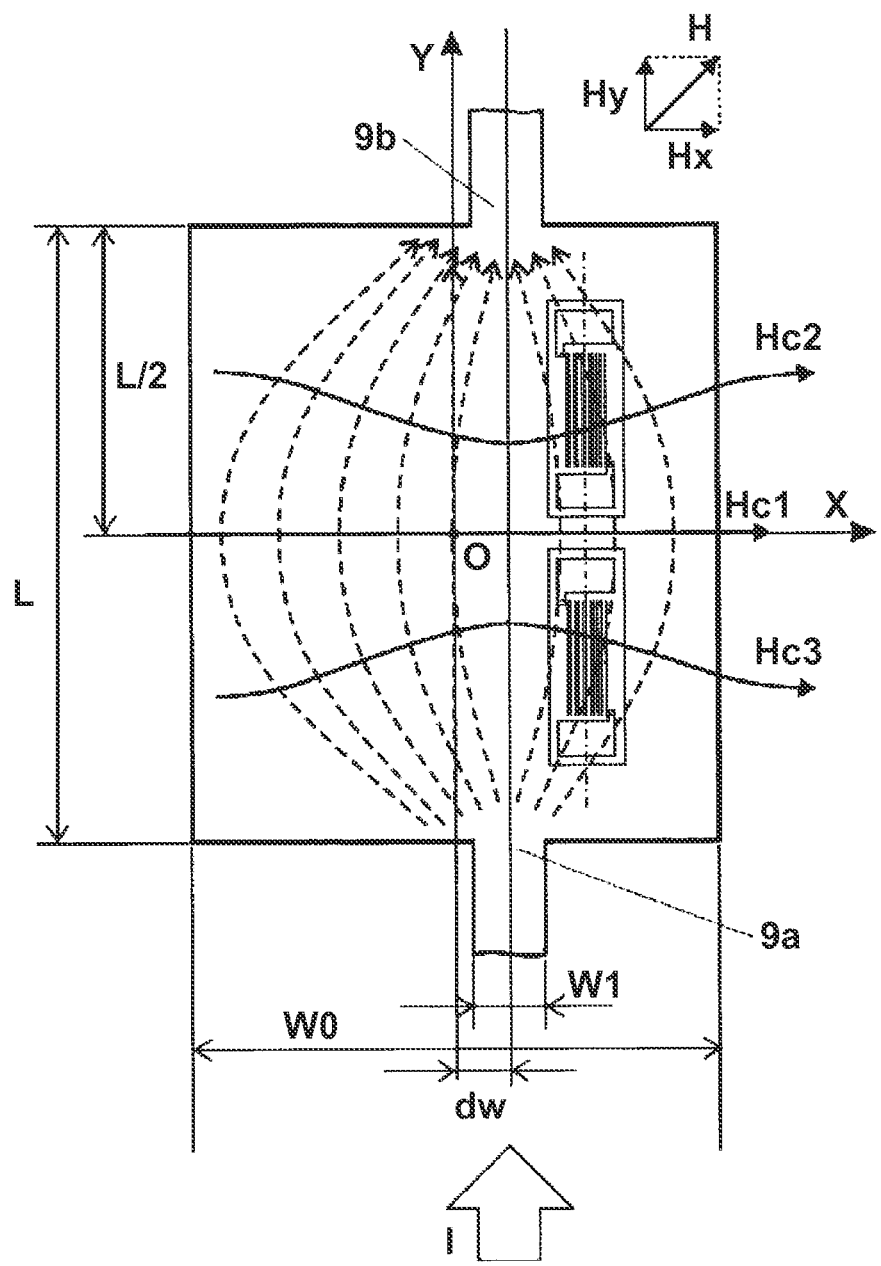

F I G. 54A
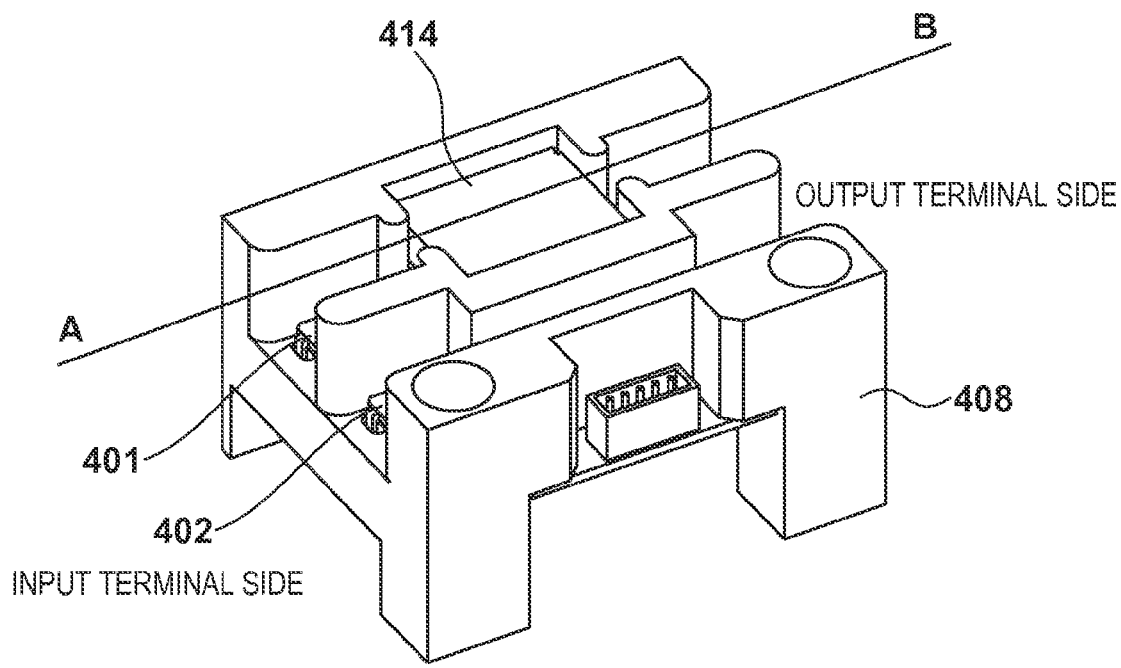
F I G. 54B
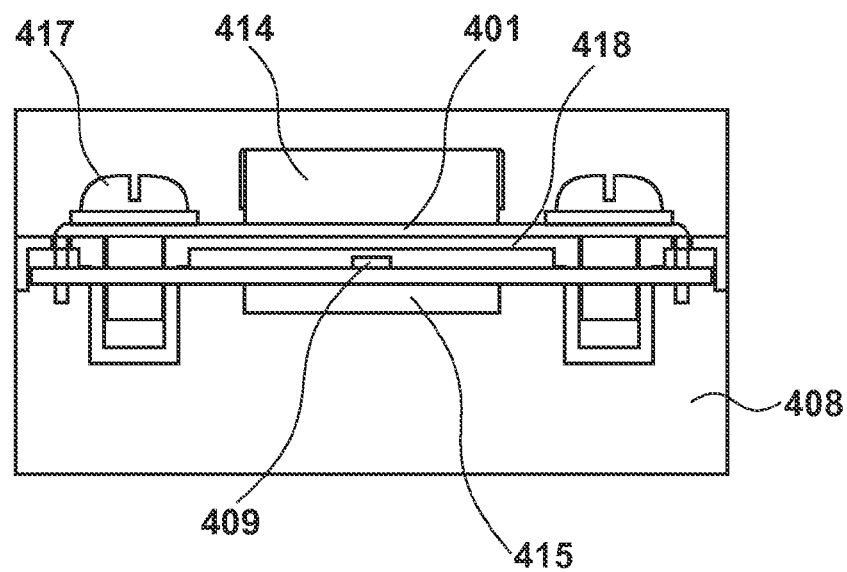

F I G. 56
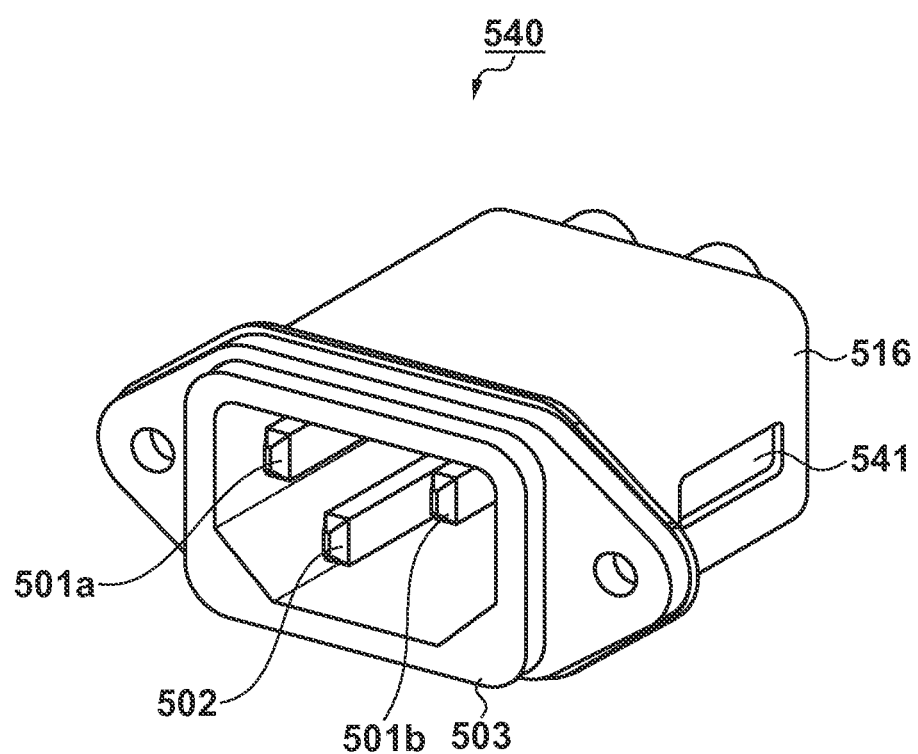

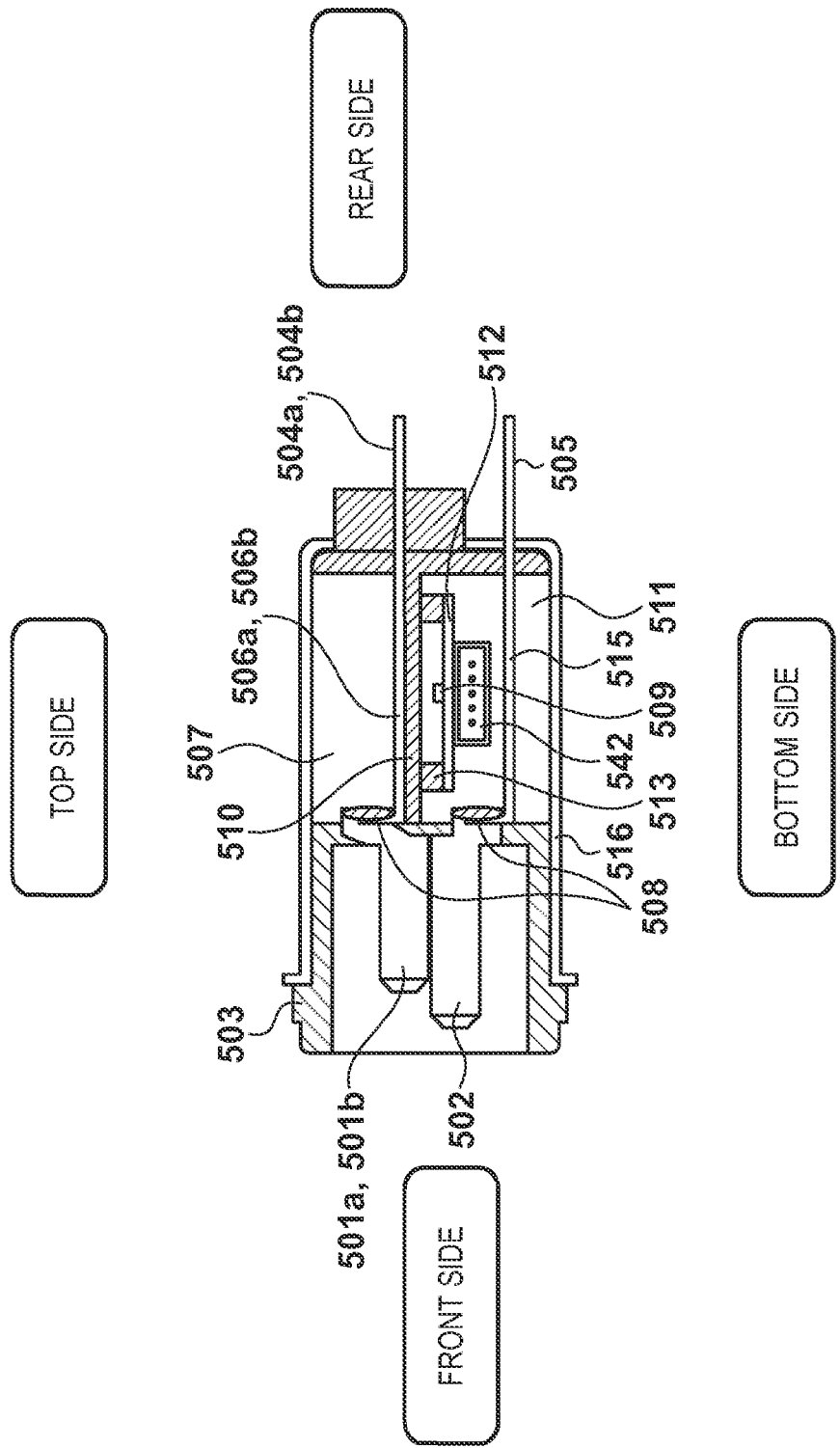
F I G. 57

F I G. 58
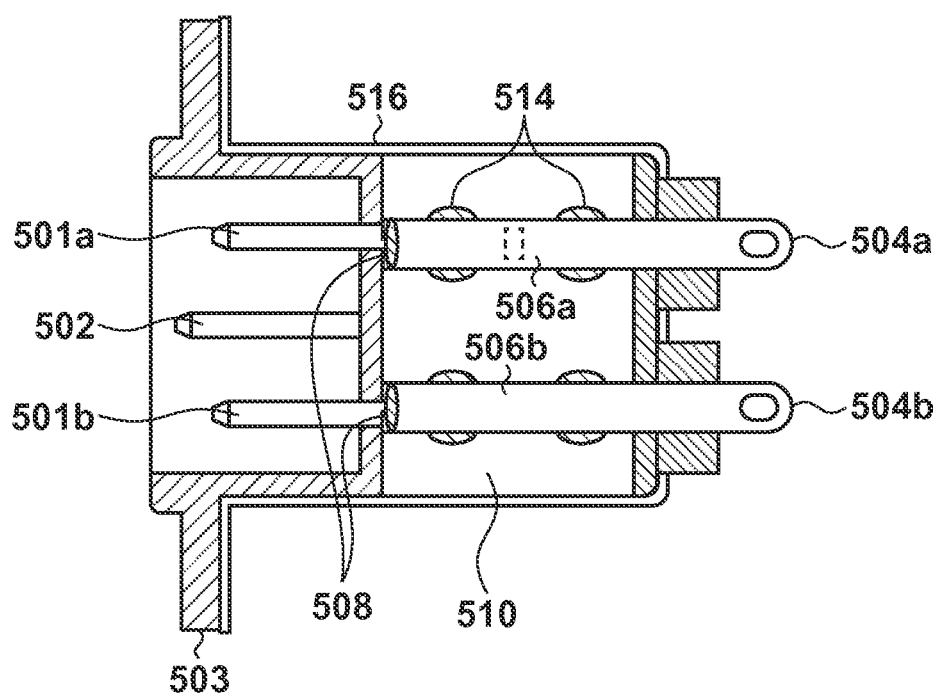

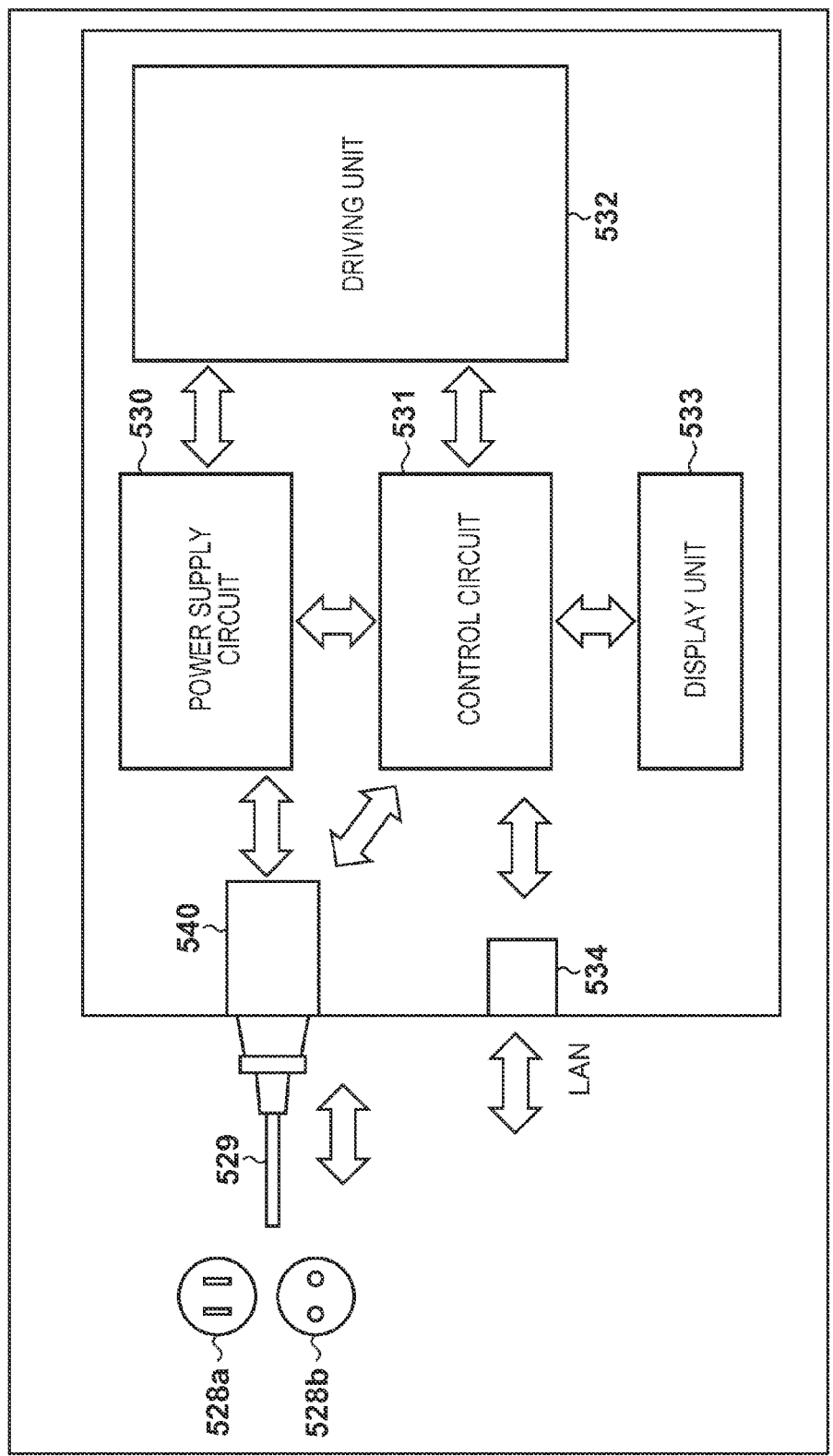
F I G. 65

F I G. 66
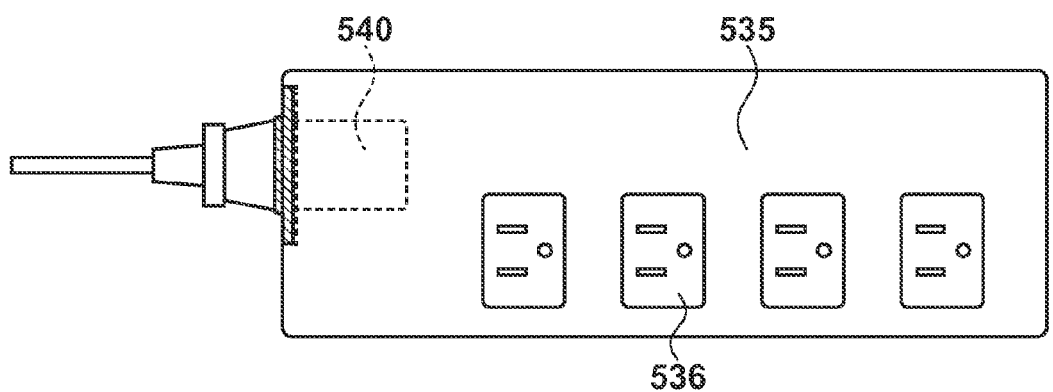

MEASUREMENT MODULE, ELECTRONIC APPARATUS, POWER SUPPLY TAP, POWER SUPPLY UNIT, AND BUILT-IN MEASUREMENT MODULE

This application is a continuation of International Patent Application No. PCT/JP2013/001533 filed on Mar. 8, 2013, and claims priority to Japanese Patent Application Nos. 2012-060949 filed on Mar. 16, 2012, and 2012-092470 filed on Apr. 13, 2012, the entire content of both of which are incorporated herein by reference.

BACKGROUND OF THE INVENTION

Field of the Invention

The present invention relates to a measurement module for measuring a current, a voltage, or power, an electronic apparatus, a power supply tap, a power supply unit, and a built-in measurement module.

Description of the Related Art

In recent years, a reduction in $CO_2$ emission and an increase in the efficiency of power utilization have become essential for suppressing global warming. For this reason, it is important to monitor a current or power within apparatuses such as home electric appliances, office automation equipment, and processing machinery so as to try to eliminate wasteful power use. Ultimately, it is desirable that a monitoring device is incorporated into each of the above-described apparatuses (see Patent Literature 1: Japanese Patent Laid-Open No. 08-330644).

However, in the case of incorporating a monitoring device in each apparatus as described above, an extra space for mounting the monitoring device needs to be provided in the apparatus. For this reason, the apparatus may have a large-scale configuration, or it may be necessary to change the specifications of the apparatus or remodel the apparatus. Even if a monitoring device is disposed near each apparatus, it is still desirable that the monitoring device is made compact.

SUMMARY OF THE INVENTION

Therefore, the present invention provides a measurement module for measuring a current, a voltage, or power and that can also achieve space saving.

According to an exemplary embodiment of the present invention, there is provided a measurement module for measuring a current, including: a pair of input terminals configured to receive input of a current; current paths connected to the pair of input terminals, a pair of output terminals connected to the current paths and configured to output the current input by the pair of input terminals; an insulating portion provided along the current paths; and a magnetic detection element configured to detect a current flowing through the current paths by directly detecting a magnetic field transmitted through the insulating portion from the current paths, wherein the current paths are disposed on one surface of the insulating portion, and the magnetic detection element is disposed on another surface of the insulating portion.

According to another exemplary embodiment of the present invention, there is provided a measurement module for measuring a voltage, including: a pair of input terminals configured to receive input of a current; current paths connected to the pair of input terminals; a pair of output terminals connected to the current paths and configured to output the current input by the pair of input terminals; an insulating portion provided along the current paths; and a voltage detection circuit configured to detect a voltage applied to the pair of input terminals, wherein the voltage detection circuit includes: a first voltage dividing element connected at one end to a first input terminal of the pair of input terminals; a second voltage dividing element connected at one end to a second input terminal of the pair of input terminals; a third voltage dividing element to which another end of the first voltage dividing element is connected; a fourth voltage dividing element to which another end of the second voltage dividing element is connected; and a differential amplification circuit configured to differentially amplify a voltage divided by the first voltage dividing element and the third voltage dividing element and a voltage divided by the second voltage dividing element and the fourth voltage dividing element, the insulating portion is provided with hole portions through which the other end of the first voltage dividing element and the other end of the second voltage dividing element are inserted, the current paths, the first voltage dividing element, and the second voltage dividing element are provided on one surface of the insulating portion, and the third voltage dividing element, the fourth voltage dividing element, and the differential amplification circuit are disposed on another surface of the insulating portion.

Further features and advantages of the present invention will become apparent from the following description with reference to the accompanying drawings. In the accompanying drawings, the same or similar components are denoted by the same reference numerals.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 27 is a diagram showing the configuration of a variation in which current measurement is performed on a measurement current.

FIG. 49 is a diagram showing the configuration of Embodiment 7 in which current measurement is performed on a measurement current.

FIG. 54A is an external perspective view of a terminal block.

FIG. 54B is a cross-sectional view of the terminal block.

FIG. 56 is an external perspective view of an AC inlet.

FIG. 57 is a side cross-sectional view of the AC inlet.

FIG. 58 is a plan cross-sectional view of the AC inlet.

FIG. 65 is a block diagram showing the electronic apparatus.

FIG. 66 is a diagram showing the configuration of a power supply tap.

DESCRIPTION OF THE EMBODIMENTS

The present invention will now be described in detail by way of the illustrated embodiments.

Embodiment A

A module for measuring a current or power according to an embodiment (hereinafter, simply referred to as "measurement module 100") will be described with reference to FIGS. 1 to 4.

Figure 1:
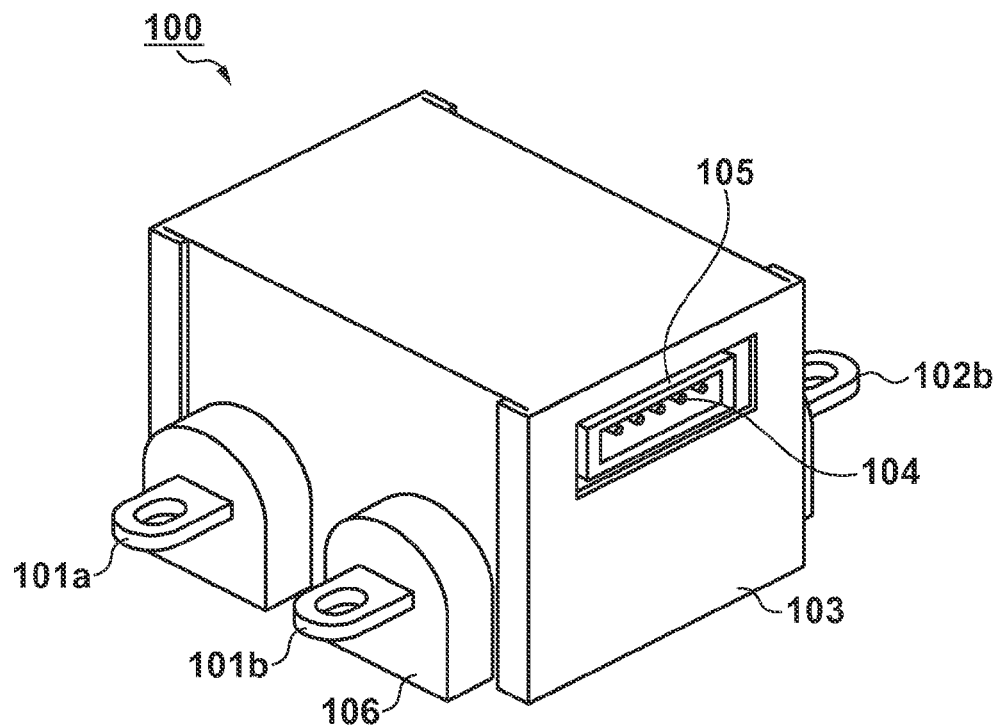
FIG. 1 is an external perspective view of a measurement module.

Referring to FIG. 1, a body 106 is formed of an insulating resin material as the raw material, and has an outer shape that is substantially rectangular parallelepiped. A pair of input terminals 101a and 101b to which a power supply cable or terminals of a measurement object are connected are provided on one side surface of the body 106. Output terminals 102a and 102b are provided on the opposite side. The body 106 is surrounded by a magnetic shield 103 except for the vicinity of the input terminals 101a and 101b and the output terminals 102a and 102b. In other words, the magnetic shield 103 is composed of six panels, and is substantially rectangular parallelepiped. As shown in FIG. 1, the magnetic shield 103 is provided with a window portion 105 for accessing a connector 104 provided inside the body 106 from the outside of the body 106. The connector 104 includes terminals for supplying power to a circuit provided inside the body 106, and terminals for outputting a result of detection of a current, a voltage, or power.

Figure 2:
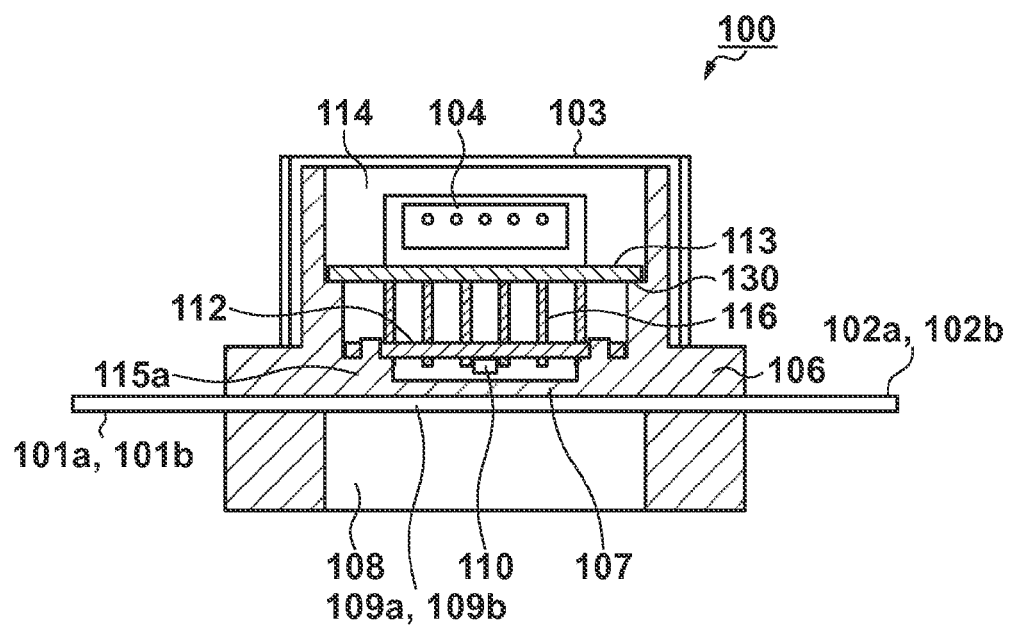
FIG. 2 is a side cross-sectional view of the measurement module.

Referring to FIG. 2, the body 106 of the measurement module 100 is formed in the shape of a partly open box. A partition 107 is a non-magnetic insulating portion, and functions as a partitioning portion or partitioning member that partitions the inner space of the measurement module 100 into a first space 108 that is a space on one surface side, and a second space 114 that is a space on the other surface side. The partition 107 may be separate from the body 106, or the partition 107 and the body 106 may be formed integrally in order to achieve favorable insulation.

A pair of current paths 109a and 109b are disposed in the first space 108. In other words, the pair of current paths 109a and 109b are disposed on one surface of the partition 107 serving as the insulating portion. The pair of current paths 109a and 109b are conductive members that connect the pair of input terminals 101a and 101b that receive input of a current from a commercial power supply or the like to the pair of output terminals 102a and 102b that output the current input by the pair of input terminals 101a and 101b. As shown in FIG. 2, the partition 107 is provided along the pair of current paths 109a and 109b. The pair of input terminals 101a and 101b, the pair of output terminals 102a and 102b, and the current paths 109a and 109b are members that are integrally molded using copper or a copper alloy, for example. The input terminal 101a, the output terminal 102a, and the current path 109a may be formed integrally. The input terminal 101b, the output terminal 102b, and the current path 109b may also be formed integrally.

The current paths 109a and 109b extend through holes or grooves formed in side surfaces of the body 106 are fixed onto the partition 107 by press-fitting or with an adhesive. Alternatively, the current paths 109a and 109b may be insert-molded during resin molding of the body 106. In this case, the current paths 109a and 109b are embedded into the partition 107.

Low-current components that are operated by a direct current supplied thereto, such as a magnetic detection element 110 and a microprocessor 111 that calculates power from a current and a voltage, are mounted in the second space 114. Thus, the magnetic detection element 110 is disposed on the other surface of the partition 107. These low-current components are protected by the partition 107 from a high voltage and a large current from the commercial AC power supply. Note that the magnetic shield 103 is disposed so as to cover, together with the partition 107, the second space 114.

The magnetic detection element 110 detects the current flowing through the current path 109b by detecting the magnetic field transmitted through the partition 107 from the current path 109b. The magnetic detection element 110 is mounted on a circuit board 112. To directly detect the magnetic field from the current path 109b, a highly sensitive magnetic sensor capable of detecting a magnetic field on the order of microtesla may be adopted as the magnetic detection element 110. For example, it is possible to adopt a magnetic impedance element, a fluxgate sensor, or a colossal magnetoresistive element as disclosed in Patent Literature 1 (Japanese Patent Laid-Open No. 08-330644) or Japanese Patent Laid-Open No. 2003-16339.

A signal that is output by the magnetic detection element 110 is subjected to an amplification process by an amplification circuit mounted on the circuit board 112, and sent to a circuit board 113 via terminals 116. As shown in FIG. 2, the terminals 116 electrically connect the circuit board 112 to the circuit board 113. As shown in FIG. 4C, the circuit board 113, on which the microprocessor 111 is mounted, calculates the power from the values of the voltage and the current acquired by the circuit board 112, and outputs the resulting data to the outside of the measurement module 100 via the connector 104. For example, the microprocessor 111 can determine the power by multiplying the current measured by the magnetic detection element 110 by a certain voltage value. As will be described later, when the measurement module 100 also includes a voltage detection circuit, the microprocessor 111 can determine the power by multiplying the current measured by the magnetic detection element 110 by a voltage that is detected by the voltage detection circuit.

The power required for the circuit boards 112 and 113 is received from the outside of the measurement module 100 through the connector 104. Note that the circuit board 112 and the circuit board 113 may be integrated together if the circuit scale can be made small.

Figure 3:
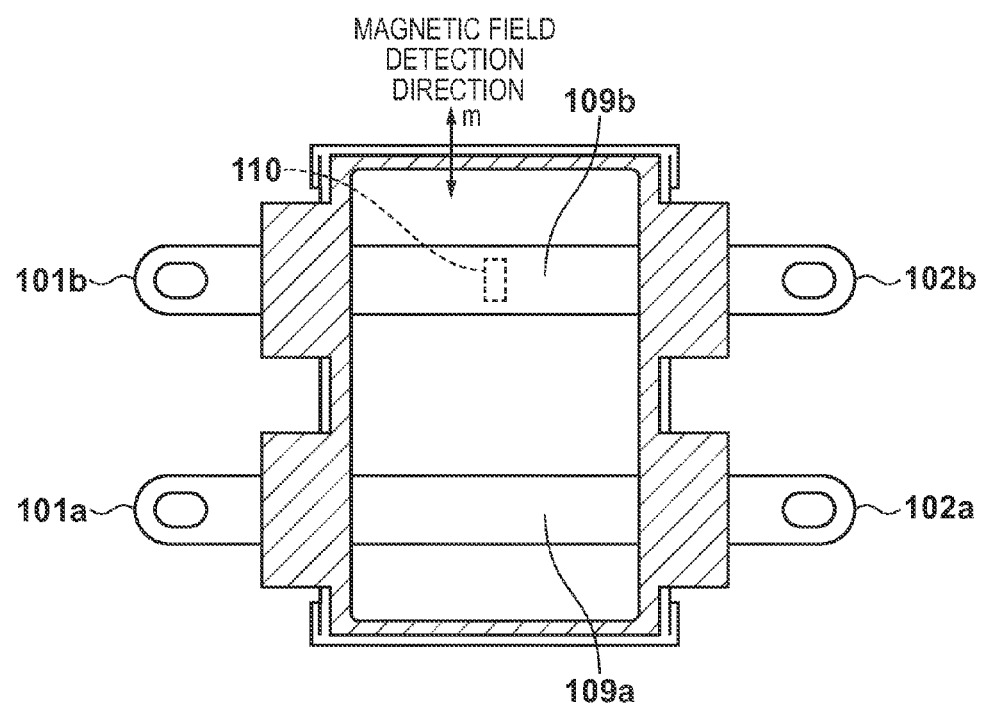
FIG. 3 is a bottom view of the measurement module.

As shown in FIG. 3, the magnetic field detection direction of the magnetic detection element 110 is the direction indicated by the arrow m. Note that illustration of the bottom surface of the magnetic shield 103 is omitted in FIG. 3. The magnetic detection element 110 is mounted on the circuit board 112 so as to oppose the current path 109b with the partition 107 interposed in between.

The magnitude of the magnetic field generated from the current path 109b is dependent on the amount of the current flowing through the current path 109b and the distance from the magnetic detection element 110. Therefore, this distance is defined so as to provide a magnetic field range suitable for the magnetic detection element 110. Additionally, the directions of the currents flowing through the current paths 109a and 109b are opposite to each other. Thus, the position at which the magnetic detection element 110 is placed is set in consideration of influence of the current paths.

To maintain the dimensional relationship of the magnetic detection element 110, the current paths 109a and 109b are fixed to the partition 107. Furthermore, the circuit board 112 is supported by height restriction protruding portions 115a and 115b, which are leg members attached to the partition 107.

Figure 4A:
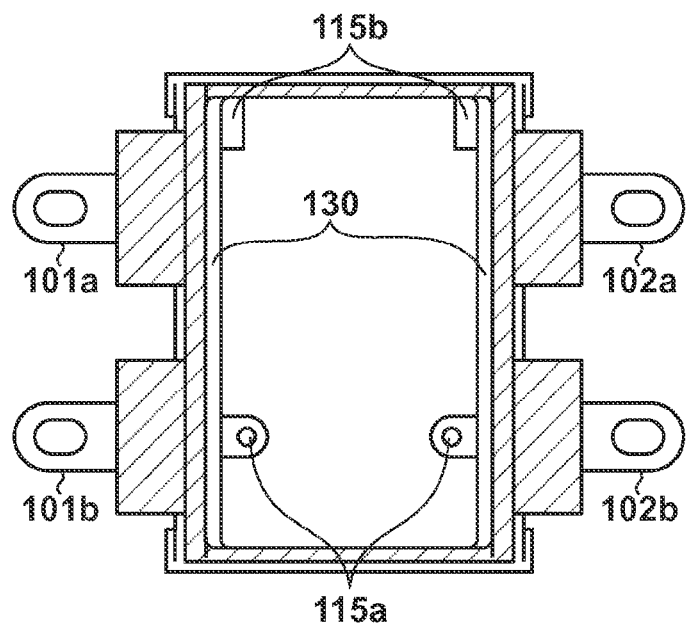
FIG. 4A is a plan view of the measurement module.

As shown in FIG. 4A, projections are provided at the top of the height restriction protruding portions 115a. The circuit board 112 is provided with holes 117 into which the projections of the height restriction protruding portions 115a are fitted. By fitting the projections of the height restriction protruding portions 115a into the holes 117 of the circuit board 112, the circuit board 112 can be more easily positioned horizontally, and the accuracy of attachment is ensured. Although the top of the height restriction protruding portions 115b is flat in FIG. 4A, projections may be provided as with the height restriction protruding portions 115a. In this case, the circuit board 112 is additionally provided with holes into which the projections of the height restriction protruding portions 115b are fitted. Note that these holes may be through holes, or may be bottomed holes. The holes may be replaced with notches or grooves.

Thereby, the fluctuation in the distance of the magnetic detection element 110 to the current paths 109a and 109b is restricted, and it is thus possible to realize a current sensor with little variation.

Note that as shown in FIGS. 2 and 4A, supporting portions 130 for supporting the circuit board 113 are provided in the second space 114. This enables the circuit board 113 to be positioned horizontally.

Figure 4B:
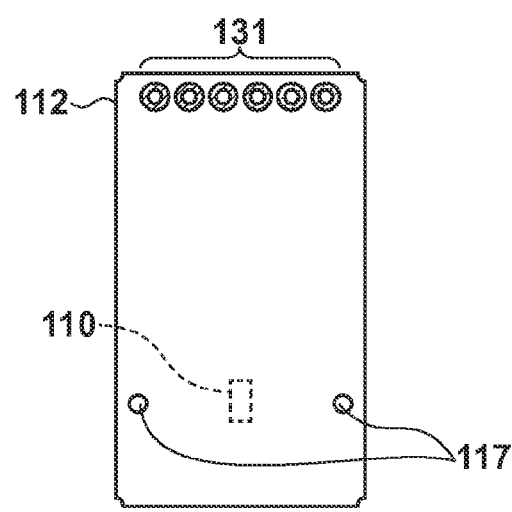
FIG. 4B is a plan view of the measurement module.
Figure 4C:
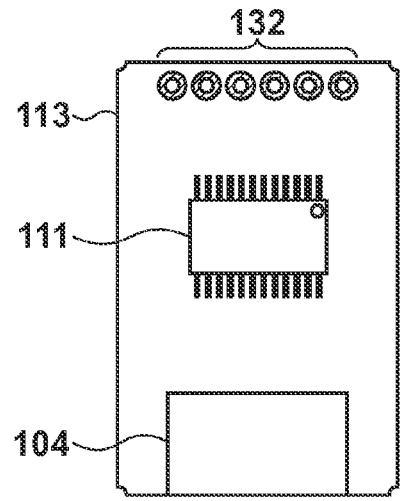
FIG. 4C is a plan view of the measurement module.

As shown in FIG. 4B, the circuit board 112 is provided with lands 131 for soldering the terminals 116. Likewise, as shown in FIG. 4C, the circuit board 113 is provided with lands 132 for soldering the terminals 116.

In Embodiment A, the magnetic detection element 110 is mounted on the circuit board 112. However, when terminals of sufficient length extend from the magnetic detection element 110, the magnetic detection element 110 may be directly bonded and fixed to the partition 107, instead of being held on the circuit board 112. This enables the magnetic detection element 110 to be disposed near the current path 109b. This attachment method will be effective when the magnetic detection element 110 has low sensitivity.

On the other hand, in the case of using a magnetic detection element 110 having high sensitivity, the influence of a transformer and a magnetized magnetic substance provided around the magnetic detection element 110. As described above, a part of the magnetic shield 103 is open in order to provide insulation between the input terminals 101a and 101b and the output terminals 102a and 102b, but the remaining portion is shielded by the magnetic shield 103. This can reduce the influence of the transformer and the magnetized magnetic substance that are present around the measurement module 100. The magnetic shield 103 can be formed in the shape of a box by using a high-permeability thin plate such as permalloy. Alternatively, the magnetic shield 103 can be formed by deep-drawing using an iron-based material.

If the environment in which the measurement module 100 is installed is an environment with little magnetic noise or electric field noise, the magnetic shield 103 for shielding these noises may be omitted. The reason for this is that the magnetic shield 103 does not contribute to the performance of the measurement module 100 itself. In this case, the magnetic shield 103 can be omitted, thus providing effects such as simplification of the manufacturing process, a decrease in the manufacturing time, and a reduction in the number of components.

According to the present embodiment, the current paths 109a and 109b are disposed in the first space 108 by using the insulating partition 107, and the magnetic detection element 110 is disposed in the second space 114. That is, the magnetic detection element 110 can be protected by the partition 107 from the high voltage and the large current of the current paths 109a and 109b. If the circuit boards 112 and 113 and the current paths 109a and 109b are both present in a single space, it is necessary to increase the spatial distance and the creeping distance to ensure insulation, making it difficult to reduce the size of the measurement module 100. It can be said that the configuration according to the present embodiment that can solve such a problem is very advantageous.

The use of the highly sensitive magnetic detection element 110 enables detection of the magnetic field transmitted through the non-magnetic partition 107, thus making the measurement module 100 highly compact.

With the present embodiment, it is possible to amplify a current detection signal in the circuit board 112, and send the amplified signal to the microprocessor 111 in a short distance via the terminals 116. Thus, the influence of noise from the environment in which the measurement module 100 is installed can be reduced, which will make it possible to suppress erroneous operation of the microprocessor 111.

Moreover, the parameters of the microprocessor 111 can be adjusted by passing a reference current through the input terminals 101a and 101b of the measurement module 100 alone before the measurement module 100 is mounted on a power supply unit or an electronic apparatus. In other word, the present embodiment is also advantageous in that the parameter adjustment after incorporating the measurement module 100 into the power supply unit can be omitted.

Embodiment B

Embodiment B is characterized in that power can be more accurately detected than in Embodiment A by additionally providing a voltage detection circuit to the measurement module 100. As described in Embodiment A, power can be roughly evaluated by simply measuring a current. However, the voltage fluctuates depending on the load. For this reason, power cannot be accurately evaluated based on the current alone. Accordingly, detecting both a current and a voltage enables more accurate determination of power. In the following description, the same components as those in Embodiment A are given the same reference numerals, and the description is thereby simplified.

While the pair of input terminals 101a and 101b are connected to an external power supply such as a commercial AC power supply, it is often the case that which of the input terminals 101a and 101b serves as a HOT terminal or COLD terminal is not clearly defined. Therefore, in Embodiment B, the voltage is accurately detected regardless of whether the polarity is HOT or COLD by measuring the voltages of the input terminals 101a and 101b and determining the difference therebetween.

Figure 5:
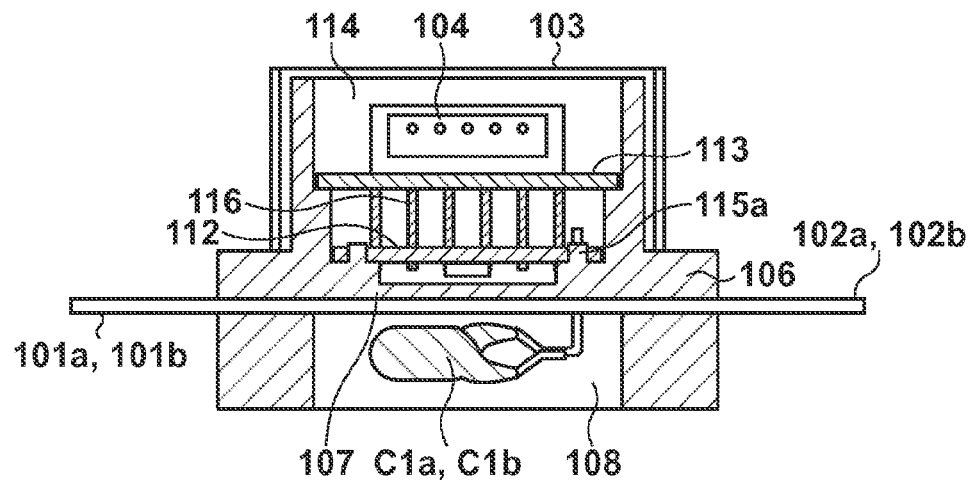
FIG. 5 is a side cross-sectional view of a measurement module.
Figure 6:
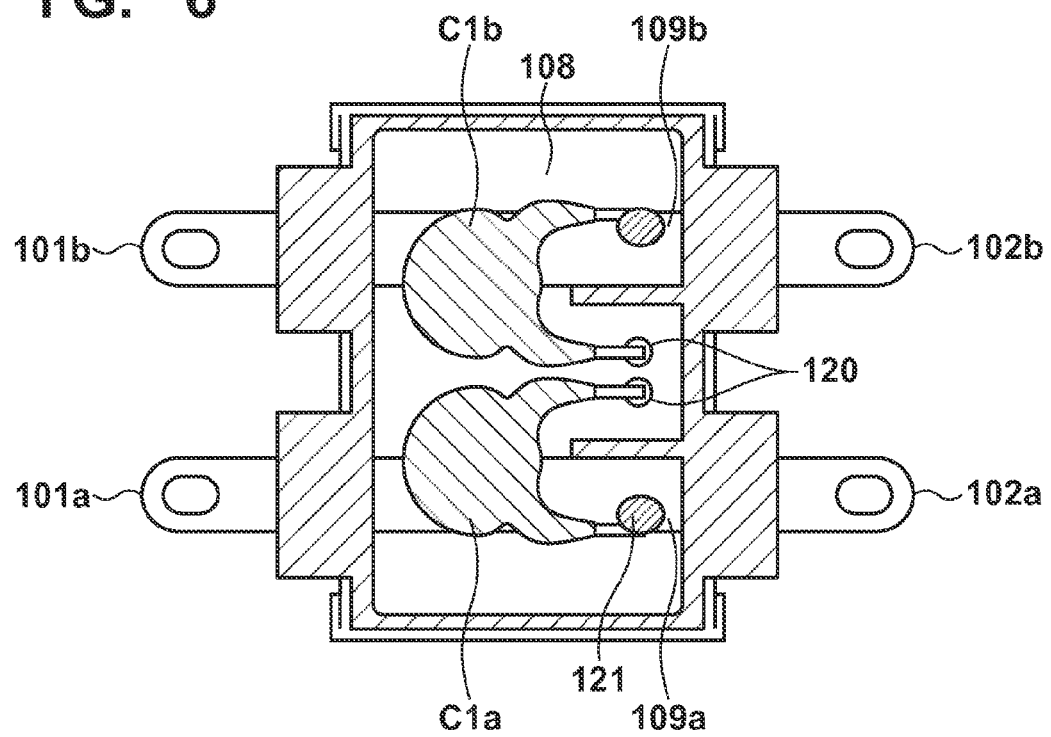
FIG. 6 is a bottom view of the measurement module.
Figure 7A:
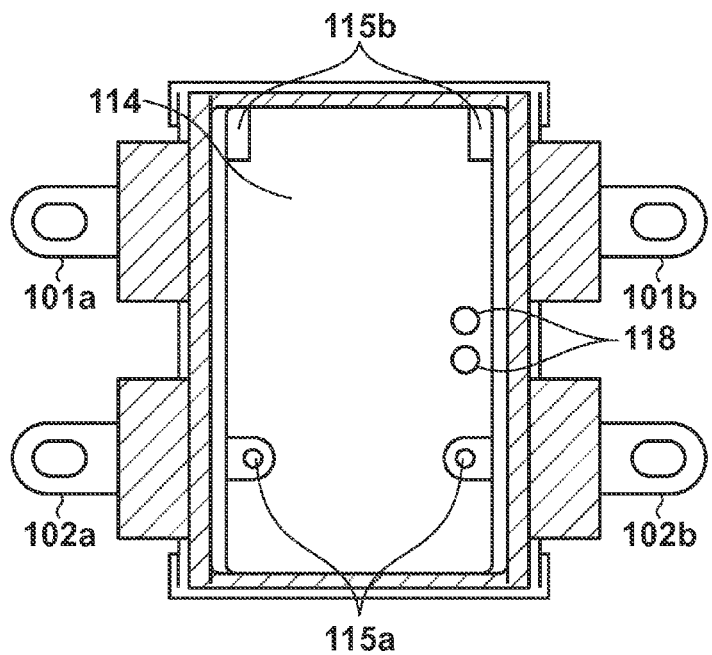
FIG. 7A is a plan view of the measurement module.
Figure 7B:
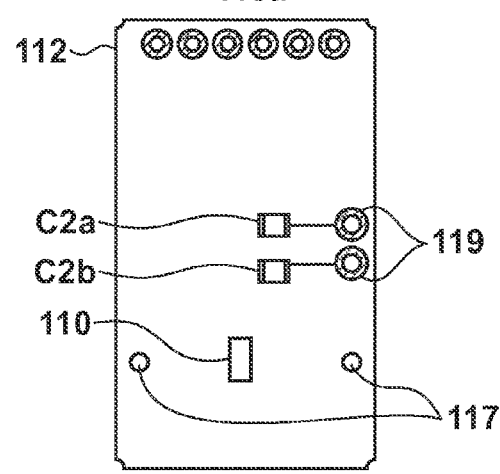
FIG. 7B is a plan view of the measurement module.
Figure 7C:
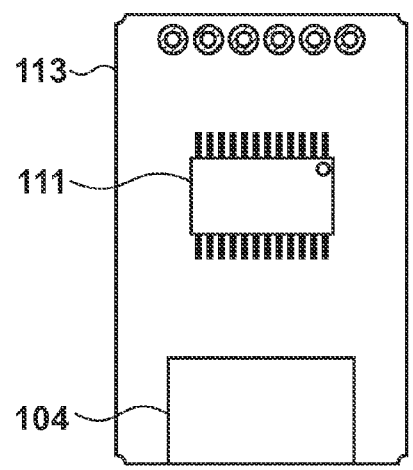
FIG. 7C is a plan view of the measurement module.
Figure 8:
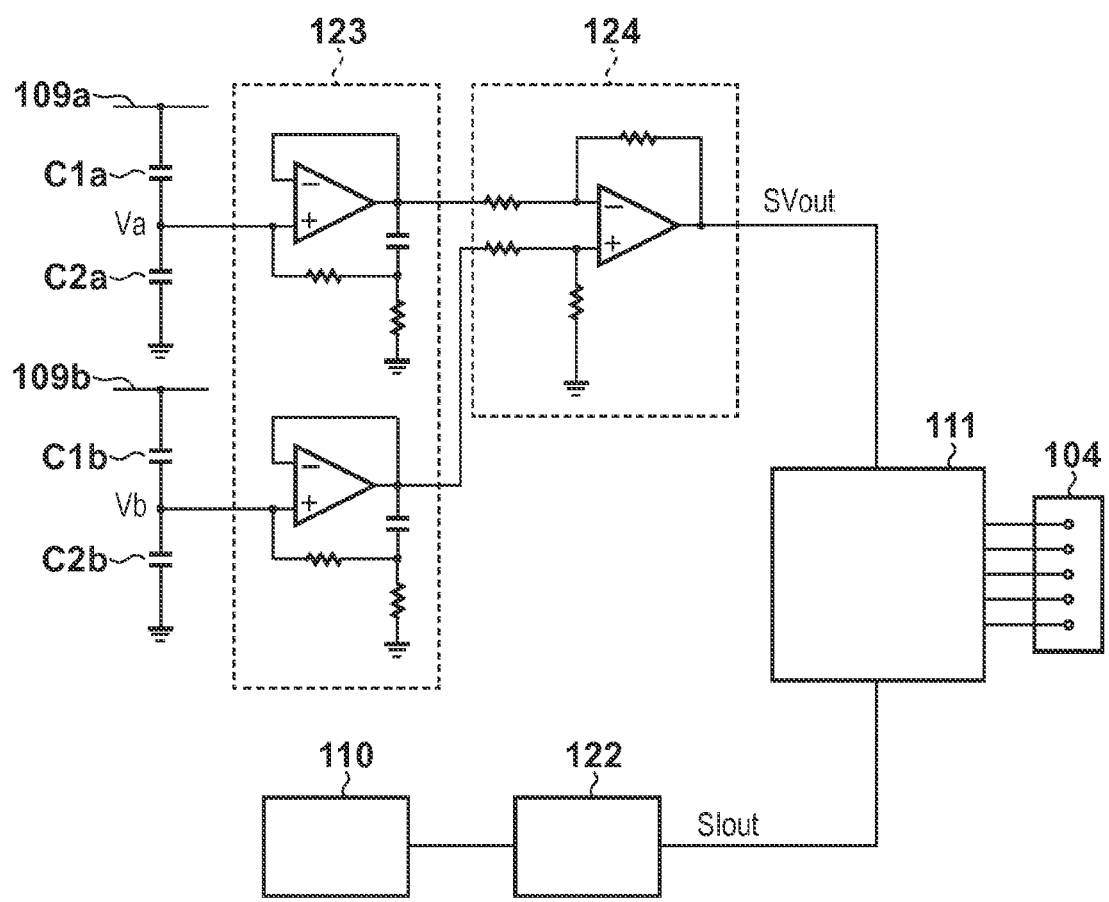
FIG. 8 is a circuit diagram showing a voltage detection circuit.

FIG. 5 is a side cross-sectional view of the measurement module 100. FIG. 6 is a cross-sectional view of the measurement module 100 in the first space 108. FIGS. 7A, 7B, and 7C are cross-sectional views of the measurement module 100 in the second space 114. FIG. 8 is a diagram showing a voltage detection circuit that detects a voltage by capacitive voltage division.

As shown in FIGS. 5 and 6, a capacitor C1a is a first voltage dividing element connected at one end to the current path 109a by soldering. Thus, one end of the capacitor C1a is connected to the first input terminal 101a of the pair of input terminals 101a and 101b via the current path 109a. A capacitor C1b is a second voltage dividing element connected at one end to the current path 109b by soldering. Thus, the capacitor C1b is connected to the second input terminal 101b of the pair of input terminals 101a and 101b via the current path 109b. Each of the capacitances of the capacitors C1a and C1b is a low capacitance (e.g., 15 pF). The capacitors C1a and C1b are provided in the first space 108. The capacitors C1a and C1b that are respectively connected to the current paths 109a and 109b are disposed in the first space 108 because this is advantageous in terms of insulation. From the viewpoint of routing terminals, a capacitor with a lead is suitably used as the capacitors C1a and C1b. In addition, from the viewpoint of the surge resistance, it is necessary to use a capacitor having high resistance to a high voltage as the capacitors C1a and C1b. Consequently, the size of the capacitors C1a and C1b tends to be large, but the capacitors C1a and C1b can be fitted in the first space 108 by placing them horizontally side by side.

Meanwhile, as shown in FIGS. 7A, 7B, and 7C, a capacitor C2a serving as a third voltage dividing element and a capacitor C2b serving as a fourth voltage dividing element are mounted on the circuit board 112 in the second space 114. The capacitors C2a and C2b are large capacitance (e.g., 15000 pF) capacitors. One ends of the capacitors C2a and C2b are connected to the other ends of the capacitors C1a and C1b, respectively. The other end of each of the capacitors C2a and C2b is connected to a ground.

Of the two terminals of each of the capacitors C1a and C1b, the other end, which is not connected to the current path 109a or 109b, is inserted through a through-hole portion 118 provided in the partition 107, and is connected to a terminal hole 119 of the circuit in the second space 114. The capacitors C1a and C1b are connected to the capacitors C2a and C2b through the terminal holes 119.

Note that if the creeping distance of the other ends of the capacitors C1a and C1b to the current paths 109a and 109b is insufficient, a surrounding wall 120 may be provided as shown in FIG. 6. The surrounding wall 120 is also formed of an insulating member. The surrounding wall 120 may be formed integrally with the partition 107.

As shown in FIG. 8, the capacitors C1a and C2a form a first voltage dividing circuit, and the capacitors C1b and C2b form a second voltage dividing circuit. The voltages at these dividing points are represented by Va and Vb. For example, when an alternating current of 100 V is applied to the current paths 109a and 109b, voltages corresponding to the impedance ratio appear in the voltages Va and Vb at the dividing points. When the impedance ratio is 1000:1, a voltage of ±0.28 Vpp appears.

An impedance conversion circuit 123 such as a bootstrap circuit is provided at the subsequent stage of the voltage dividing circuits. Further, a differential amplification circuit 124 is provided at the subsequent stage of the impedance conversion circuit 123. The differential amplification circuit 124 differentially amplifies the voltage divided by the first voltage dividing element and the third voltage dividing element and the voltage divided by the second voltage dividing element and the fourth voltage dividing element. The impedance conversion circuit 123 and the differential amplification circuit 124 are also provided in the second space 114. Thereby, SVout is obtained as an output of the voltage detection circuit. SVout is input to an A/D port of the microprocessor 111. A detection result SIout is input from the magnetic detection element 110 through the amplification circuit 122 to another A/D port included in the microprocessor 111. The microprocessor 111 calculates power from the detected voltage and current, and outputs a signal indicating a detection result to a display device or an external computer through the connector 104. Thus, the microprocessor 111 functions as a power determination circuit that determines power from the current detected by the magnetic detection element 110 and the voltage detected by the voltage detection circuit.

There is a little variation in capacitance of the capacitors, and a sensitivity difference between Va and Vb may pose a problem. In this case, the sensitivity balance may be fine-tuned by placing an attenuator between the impedance conversion circuit 123 and the differential amplification circuit 124. In the case of operating the voltage detection circuit shown in FIG. 8 with a single power supply, the grounds shown in FIG. 8 may be set to a sensor GND (midpoint potential).

Although the voltage detection is performed by using capacitors in Embodiment B, a resistive voltage dividing circuit may be adopted by replacing the capacitors by resistors.

The measurement module 100 of Embodiment B includes the current detection circuit and the voltage detection circuit. However, the microprocessor 111 may acquire the current detection data from the outside of the measurement module 100 via the connector 104. In this case, the current detection circuit may be omitted from the measurement module 100. In other words, a measurement module 100 containing only a voltage detection circuit may be provided. Furthermore, a measurement module 100 for measuring only a voltage without measuring power may be provided.

According to the present invention, it is possible to provide a measurement module 100 having a voltage detection function by providing, in the measurement module 100, a voltage detection circuit that detects the voltage applied to a pair of input terminals 101a and 101b. Furthermore, mounting this voltage detection circuit in the measurement module 100 together with the above-described current detection circuit makes it possible to more accurately measure power from a result of detection of the voltage and the current.

In particular, of the voltage detection circuit, the capacitor C1a serving as the first voltage dividing element and the capacitor C1b serving as the second voltage dividing element are disposed in the first space 108. On the other hand, the capacitor C2a serving as the third voltage dividing element and the capacitor C1b serving as the fourth voltage dividing element are disposed in the second space 114. To form a voltage dividing circuit, these dividing elements needs to be connected. Therefore, the partition 107 is provided with the through-hole portions 118 through which the other end of the first capacitive element and the other end of the second capacitive element are inserted. This facilitates voltage measurement, while ensuring the insulation distance. In addition, space saving is achieved by disposing the voltage dividing elements so as to be distributed in a plurality of compartments.

Embodiment C

In Embodiment C, a description will be given of an exemplary application of the measurement modules 100 described in Embodiments A and B. By adopting the measurement modules 100 described in Embodiments A and B, it is possible to readily add functions of monitoring and controlling the power to the power supply unit, with little influence on the design of the power supply circuit.

Figure 9:
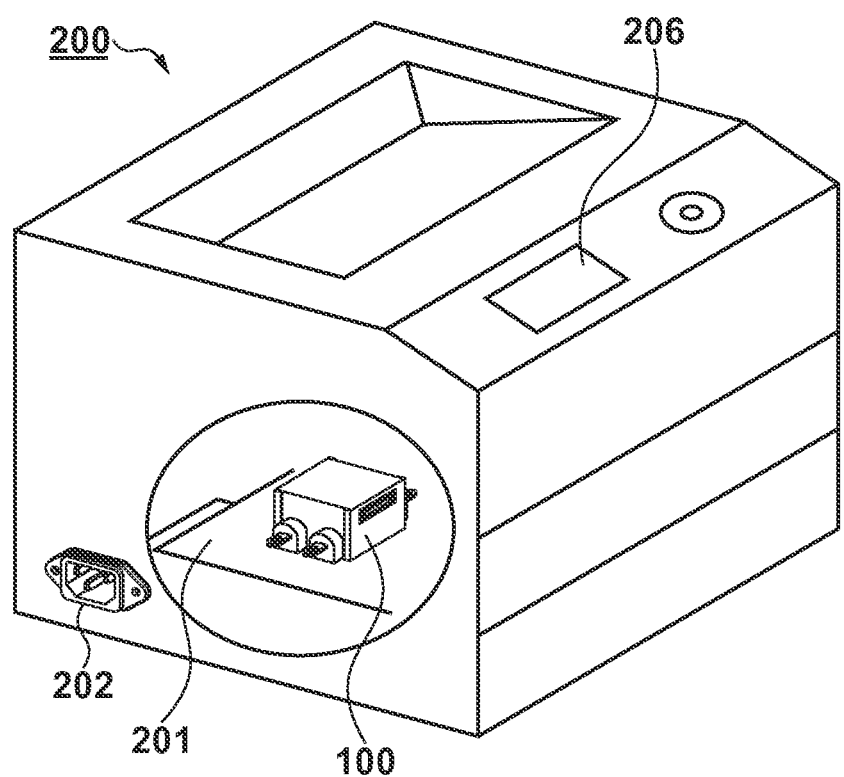
FIG. 9 is an external view showing an exemplary electronic apparatus.
Figure 10:
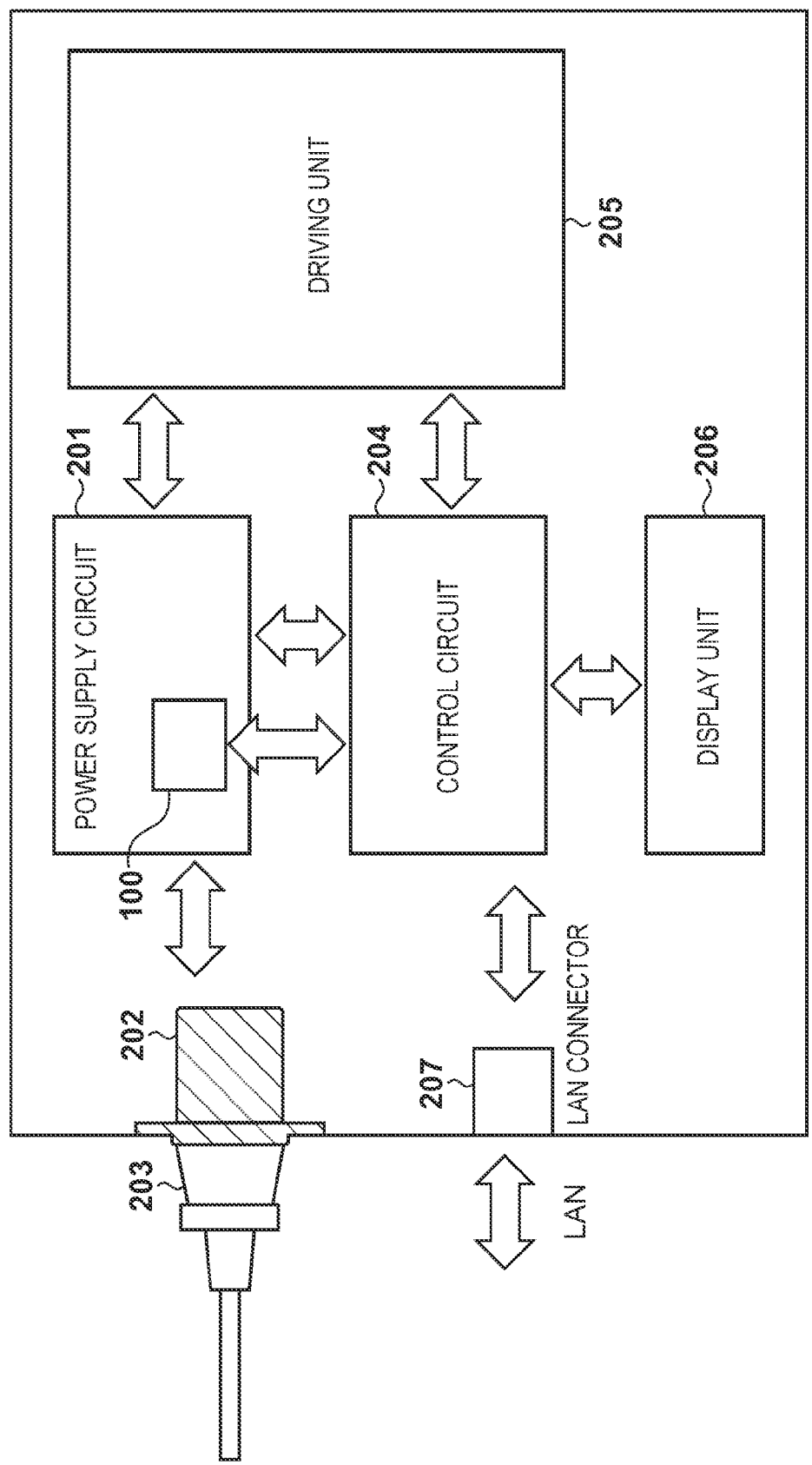
FIG. 10 is a block diagram of the electronic apparatus.

For example, in the case of an image forming apparatus 200, which is an exemplary electronic apparatus, as shown in FIG. 9, a power supply unit is provided with the measurement module 100. The block diagram of the electronic apparatus is shown in FIG. 10. An AC inlet 202 is provided on a wall surface of the image forming apparatus 200. By connecting a power supply cord 203 from an external power supply to the AC inlet 202, power is supplied to a power supply circuit 201 of the image forming apparatus 200.

The measurement module 100 is mounted on the power supply circuit 201, and measures the current, voltage, or power supplied from the external power supply. The microprocessor 111 determines the alternating current, the voltage, the power, or the like, and outputs the obtained value to a control circuit 204 via an interface such as a UART (Universal Asynchronous Receiver Transmitter) and an SPI (System Packet Interface). The control circuit 204 grasps a total amount of power consumed by the image forming apparatus 200, and controls the driving unit 205 such that a preset upper limit will not be exceeded. Alternatively, the control circuit 204 may visualize the power usage amount by sending display data indicating the amount of power to a display unit 206. Additionally, the control circuit 204 may distribute power data to an external computer or the like by using a LAN connector 207. This also makes it possible to manage the power amount by using a network. A wired communication module such as a USB, a wireless communication module such as Bluetooth (registered trademark) may be adopted in place of the LAN connector 207.

By mounting the measurement module 100 on the power supply unit in this way, it is possible to easily grasp the status of the power supply by measuring the current and the voltage and additionally measuring the power, with little burden on the hardware design of the electronic apparatus itself.

Embodiment D

Figure 11A:
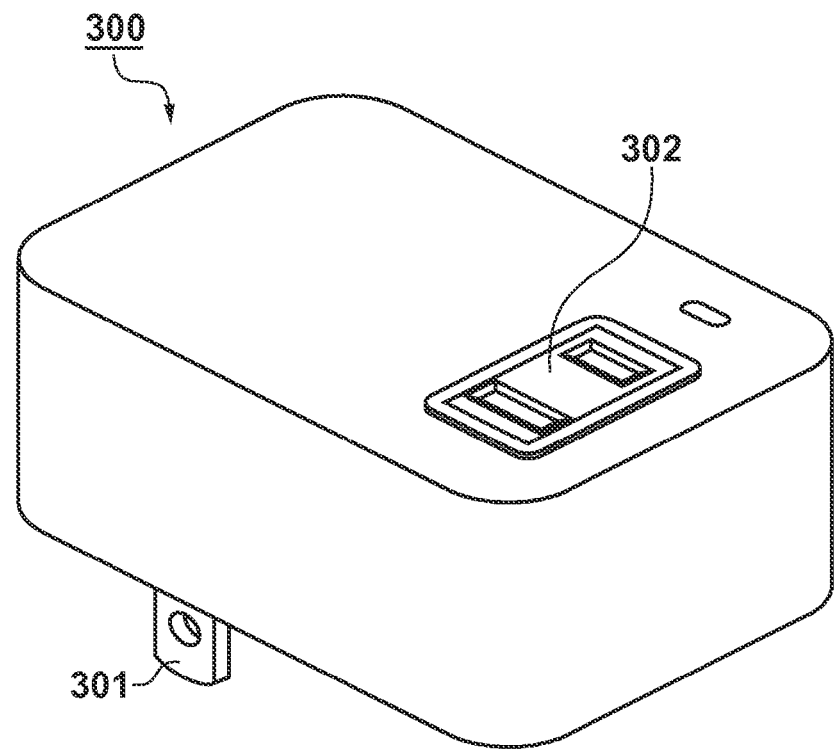
FIG. 11A is a diagram showing the configuration of a power supply tap.
Figure 11B:
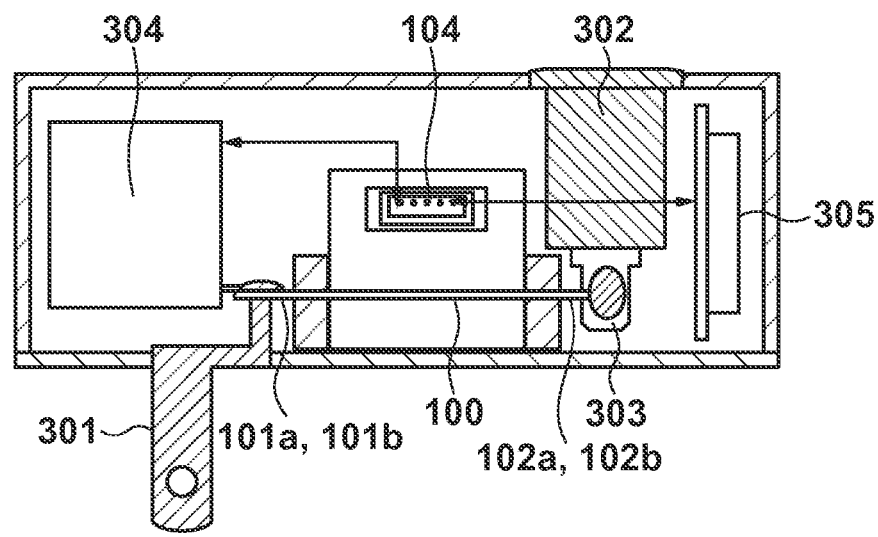
FIG. 11B is a diagram showing the configuration of the power supply tap.

In Embodiment D, an example is illustrated in which the measurement module 100 is incorporated into a power supply tap. FIG. 11A shows a perspective view of a power supply tap 300 including one plug and one plug receptacle. FIG. 11B is a side cross-sectional view showing the internal configuration.

The measurement module 100 is small, and thus allows the power supply tap 300 to be highly compact. A terminal pair 301 that is inserted in a socket is directly attached to the input terminals 101a and 101b of the measurement module 100. The output terminals 102a and 102b of the measurement module 100 are coupled to a terminal pair 303 of a socket module 302 by soldering.

An AC/DC converter power supply 304 converts the alternating current supplied from the input terminals 101a and 101b into a direct current for operating the measurement module 100. The AC/DC converter power supply 304 supplies power to the measurement module 100 through the connector 104.

Data indicating a measurement result output by the microprocessor 111 is transmitted to an external computer or the like by using a wireless module 305. The wireless module 305 is a communication module such as a wireless LAN or another small power wireless module. Note that a wired communication module such as a USB or a PLC may be adopted in place of the wireless module 305.

Since the measurement module 100 is small in this way, the power supply tap 300 is also made small, as a result of which the degree of freedom of built-in is increased. The essential effect is the same when a multi-tap is used as the power supply tap 300.

If such a small power supply tap 300 can be provided to monitor power at home, in offices, and the like, a power monitoring network can be readily established without taking up space.

Note that a power supply unit including the measurement module 100 described above may be provided. Alternatively, a built-in measurement module for incorporating the measurement module 100 into an electronic apparatus may be provided.

Meanwhile, to incorporate the above-described current detection circuit into the measurement module 100, the size of the current detection circuit has to be reduced so as to be fully accommodated inside the second space 114 within the magnetic shield 103. Further, more severe space constraints will be imposed in order to incorporate the current detection circuit and the like within the magnetic shield 103 together with a noise filter. Examples of the current detection circuit include a circuit that uses a current transformer. However, a current transformer is required to have a certain size so as not to saturate the magnetic substance core. Therefore, the current detection circuit that uses a current transformer is not suitable for applications where it needs to be incorporated into the measurement module 100. A current detection circuit that uses a Hall element requires a magnetic flux collecting core, and therefore, the size of this core cannot be reduced from the viewpoint of magnetic saturation. The size problem does not easily occur if a shunt resistor is placed in an AC line. However, it is necessary to provide insulation for a signal to be extracted, and therefore the use of a photocoupler or the like is essential. Accordingly, there is a problem in terms of size reduction. Further, a shunt resistor generates a large amount of heat when the current is large, and thus the shunt resistor can only cope with a current of several amperes. Therefore, the present invention provides a magnetic detection element that detects a current by directly detecting a magnetic field from the current paths.

Note that the current path 109b will be hereinafter referred to as a primary conductor.

Embodiment 1

Figure 12:
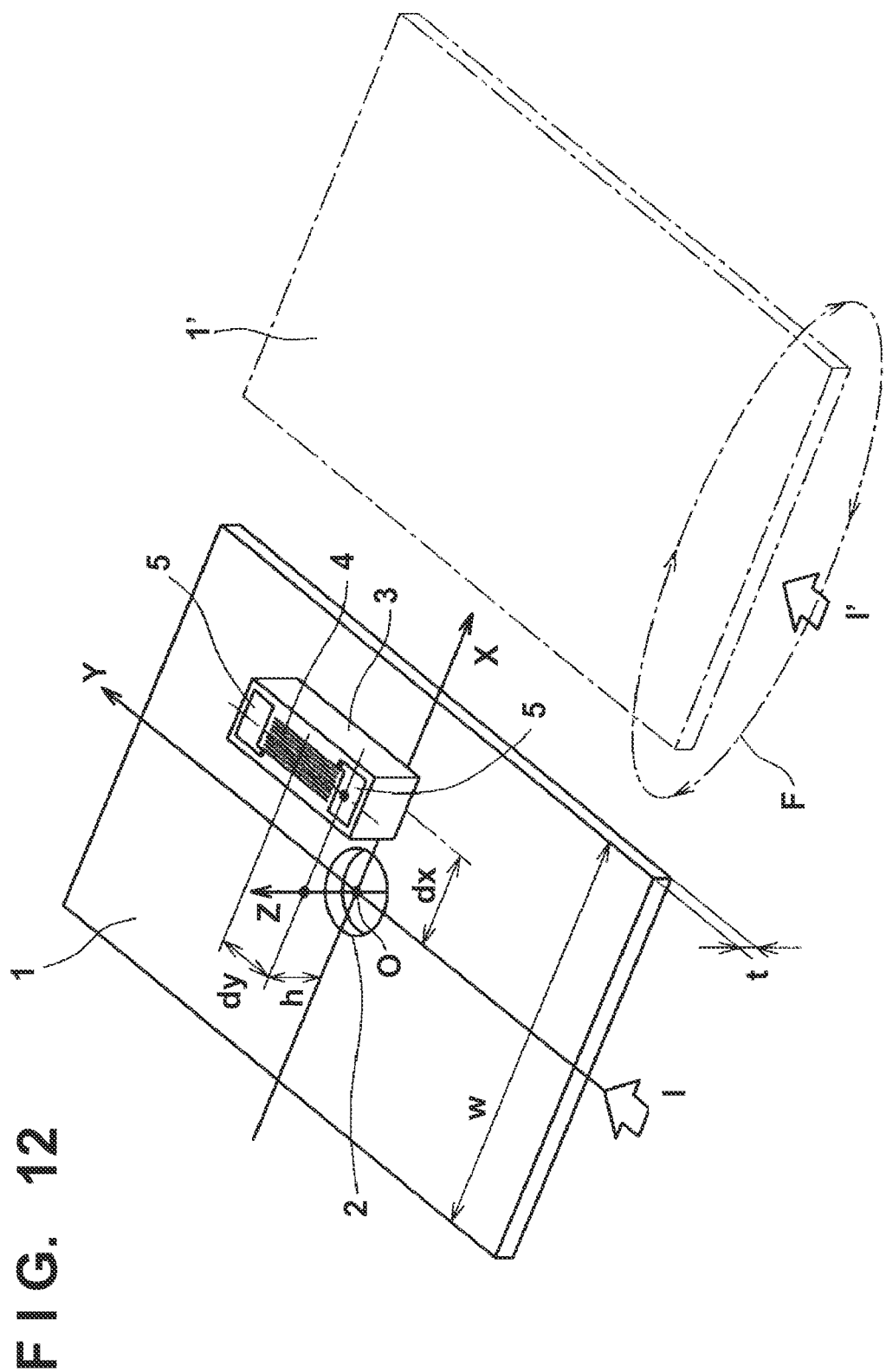
FIG. 12 is a diagram showing the configuration of Embodiment 1 in which current measurement is performed on a measurement current.

FIG. 12 is a diagram showing the basic configuration of Embodiment 1 in which current measurement is performed on a measurement current. A measurement current I to be detected flows through a primary conductor 1, which is in the form of, for example, a copper foil pattern on a printed board or a bus bar formed of a copper plate.

Figure 13:
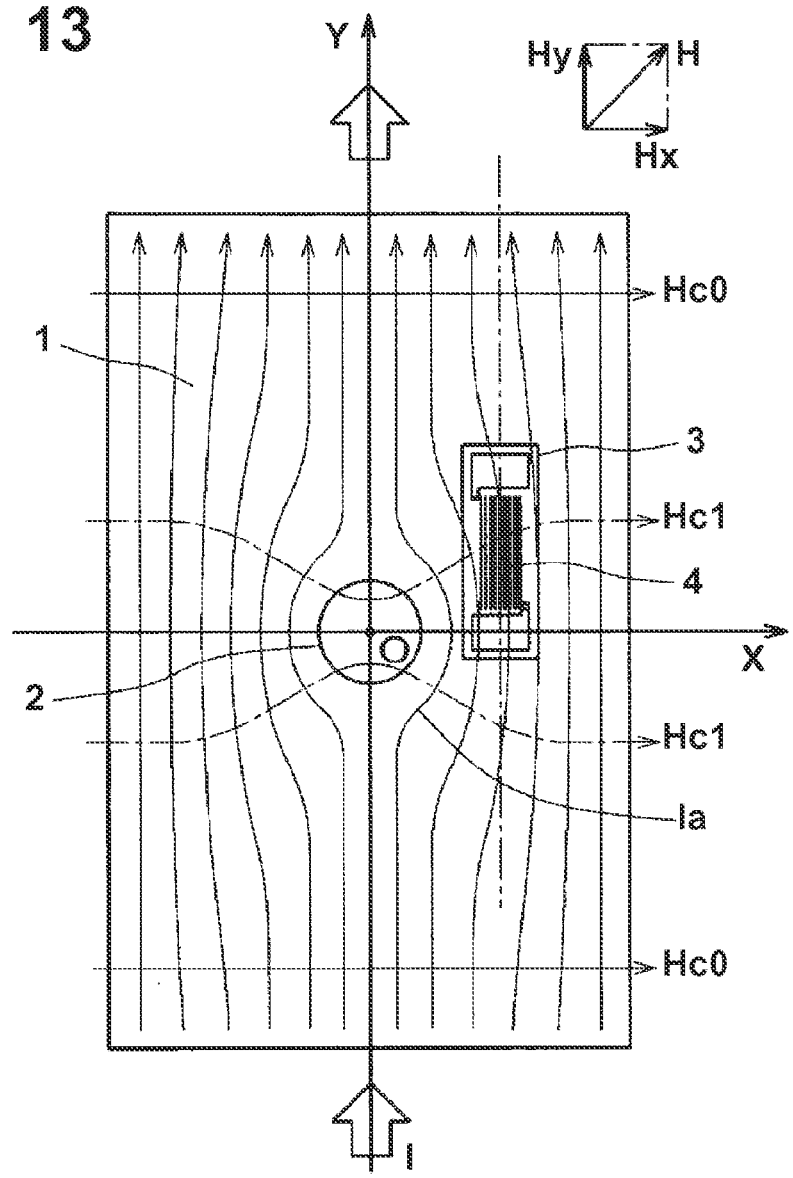
FIG. 13 is a diagram illustrating a state of the current and the magnetic field in a primary conductor.

A circular through hole 2 serving as a non-conductive area is provided at approximately the center of the primary conductor 1 to partially cut off the current. Accordingly, a part of the measurement current I constitutes a bypass current Ia that flows around the outside of the through hole 2 on both sides thereof in a symmetrical manner as shown in FIG. 13. For the convenience of illustration, coordinate axes are set for the primary conductor 1. With the center of the through hole 2 as an origin O, the main direction in which the measurement current I flows is defined as the Y-axis, the width direction, which is orthogonal to the Y-axis, is defined as the X-axis, and the thickness direction is defined as the Z-axis.

A magnetic detection element 3 having a magnetic field detection sensitivity only in one direction is disposed on the primary conductor 1. The magnetic field detection direction of a detection portion 4 of the magnetic detection element 3 is set in the Y-axis direction. The center of the detection portion 4 is set at a position that is shifted from the center of the through hole 2 by a distance dx in the X-axis direction and a distance dy in the Y-axis direction, with the X-axis interposed in between.

A magnetic flux generated by a current is inherently oriented in a direction orthogonal to the current direction. Thus, at a position where the through hole 2 of the primary conductor 1 does not have an effect, the measurement current I flows in the Y-axis direction, which is the main direction.

Accordingly, the magnetic field has only a vector component Hx in the X-axis direction within a width w of the primary conductor 1 as a magnetic field vector component Hc0 shown in FIG. 13.

However, since the bypass current Ia tilts relative to the Y-axis direction near the through hole 2, the bypass current Ia generates magnetic field vector components Hct of the distorted magnetic field on both sides of the through hole 2. That is, a vector component Hy in the Y-axis direction and the vector component Hx in the X-axis direction are generated at the tilt portion of the bypass current Ia. The vector sum of the vector component Hy and the vector component Hx is proportional to the magnitude of the measurement current I, and the current direction is symmetrical on the positive and negative sides of the Y-axis of the through hole 2. Thus, the vector components Hy are symmetric about the X-axis and have opposite polarities on both sides of the X-axis.

As shown in FIG. 12, even when a primary conductor 1' to which a current in a different phase flows is in the neighborhood of the primary conductor 1, and the direction of a neighboring current I' is parallel to that of the measurement current I, the magnetic field generated by the neighboring current I' has only a vector component in the X-axis direction and no component in the Y-axis direction. When the magnetic field detection direction of the detection portion 4 is the Y-axis direction, the magnetic detection element 3 can detect only the vector component Hy of the bypass current Ia without any interference with the magnetic field by the neighboring current I'. It is therefore possible to obtain the amount of the measurement current I by calibrating and converting the vector component Hy.

It is not desirable for the magnetic detection element 3 used to detect the magnetic field vector component Hx in the X-axis direction. Therefore, a magnetic impedance element or orthogonal fluxgate element having high directivity is suitable. In Embodiment 1, a magnetic impedance element is used, and a magnetic field can be detected only in the Y-axis direction. As the detection portion 4, thin magnetic film patterns are juxtaposed to form a meandering pattern in the Y-axis direction, which is the magnetic field detection direction. A high-frequency pulse in the MHz band is applied to electrodes 5 provided at the two ends of the detected portion 4. A change in the voltage amplitude from the two ends of the detection portion 4 caused by a change in the magnetic field is obtained as a sensor signal. Although not illustrated, some operations of the detection portion 4 require a bias magnetic field, which is set as needed by installing a bias magnet in the vicinity thereof or winding a bias coil therearound to supply a current.

Figure 14:
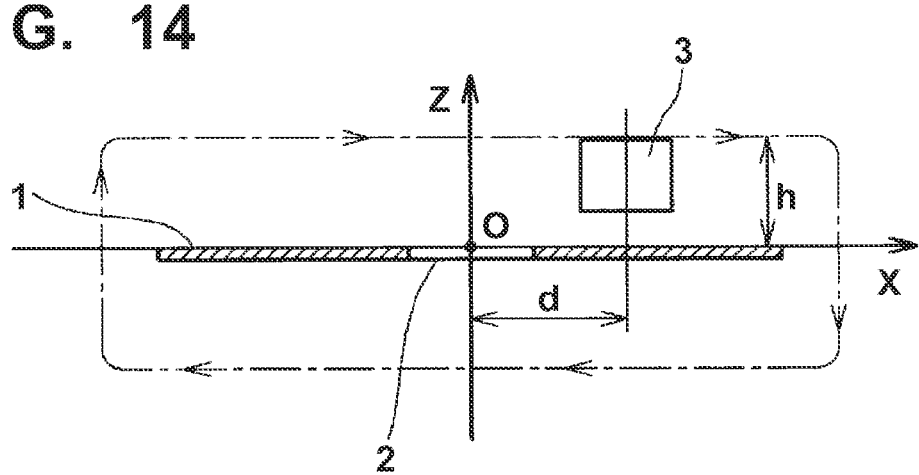
FIG. 14 is a cross-sectional view showing the relationship between the primary conductor and a magnetic detection element.

As shown in FIG. 14, a height h of the detection portion 4 of the magnetic detection element 3 relative to the primary conductor 1 is determined in relation to the dielectric breakdown voltage based on the space, the spatial distance, the creeping distance, and the like structurally necessary for maintaining the positional relationship between the primary conductor 1 and the magnetic detection element 3.

Figure 15:
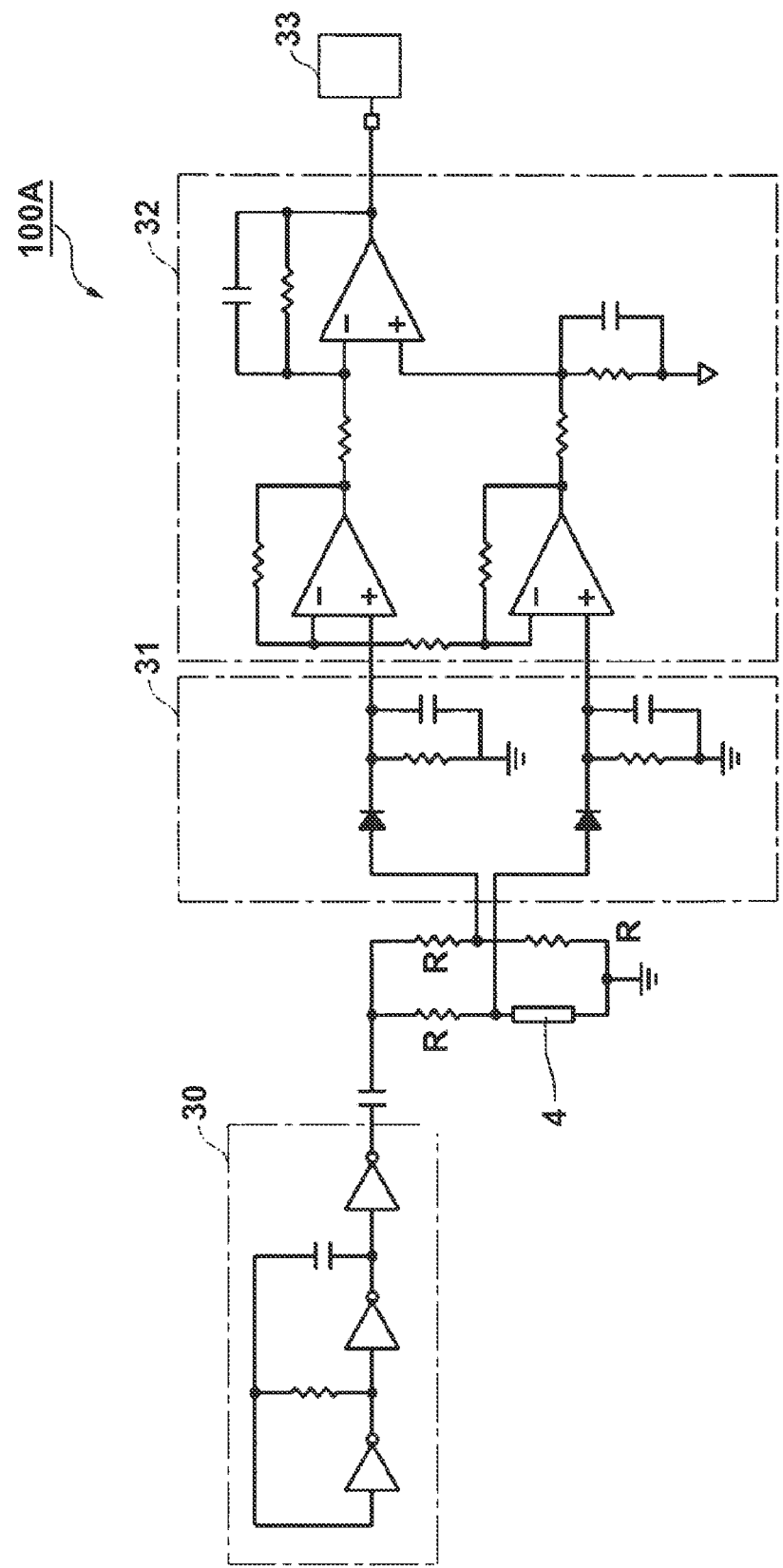
FIG. 15 is a diagram showing the configuration of a detection circuit.

FIG. 15 is a diagram showing the configuration of a detection circuit 100A that functions as a current measurement device. The detection portion 4 of the magnetic detection element 3 is connected to a resistor R constituting a bridge to a CR pulse oscillation circuit 30. A detection circuit 31 extracts an amplitude change from a voltage across the detection portion 4, which is a detection signal of the detection portion 4, and outputs the signal to an amplification circuit 32. The amplification circuit 32 amplifies the amplitude change and output the resultant. An estimation circuit 33 estimates the amount of the measurement current from the output of the amplification circuit 32.

Figure 16:
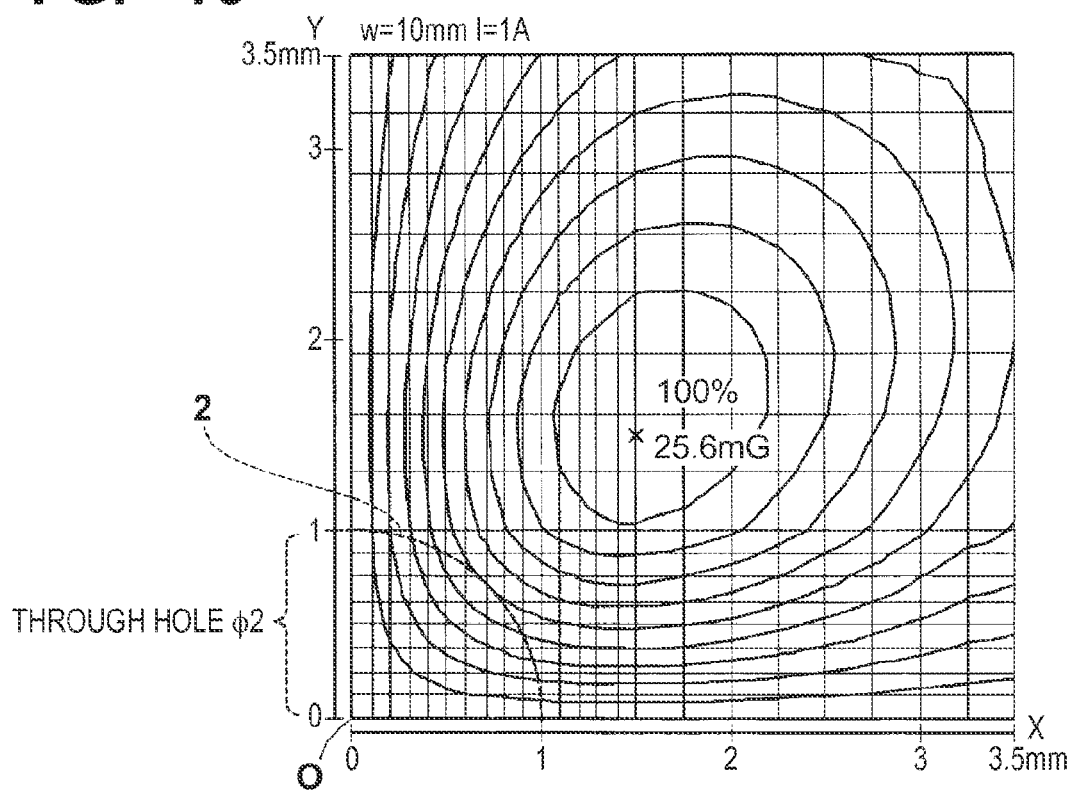
FIG. 16 is a distribution contour map of a Y-axis direction magnetic field component using a through hole having a diameter of 2 mm.
Figure 17:
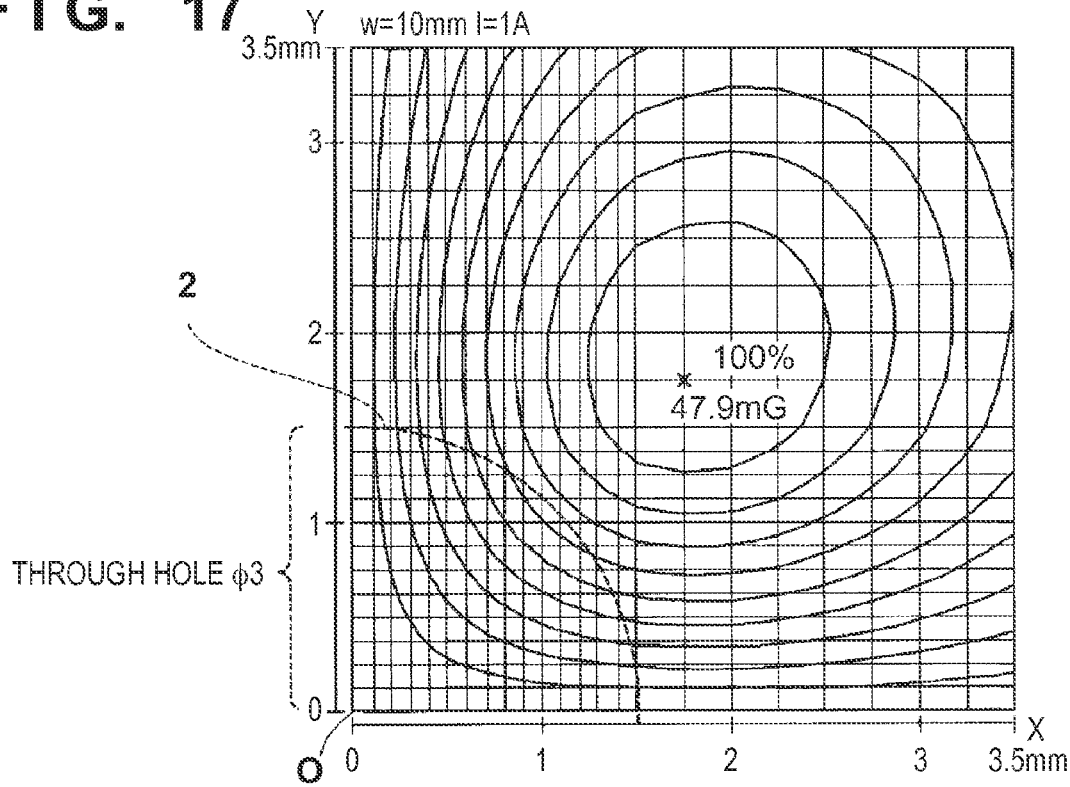
FIG. 17 is a distribution contour map of a Y-axis direction magnetic field component using a through hole having a diameter of 3 mm.

FIGS. 16 and 17 show the results of simulations of the Y-axis magnetic field component Hy associated with the bypass current Ia by the through hole 2. The primary conductor 1 is a copper plate having a cross section with an X-axis width w=10 mm and a Z-axis thickness t=70 μm and a sufficient length in the Y-axis direction that is calculated as infinite. The through hole 2 is formed at the center in the X-axis direction. The detection portion 4 is fixed at the height h of 1.6 mm from the primary conductor 1. A change in the Y-axis magnetic field vector component Hy when the measurement current I of 1 ampere (A) was supplied in the Y-axis direction was examined.

FIG. 16 shows, as a distribution of contours, the calculation result of the Y-axis magnetic field vector component Hy when the through hole has a diameter of 2 mm. FIG. 17 shows, as a distribution of contours, the calculation result of the Y-axis magnetic field vector component Hy when the through hole has a diameter of 3 mm. In the first quadrant where the coordinates X≥0 and Y≥0, the apex of the vector component Hy is set to 100%, and the contours are plotted in 10% increments. In each of the remaining quadrants, a magnetic field distribution symmetric about the X- or Y-axis is formed. In the third quadrant, a magnetic field having the same polarity as in the first quadrant is formed. In each of the second and fourth quadrants, a magnetic field having a polarity opposite to that in the first quadrant is formed.

As can be seen from FIGS. 16 and 17, the peak position where the magnetic field is maximized is in a direction at about 45° from the through hole 2. When the diameter of the through hole 2 is 2 mm, the peak position is at around (X, Y)=(1.5 mm, 1.625 mm). When the diameter of the through hole 2 is 3 mm, the peak position is at around (X, Y)=(1.75 mm, 1.75 mm). The magnetic field components Hy at the peak positions of these magnetic fields are Hy=25.6 mgauss (G) and Hy=47.9 mgauss (G) for a current of 1 ampere (A).

Figure 18:
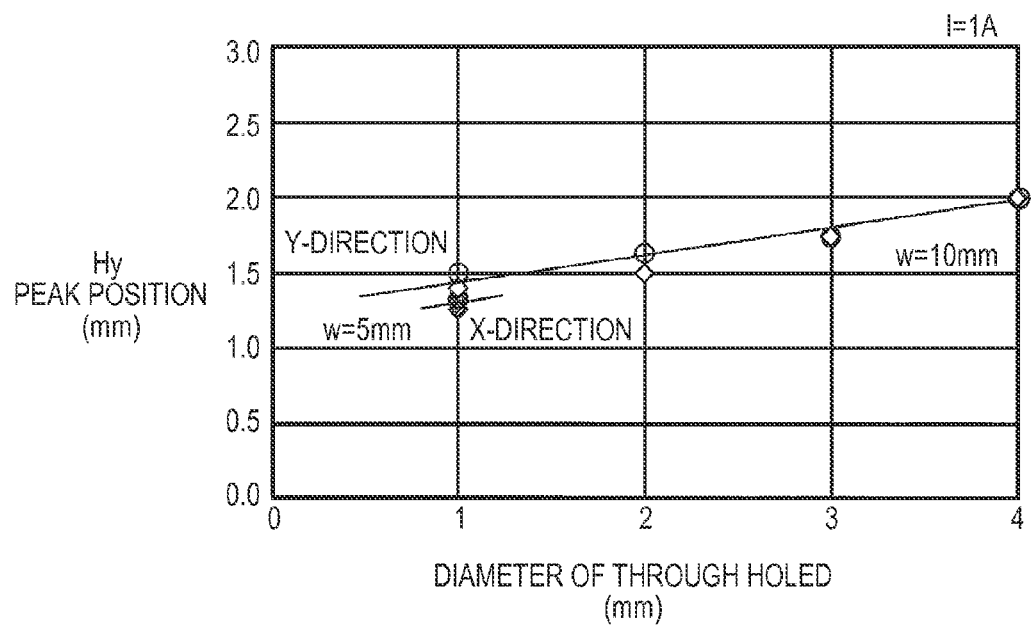
FIG. 18 is a diagram showing the relationship between the diameter of the through hole and the peak position of the Y-axis direction magnetic field component.

FIG. 18 is a graph showing the relationship between the diameter of the through hole 2 and the peak position of the Y-axis magnetic field vector component Hy. FIG. 18 also shows the results for diameters of 1 mm and 4 mm, although they are not illustrated in the contour maps of FIGS. 16 and 17. As can be seen from FIG. 18, the diameter of the through hole 2 rarely depends on the position of the peak portion. Considering the result for the through hole 2 having a diameter of 1 mm at the width w=5 mm as well, the range of the peak of the vector component Hy is supposed to be about 1 to 2 mm in both the X- and Y-axis directions within the practical use range of the primary conductor 1.

The range of 90% lower than the peak position by 10% forms a circle having a radius of about 0.5 mm. Accordingly, both the distances dx and dy in FIG. 1 may range from 0.5 mm to 2.5 mm in terms of design, and the detection portion 4 of the magnetic detection element 3 may be located in this range.

Figure 19:
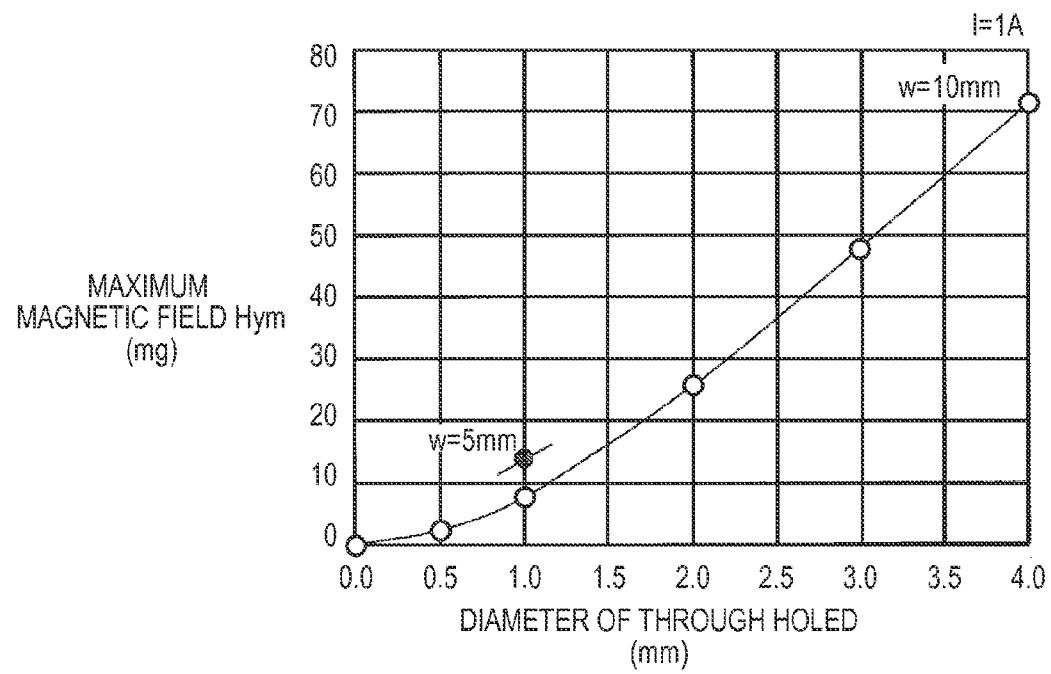
FIG. 19 is a diagram showing the relationship between the diameter of the through hole and the peak value of the Y-axis direction magnetic field component.

FIG. 19 is a graph showing the relationship between the diameter of the through hole 2 of the primary conductor 1 and the peak value of the Y-axis vector component Hy. As can be seen from FIG. 19, the larger the diameter is, the larger the vector component Hy expressed as a quadratic function is. That is, a measurement range several-fold larger can be selected only by fixing the detection portion 4 of the magnetic detection element 3 at around the distance dx=1.5 mm and dy=1.5 mm shown in FIG. 12 and changing the diameter of the through hole 2.

Referring to FIG. 12, the magnetic detection element 3 is provided in the first quadrant on the X-Y plane. However, it may be, of course, arranged in another quadrant because of the symmetry.

Figure 20:
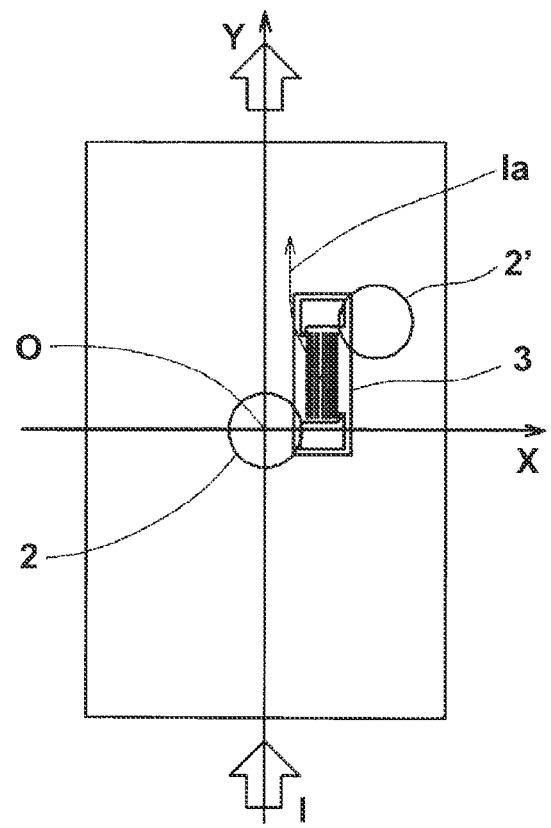
FIG. 20 is a diagram showing the configuration of a variation in which current measurement is performed on a measurement current.

FIG. 20 shows a variation. A through hole 2' is provided in a direction at 45° with respect to the X-axis direction away from the origin O where the through hole 2 is located, and the magnetic detection element 3 is disposed at the intermediate position between the through holes. With this configuration, the effect of the bypass current Ia by the two through holes 2 and 2' is enhanced to increase the magnetic field of the Y-axis component and raise the sensitivity. The two through holes 2 and 2' need not have the same size, and the number of through holes 2 may be increased. The angular position to form the through hole may be designed in accordance with the current detection specifications.

Figure 21:
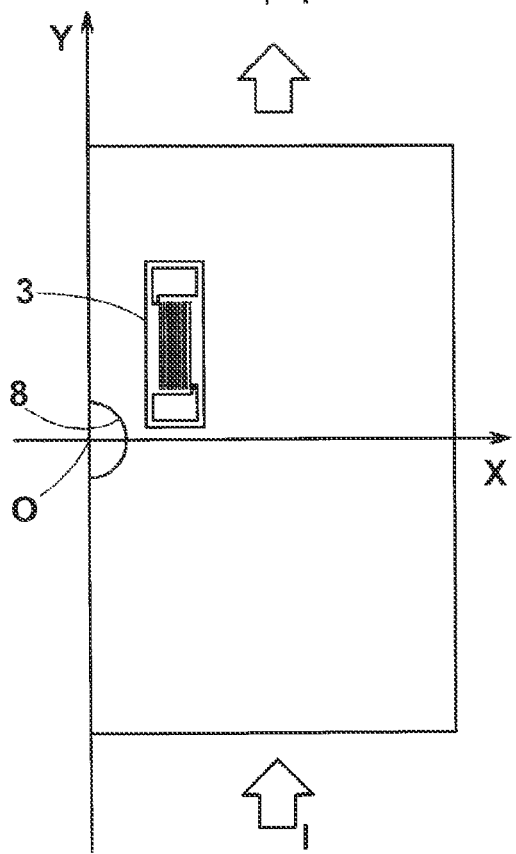
FIG. 21 is a diagram showing the configuration of a variation in which current measurement is performed on a measurement current.

Using not only the through hole 2 but also a notch hole to form a non-conductive area as the means for causing the current to bypass makes it possible to cope with both large and small currents. For example, the bypass current can also be generated by providing a notch hole 8 at an end of the primary conductor 1 in the width direction, as shown in FIG. 21. This configuration is suitable for suppressing the magnetic field by the bypass current using a large current.

Figure 22:
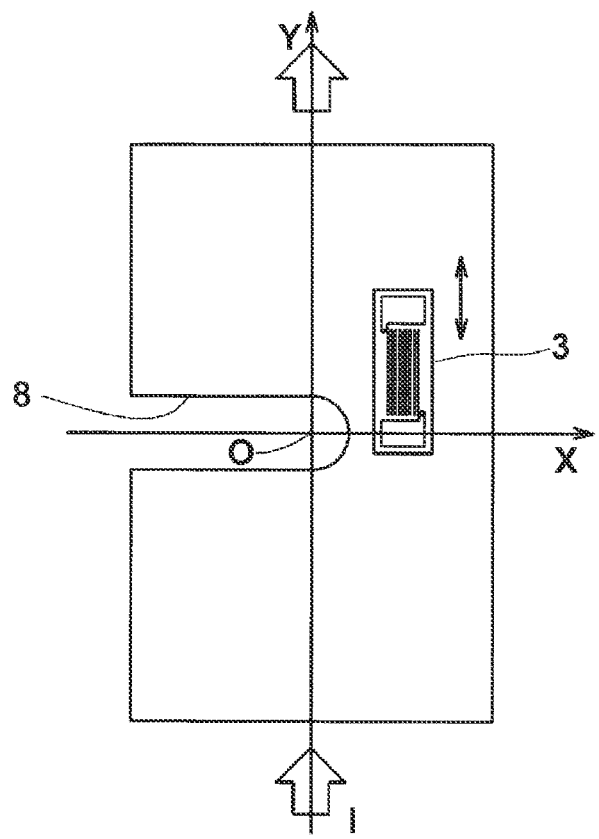
FIG. 22 is a diagram showing the configuration of a variation in which current measurement is performed on a measurement current.
Figure 23:
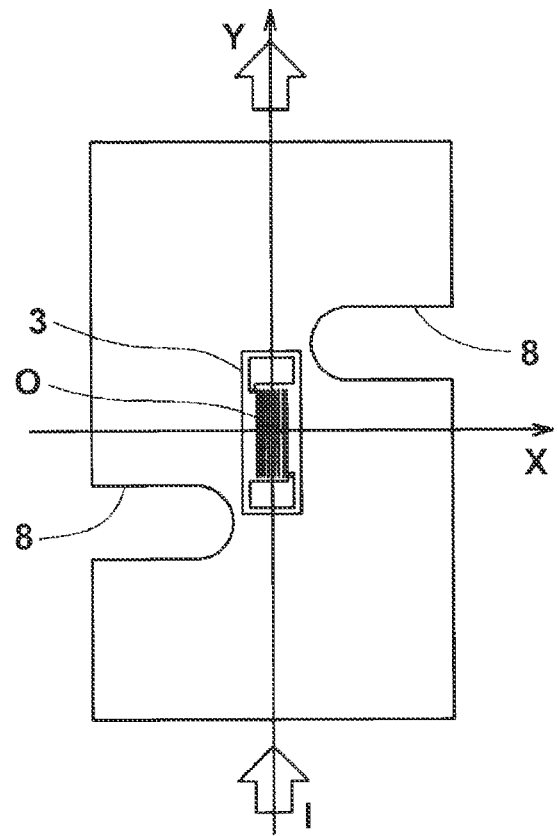
FIG. 23 is a diagram showing the configuration of a variation in which current measurement is performed on a measurement current.

Conversely, it is also possible to cope with a small current by making the notch hole 8 deeper so as to concentrate the bypass current and increase the magnetic field of the Y-axis component, as shown in FIG. 22. Also, as shown in FIG. 23, another notch hole 8 may be formed at the opposite end at a shifted position so as to further increase the bypass current, thus making it possible to cope with a smaller current.

Embodiment 2

Figure 24:
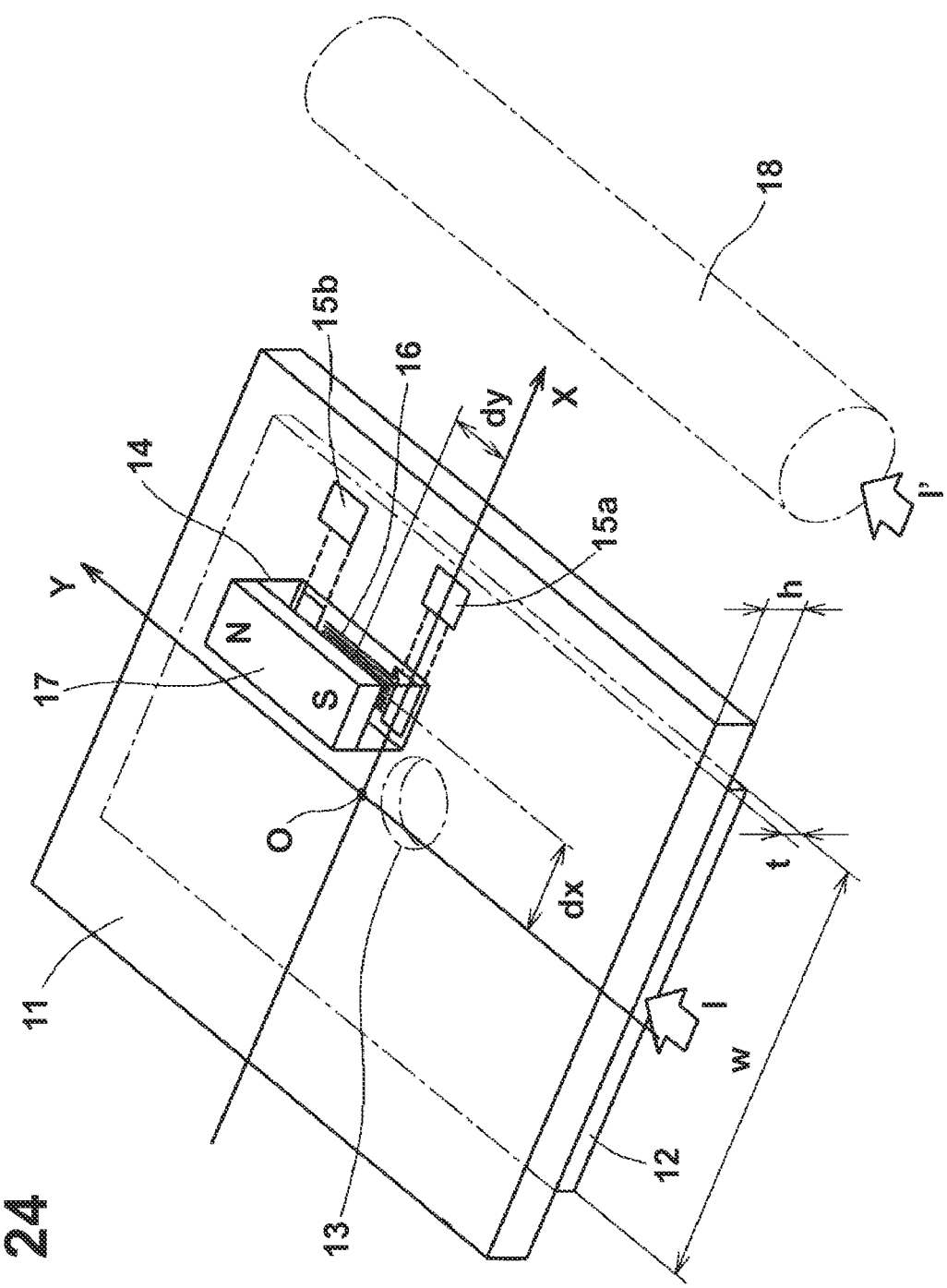
FIG. 24 is a diagram showing the configuration of Embodiment 2 in which current measurement is performed on a measurement current.

FIG. 24 is a diagram showing the configuration of Embodiment 2. For example, a primary conductor 12 formed from a copper pattern having an X-axis width of 10 mm, a Z-axis thickness of 70 μm, and a length of 50 mm in the longitudinal direction, which is the Y-axis direction, is provided on one side of a sensor board 11 made of a glass epoxy material and having a thickness of 1.6 mm. A through hole 13 having a diameter of, for example, 2 mm is formed at the center in the X-axis direction of the primary conductor 12 by etching. An integrated magnetic detection unit 14 is disposed at the same position as in FIG. 25 on the other side of the sensor board 11. Electrodes 15a and 15b for soldering are drawn onto the sensor board 11.

A magnetic impedance element is used as the magnetic detection unit 14. In a detection portion 16 formed from an Fe—Ta—C-based thin magnetic film, 11 elongated patterns each having, for example, a width of 18 μm, a thickness of 2.65 μm, and a length of 1.2 mm are juxtaposed. The detection portion 16 has the magnetic field detection direction only in the Y-axis direction.

The position of the detection portion 16 is offset from the center of the through hole 13 by a distance dx=1.5 mm in the X-axis direction and a distance dy=1.5 mm in the Y-axis direction. Although not illustrated, the plurality of thin magnetic film patterns of the detection portion 16 are electrically connected in series to form a meandering pattern whose ends are connected to corresponding electrodes, soldered to the electrodes 15a and 15b on the sensor board 11, and connected to a sensor circuit (not shown). Referring to FIG. 24, a high-frequency pulse is applied in the direction from the electrode 15a to the electrode 15b.

The thin magnetic films of the magnetic detection unit 14 are provided with an axis of easy magnetization in the width direction, which is the X-axis direction. When a high-frequency pulse is applied to the thin magnetic film patterns, the impedance is changed by an external magnetic field, and the voltage across the magnetic detection unit 14 is converted into a sensor signal by amplitude detection.

To evaluate the influence of a current other than a measurement current I that flows in parallel, a copper rod 18 having a diameter of 2 mm was disposed parallel to and at an interval of 10 mm from the primary conductor 12, as shown in FIG. 24. The measurement was performed while supplying a 50-Hz current I' of 10 Arms but supplying no current to the primary conductor 12. In this case, the level of the current I' flowing through the copper rod 18 was equal to or lower than the noise level (equal to or lower than 10 mVpp), and no influence of the current I' was observed by the magnetic detection unit 14.

A magnetic field from the adjacent parallel current lines has only an X- or Z-axis component and no Y-axis component, and the magnetic impedance element has no sensitivity in the X-axis direction. It was confirmed that these facts effectively acted, and the influence of the magnetic field by the adjacent current was at a level that will not pose a problem.

Figure 25:
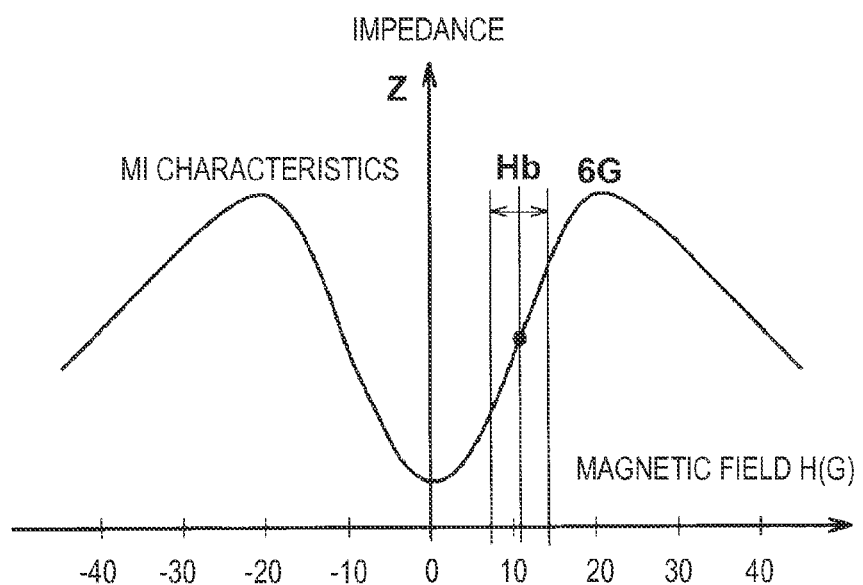
FIG. 25 is a graph showing characteristics of a magnetic impedance element.

In 5-MHz pulse driving at 5 V, the magnetic detection unit 14 exhibits a V-shaped impedance change characteristic for a magnetic field, as shown in FIG. 25, and uses a portion with a gradient of high sensitivity. To do this, a bias magnet 17 is disposed on the back surface of the magnetic detection unit 14, as shown in FIG. 24, so as to apply a bias magnetic field of about 10 gauss (G) to the detection portion 16. For the magnetic detection unit 14, a linear satisfactory range is about ±3 gauss (G) on both sides of the bias operating point.

Figure 26:
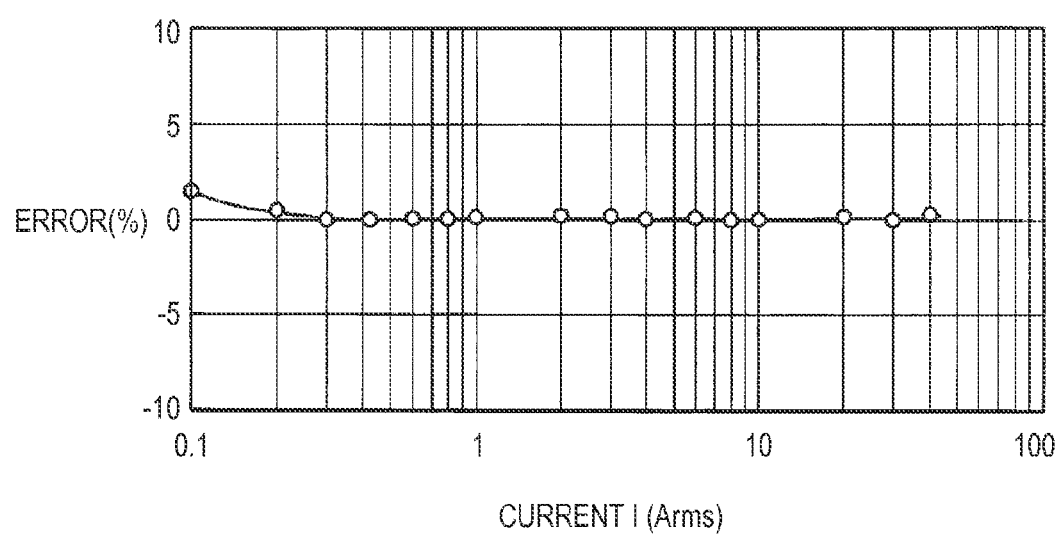
FIG. 26 is a graph showing a detection current and a measurement error.

FIG. 26 shows the data of current measurement obtained by passing an AC current (50 Hz) through the primary conductor 12 variably within the range of 0.1 to 40 Arms. A current of 10 Arms is a sine wave of 28.28 App. The magnetic field at this time is 724 mGpp based on the simulation result. FIG. 26 shows the error between the ideal value and the actual measured value based on 10 Arms. Since adjusted to 1 Vpp for 10 Arms of a 5-V power supply, the upper limit is 40 Arms. As the accuracy, an error of ±1% or less is guaranteed for 0.2 Arms or more.

When the through hole 13 has a diameter of 2 mm, and the linearity range of the magnetic detection unit 14 is 6 gauss (G), the current exceeds the ideal value at a portion little more than 80 Arms. If it is to cope with a current up to 200 Arms, the magnetic field applied to the magnetic detection unit 14 is reduced to ⅓ simply by decreasing the diameter of the through hole 13 to 1 mm. This allows coping with a current as large as 270 Arms using the same layout. Conversely, simply making the through hole 13 larger allows coping with specifications for a small current.

Embodiment 2 assumes an example in which the primary conductor 12 is disposed on the sensor board 11. However, when the primary conductor is a bus bar 19 formed from a copper plate as illustrated in a variation shown in FIG. 27, a structure obtained by removing the primary conductor 12 from the configuration shown in FIG. 24 can be placed as a module on a sensor board 20. In this case, it is possible to use the sensor board 20 that is aligned with a through hole 21 formed in the bus bar 19 and fixed to the bus bar 19 by bonding or the like. Note that reference numeral 22 denotes a circuit element provided on the sensor board 20, and reference numeral 23 denotes a signal line for extracting the signal of the magnetic detection unit 14.

With this configuration, it is possible to achieve easy assembly by forming the magnetic detection unit 14 as a module and assembling it to the bus bar 19 even after the bus bar 19 is laid in advance.

Note that in the above-described embodiments, a non-conductive area is provided using a through hole or a notch hole to cause the current to bypass. However, the current can also be caused to bypass by disposing not a hole portion but an insulating material.

Embodiment 3

Japanese Patent Laid-Open No. 2006-184269 proposes avoiding a disturbance magnetic field by differential detection using two magnetic detection elements. In this patent reference, to avoid the influence of an external magnetic field when detecting a magnetic field by a measurement current using a single magnetic sensor, an opening portion is formed at the center of a bus bar serving as a primary conductor to branch the measurement current. Also, the magnetic detection elements are disposed such that magnetic fields having phases opposite to each other are generated by the current near the two conductors in the opening portion, and only a magnetic field generated from the bus bar is detected by differential amplification.

In this method, the influence on a uniform magnetic field can be reduced. However, if adjacent current lines flow in parallel, the two magnetic detection elements are not equally applied with a magnetic field as the disturbance. As a result, a magnetic shield is eventually indispensable. To solve this, Embodiments 1 and 2 have proposed providing the primary conductor with a non-conductive area and providing one magnetic detection element in the neighborhood of the non-conductive area. Here, a plurality of magnetic detection elements may be provided. In Embodiment 3, a proposal to provide a plurality of magnetic detection elements will be described.

Figure 28:
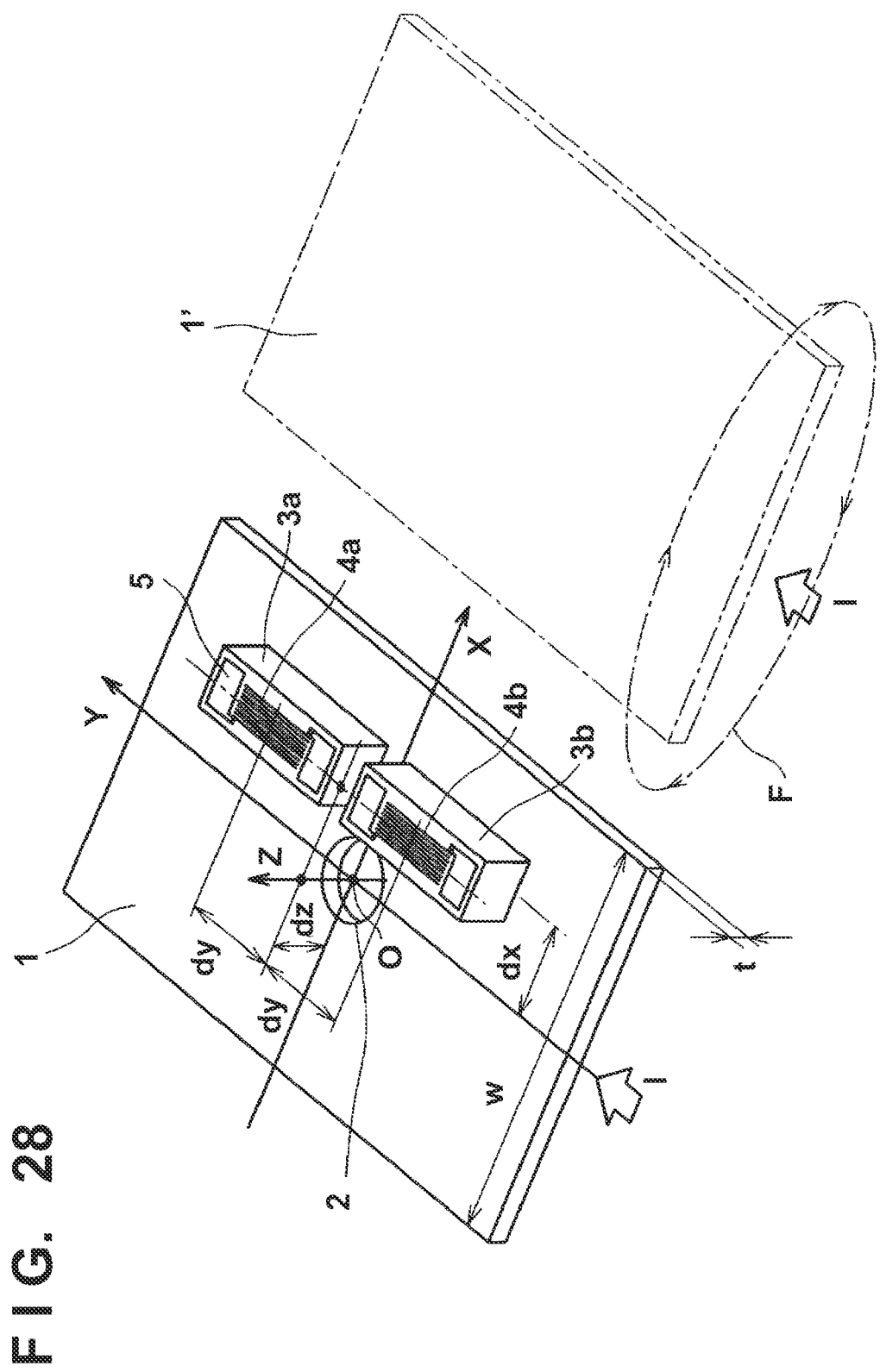
FIG. 28 is a perspective view showing a basic configuration of a current sensor according to Embodiment 3 in which current measurement is performed on a measurement current.

FIG. 28 is a diagram showing the configuration of a basic current sensor according to Embodiment 3 in which a current measurement is performed on a measurement current. A measurement current I to be detected flows through a primary conductor 1, which is in the form of, for example, a copper foil pattern on a printed board or a bus bar formed of a copper plate.

Figure 29:
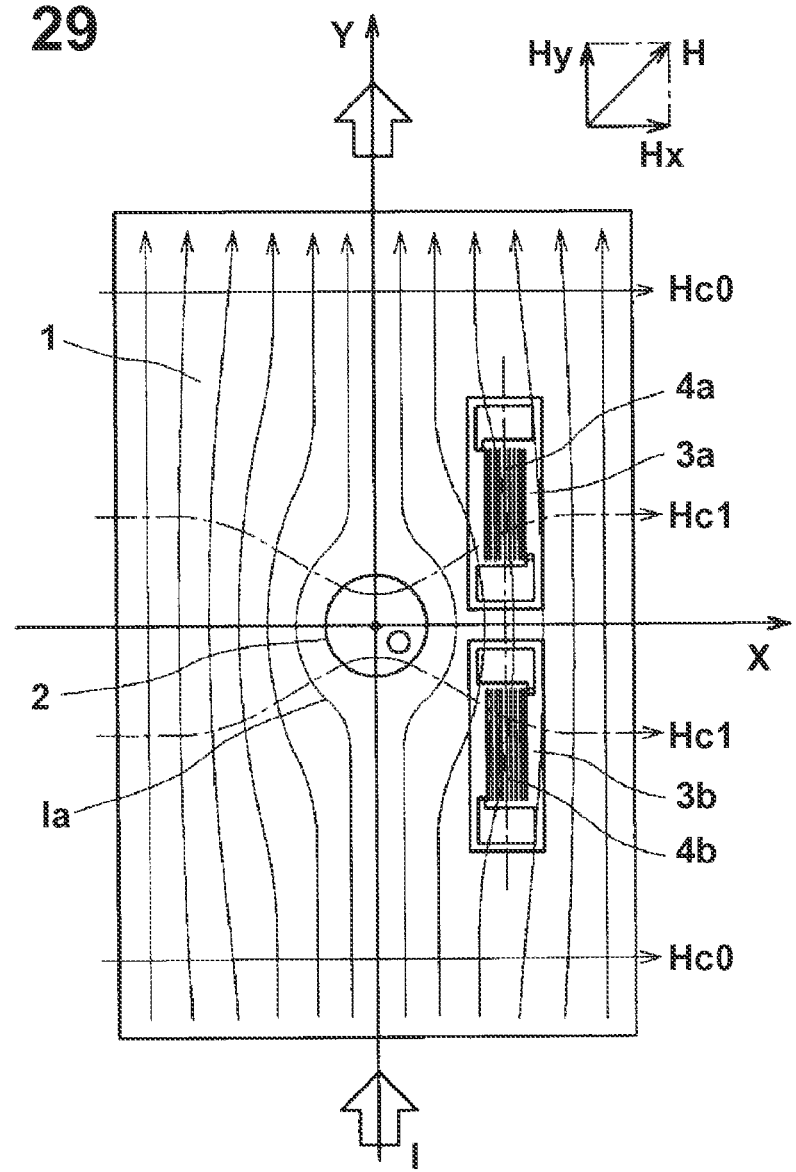
FIG. 29 is a diagram illustrating a state of the current and the magnetic field in a primary conductor.

A circular through hole 2 serving as a non-conductive area is provided at approximately the center of the primary conductor 1 to partially cut off the current. Accordingly, a part of the measurement current I constitutes a bypass current Ia that flows around the outside of the through hole 2 on both sides thereof in a symmetrical manner as shown in FIG. 29. For the convenience of illustration, coordinate axes are set for the primary conductor 1. With the center of the through hole 2 as an origin O, the main direction in which the measurement current I flows is defined as the Y-axis, the width direction, which is orthogonal to the Y-axis, is defined as the X-axis, and the thickness direction is defined as the Z-axis.

Two magnetic detection elements 3a and 3b are disposed on the primary conductor 1 in series in the Y-axis direction to perform differential detection. The magnetic field detection direction of detection portions 4a and 4b of the magnetic detection elements 3a and 3b is set in the Y-axis direction. The center of each of the detection portions 4a and 4b is set at a position shifted from the center of the through hole 2 by a distance dx in the X-axis direction and a distance dy in the Y-axis direction, with the X-axis interposed in between. As shown in FIG. 28, even when a primary conductor 1' to which a current in a different phase flows is in the neighborhood of the primary conductor 1, and the direction of a neighboring current I' is parallel to that of the measurement current I, the magnetic field generated by the magnetic flux F of the neighboring current I' has only a vector component in the X-axis direction and no component in the Y-axis direction. When the magnetic field detection direction of the detection portions 4a and 4b is the Y-axis direction, the magnetic detection elements 3a and 3b can detect only the vector component Hy of the measurement current I without any interference with the magnetic field by the neighboring current I'. It is therefore possible to obtain the amount of the measurement current I by calibrating and converting the vector component Hy.

It is not desirable for the magnetic detection elements 3a and 3b used to detect the magnetic field vector component Hx in the X-axis direction. Therefore, a magnetic impedance element or orthogonal fluxgate element having high directivity is suitable. In Embodiment 3, a magnetic impedance element is used. As the detection portions 4a and 4b, thin magnetic film patterns are juxtaposed to form a meandering pattern in the Y-axis direction, which is the magnetic field detection direction. A high-frequency pulse in the MHz band is applied to electrodes 5 provided at the two ends of the detection portions 4a and 4b. A change in the voltage amplitude from the two ends of the detection portions 4a and 4b caused by a change in the magnetic field is obtained as a sensor signal.

Figure 30:
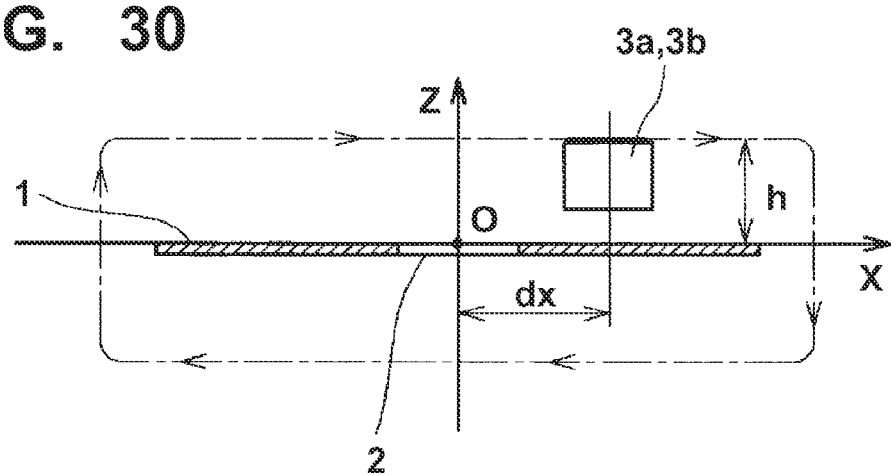
FIG. 30 is a cross-sectional view showing the relationship between the primary conductor and a magnetic detection element.

As shown in FIG. 30, a height h of the detection portions 4a and 4b of the magnetic detection elements 3a and 3b relative to the primary conductor 1 is determined in relation to the dielectric breakdown voltage based on the space, the spatial distance, the creeping distance, and the like structurally necessary for maintaining the positional relationship between the primary conductor 1 and the magnetic detection elements 3a and 3b.

Figure 31:
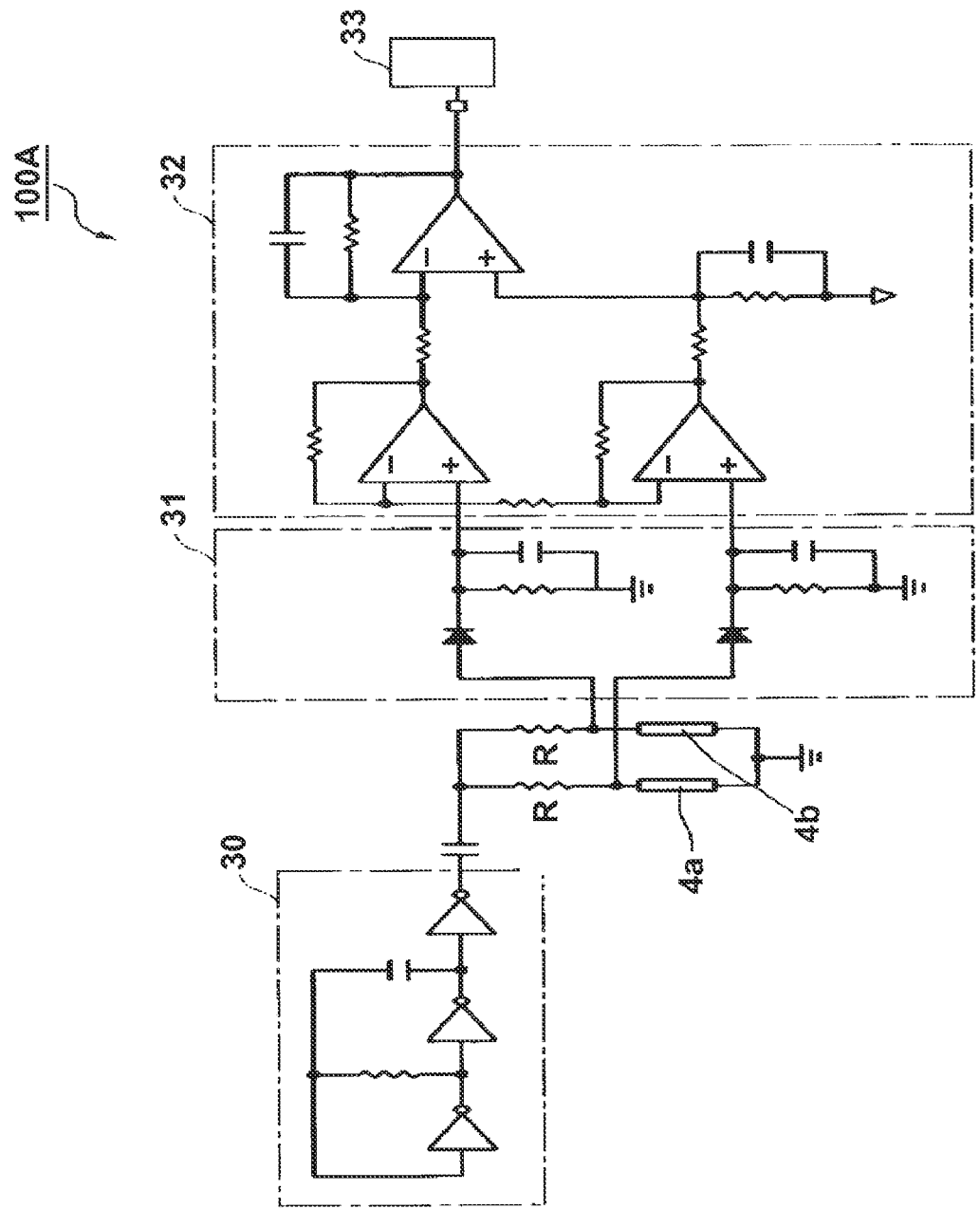
FIG. 31 is a diagram showing the configuration of a detection circuit.

FIG. 31 is a diagram showing the configuration of a detection circuit 100A. The detection portions 4a and 4b of the magnetic detection elements 3a and 3b are connected to resistors R constituting a bridge to a CR pulse oscillation circuit 30. After a detection circuit 31 extracts amplitude changes from the voltages across the detection portions 4a and 4b, an differential amplification circuit 32 performs differential amplification on the outputs from the detection portions 4a and 4b, thereby obtaining the output of the current sensor.

In this case, the outputs of the detection portions 4a and 4b have the same absolute value and different polarities if they have the same sensitivity and are located so as to be symmetric about the X-axis. For this reason, when the signals are detected differentially, a value twice the absolute value of the output from the detection portion 4a or 4b is obtained as the output. In addition, external magnetic field noises are in phase for the detection portions 4a and 4b within a narrow range. When the outputs of the detection portions 4a and 4b are differentially detected, the magnetic field noises cancel each other and are not superimposed on the output of the current sensor. Consequently, only the vector component Hy of the bypass current is measured. Note that to differentially detect the outputs of the magnetic detection elements, at least two detection portions may be used. Here, as is apparent from comparison between FIGS. 31 and 15, the four resistors that form the bridge circuit are replaced with the detection portions. For example, three resistors out of the four resistors are replaced with the detection portions when three detection portions are employed. When four detection portions are employed, all resistors are replaced with the detection portions.

Referring to FIG. 28, the magnetic detection elements 3a and 3b are provided in the first and fourth quadrants on the X-Y plane, respectively. However, they may be, of course, disposed adjacently in other quadrants because of the symmetry.

Figure 32:
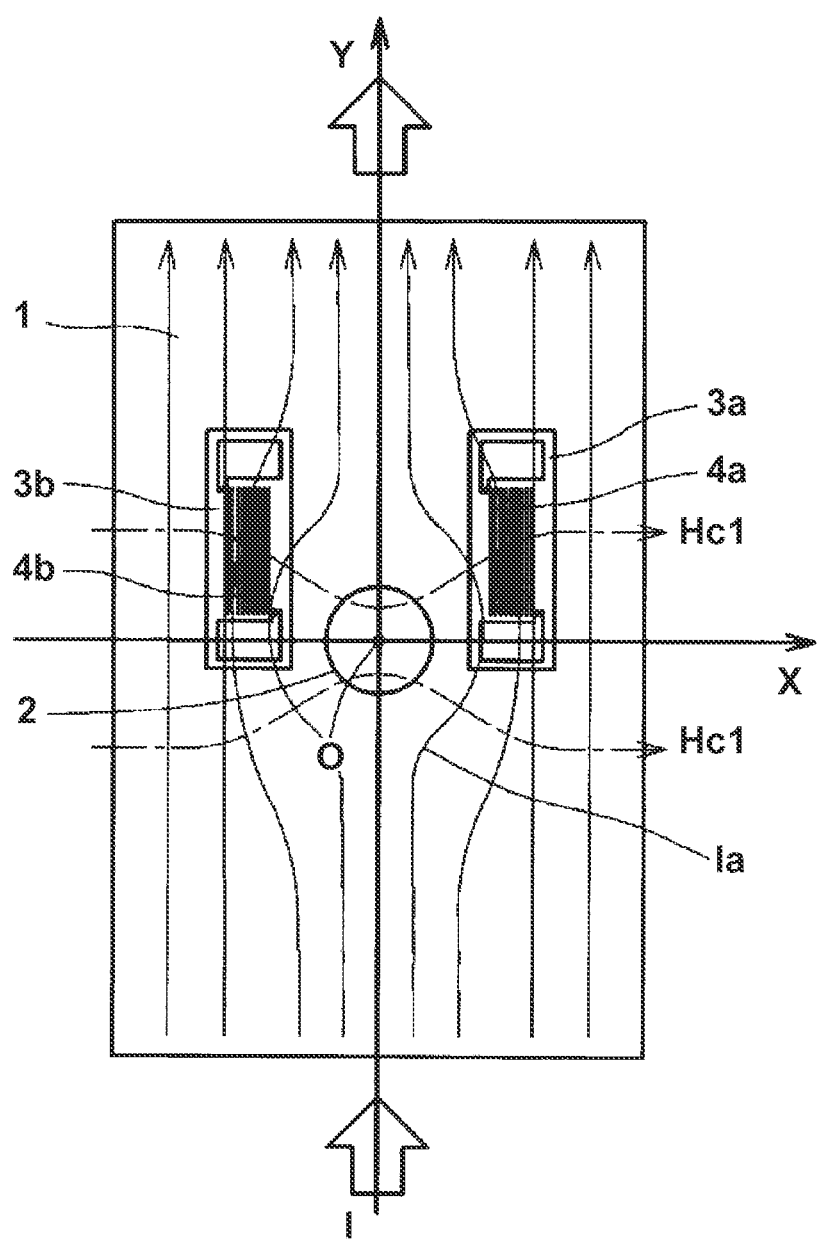
FIG. 32 is a diagram showing the configuration of a variation in which current measurement is performed on a measurement current.

FIG. 32 shows a variation in this case. The same result can be obtained even when the magnetic detection element 3a is provided in the first quadrant, and the magnetic detection element 3b is disposed in the second quadrant so that they are disposed symmetrically about the Y-axis. Magnetic field vector components Hc1 by the bypass current Ia are symmetric about the Y-axis in the first and second quadrants. Therefore, when the magnetic detection elements 3a and 3b are disposed in the first and second quadrants, respectively, the Y-axis vector components Hy having the same absolute value and opposite polarities can be detected. In this case, although slightly affected by the adjacent parallel current lines, magnetic field noises can almost be canceled by differential detection because the interval between the magnetic detection elements 3a and 3b is narrow.

Embodiment 4

If the detection magnetic field range needs to be managed within a certain range from the viewpoint of magnetic saturation or linearity, as in the case of a magnetic impedance element or orthogonal fluxgate sensor serving as a magnetic detection element, the measurement range is preferably adjustable only by the diameter of the through hole 2 of the primary conductor 1.

Figure 33:
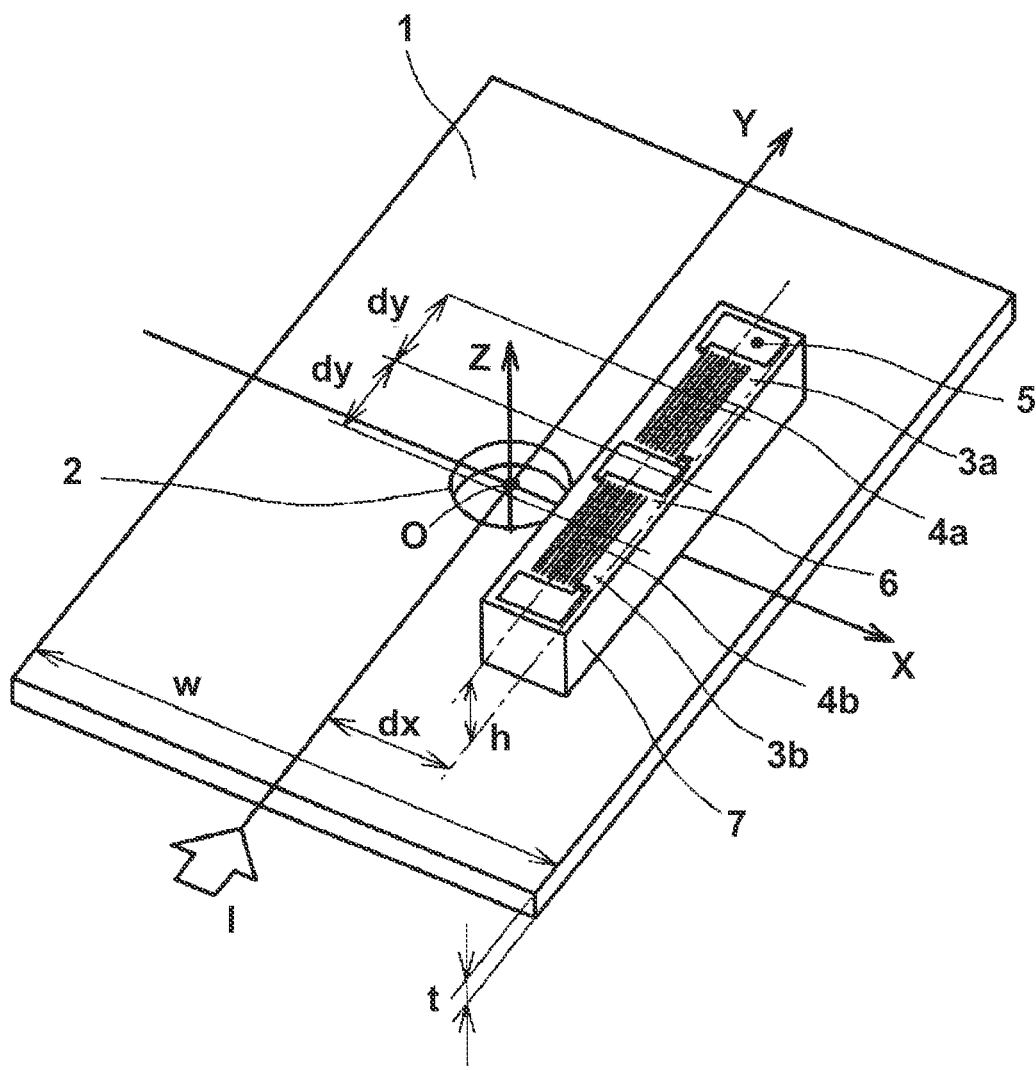
FIG. 33 is a diagram showing the configuration of Embodiment 4 in which current measurement is performed on a measurement current.

FIG. 33 is a diagram showing the configuration of a current sensor according to Embodiment 4. The distance between the detection portions 4a and 4b of the magnetic detection elements 3 and 4 in FIG. 33 is short. Thus, the magnetic detection elements 3a and 3b disposed so as to be symmetric about the X-axis are integrally attached to a single element substrate 6 to form a magnetic detection unit 7, thereby making it possible to suppress a variation in performance.

Figure 34:
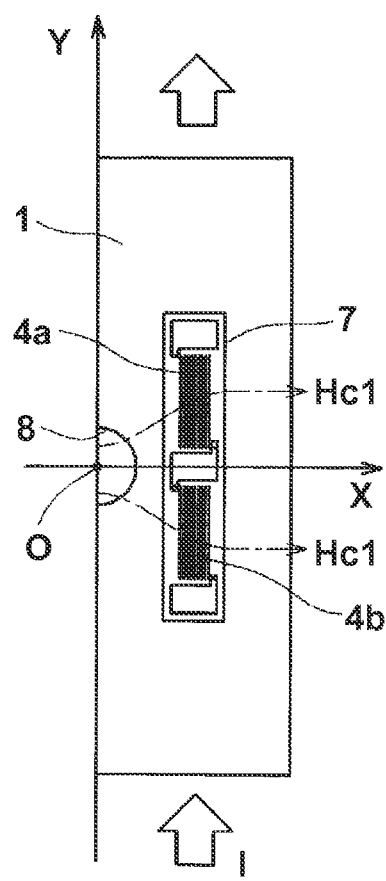
FIG. 34 is a diagram showing the configuration of a variation in which current measurement is performed on a measurement current.

Based on an idea to use only the positive area of the X-axis of a primary conductor 1, the bypass current can also be used by providing a notch hole 8 at an end in the width direction, as shown in a variation in FIG. 34. The notch hole 8 also makes it possible to perform measurement in the same manner as with the case where a through hole 2 is provided as shown in FIG. 28. Note that to supply the bypass current symmetrically about the X-axis, the notch hole 8 needs to be symmetric about the X-axis.

Figure 35:
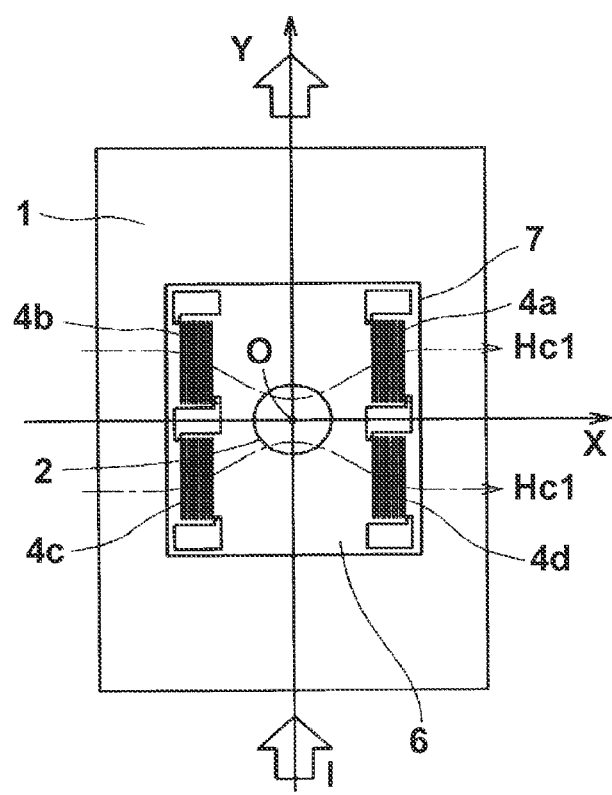
FIG. 35 is a diagram showing the configuration of another variation in which current measurement is performed on a measurement current.

FIG. 35 is a diagram showing the configuration of another variation. In the magnetic detection unit 7 in which four magnetic detection elements 3a to 3d are integrated, detection portions 4a, 4b, 4c, and 4d are disposed in the first, second, third, and fourth quadrants, respectively. When the four elements are operated as a bridge arrangement, the S/N ratio can further be improved. When the detection portions 4a to 4d are disposed on both sides of the through hole 2 so as to be symmetric about the X- and Y-axes in this way, vector components Hy are symmetric about the X- and Y-axes.

Accordingly, differential detection of the outputs of the detection portions 4a and 4d and differential detection of the outputs of the detection portions 4b and 4c for the X-axis and differential detection of the outputs of the detection portions 4a and 4b and differential detection of the outputs of the detection portions 4d and 4c for the Y-axis can simultaneously be performed. Averaging the detection results can further improve the measurement accuracy.

Embodiment 5

Figure 36:
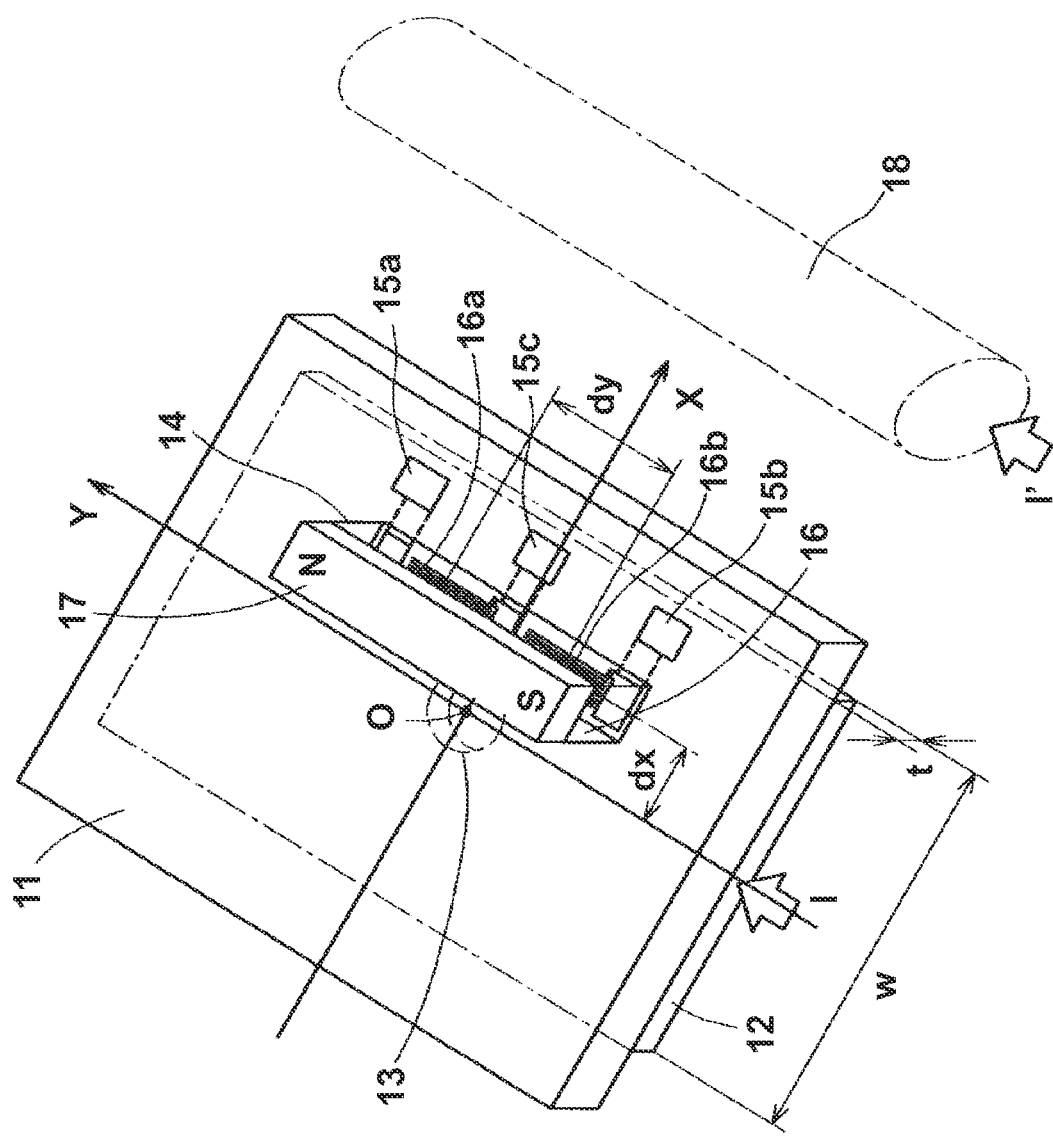
FIG. 36 is a diagram showing the configuration of Embodiment 5 in which current measurement is performed on a measurement current.

FIG. 36 is a diagram showing the configuration of a current sensor according to Embodiment 5. A primary conductor 12 formed from a copper pattern having an X-axis width of 10 mm, a Z-axis thickness of 70 μm, and a length of 50 mm in the longitudinal direction, which is the Y-axis direction, is provided on one side of a sensor board 11 made of a glass epoxy material and having a thickness of 1.6 mm. A through hole 13 having a diameter of 2 mm is formed at the center in the X-axis direction of the primary conductor 12 by etching. An integrated magnetic detection unit 14 is disposed at the same position as in FIG. 33 on the other side of the sensor board 11. Electrodes 15a to 15c for soldering are drawn onto the sensor board 11.

A magnetic impedance element is used as the magnetic detection unit 14. In each of detection portions 16a and 16b formed from a Fe—Ta—C-based thin magnetic film, 11 elongated patterns each having a width of 18 μm, a thickness of 2.65 μm, and a length of 1.2 mm are juxtaposed. The detection portions 16a and 16b have the magnetic field detection direction in the Y-axis direction.

The position of each of the detection portions 16a and 16b is offset from the center of the through hole 13 by a distance dx=1.5 mm in the X-axis direction. The center interval between the detection portions 16a and 16b is dy=3 mm. The detection portions 16a and 16b are disposed so as to be symmetric about the X-axis extending in the width direction from a center O of the through hole 13.

Although not illustrated, the plurality of thin magnetic film patterns of each of the detection portions 16a and 16b are electrically connected in series to form a meandering pattern whose ends are connected to corresponding electrodes, soldered to the electrodes 15a to 15c on the sensor board 11, and connected to a sensor circuit (not shown). Referring to FIG. 36, a high-frequency pulse is applied in the directions from the electrode 15a to the electrode 15c and from the electrode 15b to the electrode 15c that are drawn onto the sensor board 11.

The magnetic detection unit 14 is provided with an axis of easy magnetization in the width direction, which is the X-axis direction. When a high-frequency pulse is applied to the thin magnetic film patterns, the impedance is changed by an external magnetic field. The voltage across the magnetic detection unit 14 is converted into a sensor signal by amplitude detection.

To evaluate the influence of a current other than a measurement current I that flows in parallel, a copper rod 18 having a diameter of 2 mm was disposed parallel to and at an interval of 10 mm from the primary conductor 12. The measurement was performed while supplying a 50-Hz current I' of 10 Arms but supplying no current to the primary conductor 12. In this case, the level of the current I' flowing through the copper rod 18 was equal to or lower than the noise level (equal to or lower than 10 mVpp) so no influence of the current I' was observed by the magnetic detection unit 14. A magnetic field from the adjacent parallel current line has only an X- or Z-axis component and no Y-axis component, and the distances between the adjacent copper rod 18 and the detection portions 16a and 16b are equal. For these reasons, it was confirmed that the differential removal function effectively acted, and the influence of the noise-like magnetic field was almost completely removed.

Figure 37:
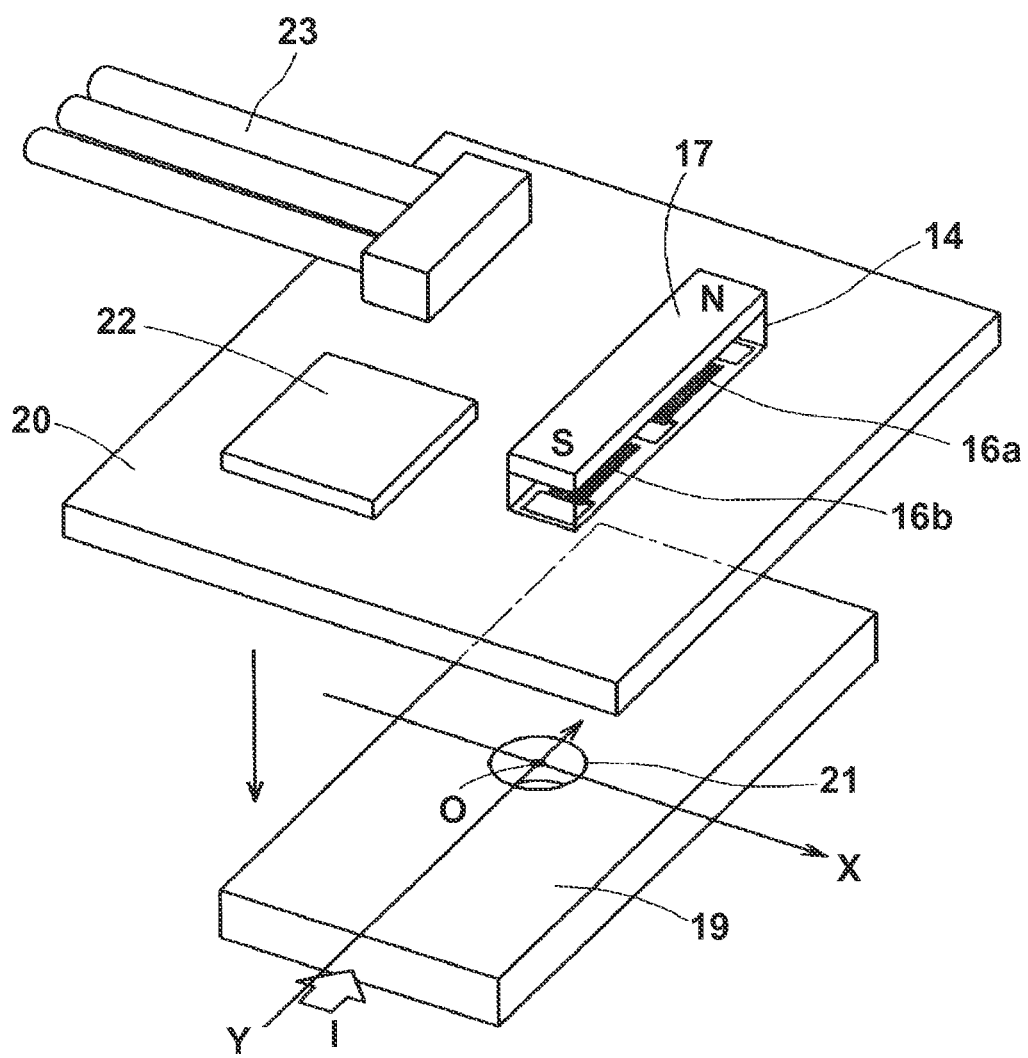
FIG. 37 is a diagram showing the configuration of a variation in which current measurement is performed on a measurement current.

Embodiment 5 assumes an example in which the primary conductor 12 is disposed on the sensor board 11. However, when the primary conductor is a bus bar 19 formed from a copper plate, as indicated by a variation shown in FIG. 37, a structure obtained by removing the primary conductor 12 from the configuration shown in FIG. 36 can be placed as a module on a sensor board 20. In this case, it is possible to use the sensor board 20 that is aligned with a through hole 21 formed in the bus bar 19 and fixed to the bus bar 19 by bonding or the like. Note that reference numeral 22 denotes a circuit element provided on the sensor board 20, reference numeral 23 denotes a signal line that extracts the signal of the magnetic detection unit 14.

With this configuration, even after the bus bar 19 is laid in advance, it is possible to achieve easy assembly by forming the magnetic detection unit 14 as a module and assembling it to the bus bar 19.

Note that in the above-described embodiments, a non-conductive area is provided using a through hole or a notch hole to cause the current to bypass. However, the current can also be caused to bypass by disposing not a hole portion but an insulating material. The non-conductive area needs to be symmetric about the X-axis.

Embodiment 6

In Embodiments 1 to 5, a non-conductive area is employed as a direction change area. That is, each of Embodiments 1 to 5 is an invention for detecting a distorted magnetic field generated as a current bypasses the non-conductive area and estimating the current amount from the detected magnetic field. A concept common to Embodiments 1 to 5 is to provide the primary conductor with an area to facilitate a nonlinear current flow. That is, the non-conductive area need not always be used if the current flowing direction can be bent. Accordingly, another example of the direction change area will be described in Embodiment 6.

Figure 38:
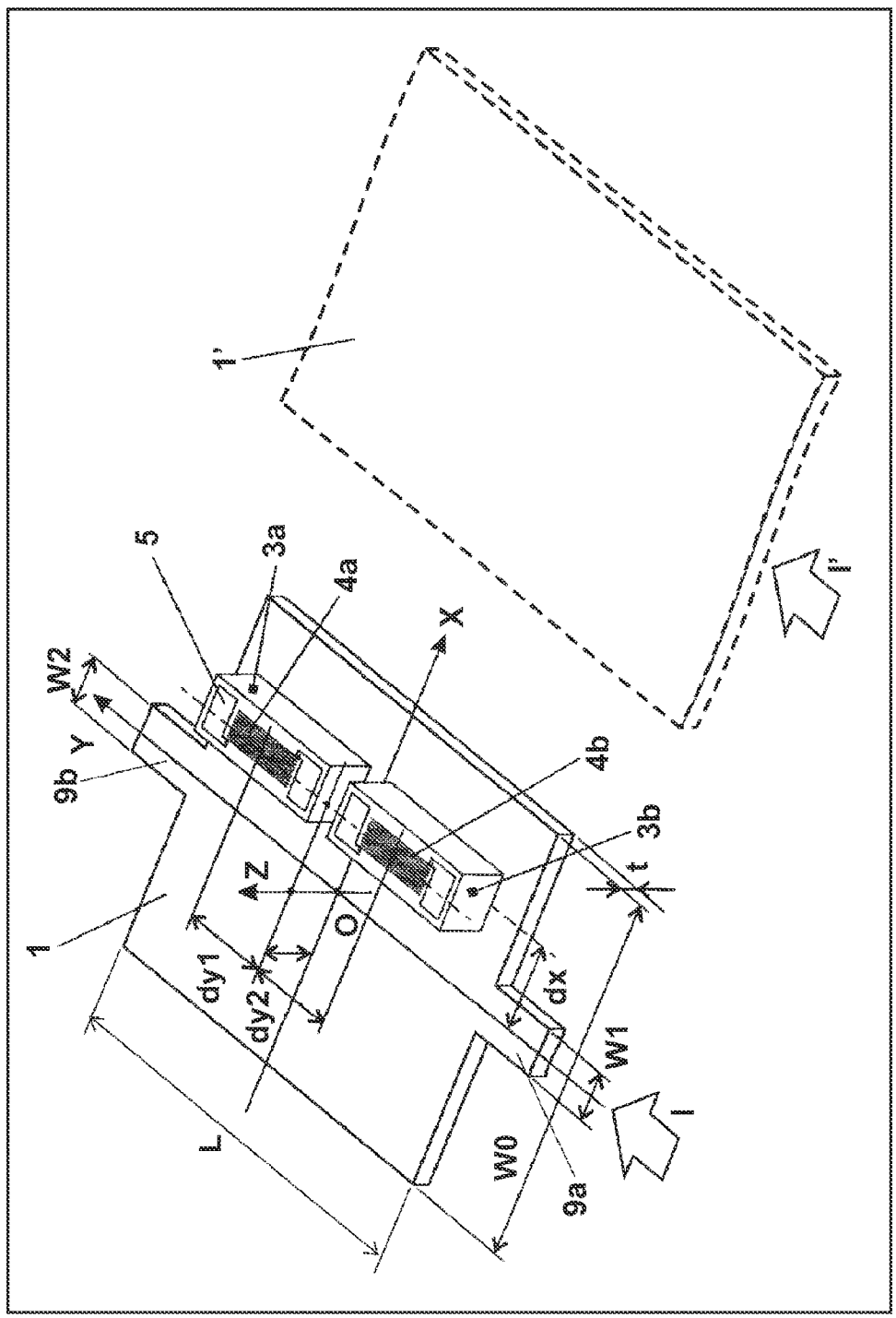
FIG. 38 is a perspective view showing a basic configuration of a current sensor according to Embodiment 6.

FIG. 38 is a diagram showing the configuration of a basic current sensor according to Embodiment 6 in which current measurement is performed on a measurement current. A measurement current I to be detected flows through a primary conductor 1. The primary conductor 1 has a form of, for example, a copper foil pattern on a printed board or a bus bar formed from a copper plate.

Out of the primary conductor 1, a portion (main portion) where a magnetic field is to be detected is a rectangular portion having a length L and a width W0. In the main portion, an inlet 9a and an outlet 9b, which have widths W1 and W2, respectively, are formed on the front and rear sides in the current flowing direction, respectively. Both the widths W1 and W2 are smaller than the width W0. To facilitate the understanding of the description, the inlet 9a and the outlet 9b are disposed at the center of the width W0.

Figure 39:
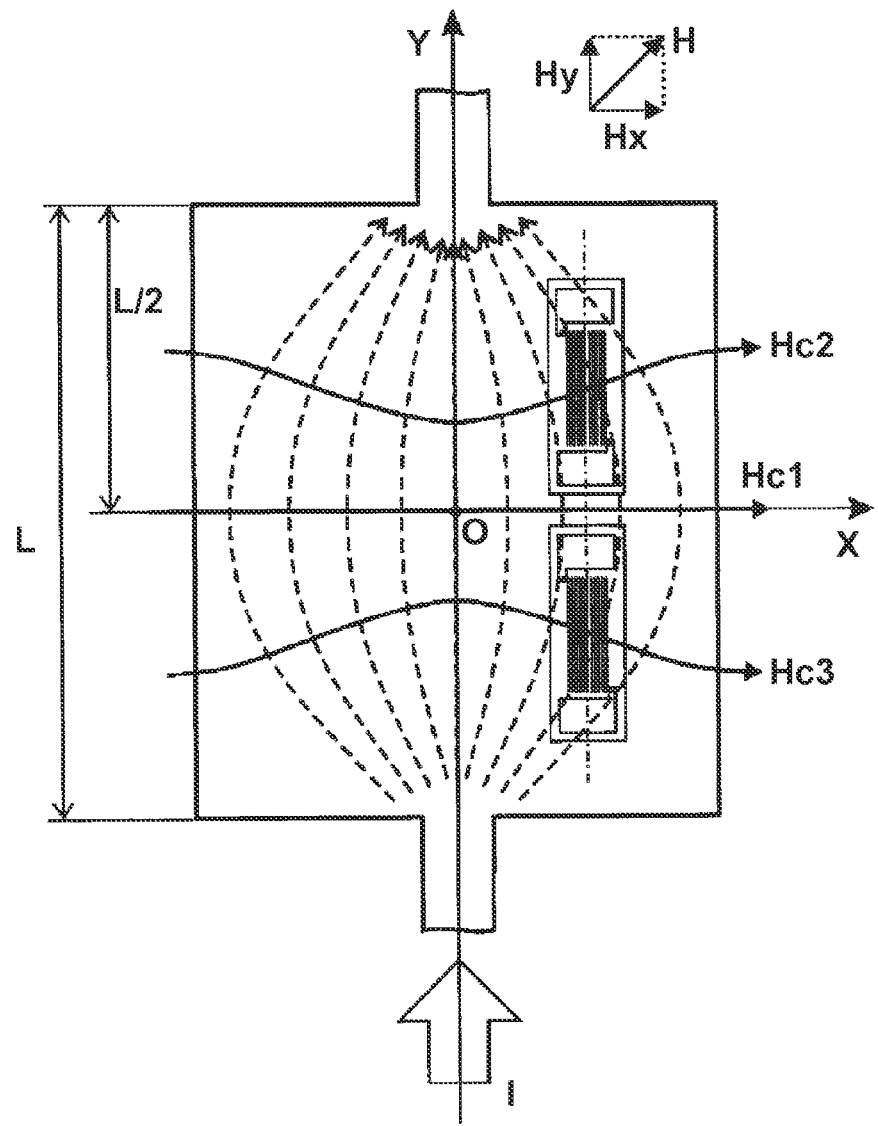
FIG. 39 is a diagram illustrating a state of the current and the magnetic field in a primary conductor.

Coordinate axes are set for the primary conductor 1. In this case, an origin O is set at the center of the magnetic detection unit. As shown in FIGS. 38 and 39, the origin O is set at the intersection between a line that connects the inlet 9a and the outlet 9b and divides the width W0 of the magnetic detection unit into two parts and a line that divides a length L of the magnetic detection unit into two parts. As in the other embodiments, the main direction in which the measurement current I flows is defined as the Y-axis, the width direction, which is orthogonal to the Y-axis, is defined as the X-axis, and the direction of thickness is defined as the Z-axis.

Two magnetic detection elements 3a and 3b are disposed on the primary conductor 1 in series in the Y-axis direction to perform differential detection. Note that one magnetic detection element may be used, as in Embodiments 1 and 2. Each of the magnetic detection elements 3a and 3b has the same configuration as in Embodiments 1 to 5. The magnetic field detection direction of detection portions 4a and 4b of the magnetic detection elements 3a and 3b is set in the Y-axis direction, thereby disposing the magnetic detection elements 3a and 3b. The center of each of the detection portions 4a and 4b is set at a position shifted from the center of the origin O by a distance dx in the X-axis direction and distances dy1 and dy2 in the Y-axis direction, with the X-axis interposed in between.

A magnetic flux generated by a current is inherently oriented in a direction orthogonal to the current direction. For this reason, a magnetic field HC1 having only a vector component Hx in the X-axis direction is formed at a portion where no current component directed in the width direction of the primary conductor 1 exists, or in other words, on the X-axis passing through the origin O.

However, a current at a position shifted forward or backward in the current flowing direction from the origin O has a current component that flows toward the inlet 9a or the outlet 9b at an angle with respect to the Y-axis direction. A vector component Hy in the Y-axis direction is thus generated, and the magnetic field meanders like Hc2 or Hc3. The magnetic fields Hc2 and Hc3 are line-symmetric about the X-axis. The vector components Hy have opposite polarities on both sides of the X-axis.

As shown in FIG. 38, even when a primary conductor 1' to which a current in a different phase flows is in the neighborhood of the primary conductor 1, and the direction of a neighboring current I' is parallel to that of the measurement current I, the magnetic field generated by the neighboring current I' has only a vector component in the X-axis direction and no component in the Y-axis direction. When the magnetic field detection direction of the detection portions 4a and 4b is the Y-axis direction, the magnetic detection elements 3a and 3b can detect only the vector component Hy of the measurement current I without any interference with the magnetic field by the neighboring current I'. It is therefore possible to obtain the amount of the measurement current I by calibrating and converting the vector component Hy.

When the magnetic detection elements 3a and 3b detect the magnetic field vector component Hx in the X-axis direction, the current estimation accuracy lowers. Therefore, for example, a magnetic impedance element or orthogonal fluxgate element having high directivity is used as the magnetic detection elements 3a and 3b. In Embodiment 6, a magnetic impedance element is used as the magnetic detection elements 3a and 3b. In each of the detection portions 4a and 4b, thin magnetic film patterns are juxtaposed to form a meandering pattern in the Y-axis direction, which is the magnetic field detection direction. A high-frequency pulse in the MHz band is applied to electrodes 5 provided at the two ends of the detection portions 4a and 4b. A change in the voltage amplitude from the two ends of the detection portions 4a and 4b caused by a change in the magnetic field is obtained as a sensor signal. If a bias magnetic field is necessary, it is applied by a magnet located close to or a coil wound on the magnetic detection elements 3a and 3b, although not illustrated.

Figure 40:
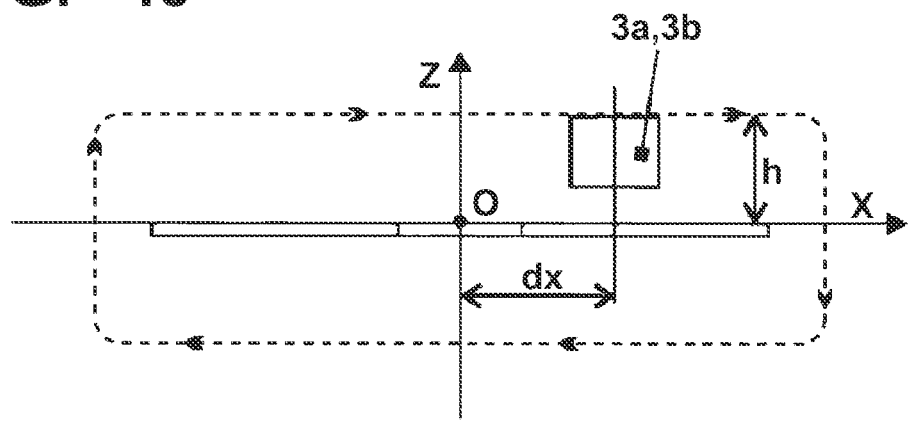
FIG. 40 is a cross-sectional view showing the relationship between the primary conductor and a magnetic detection element.
Figure 41:
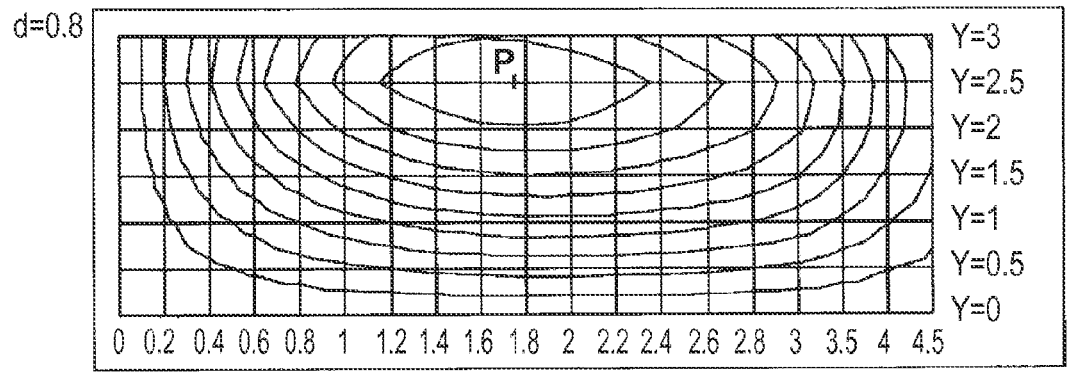
FIG. 41 is a distribution contour map of a Y-axis direction magnetic field component when the width of a current inlet/outlet is changed.
Figure 42:
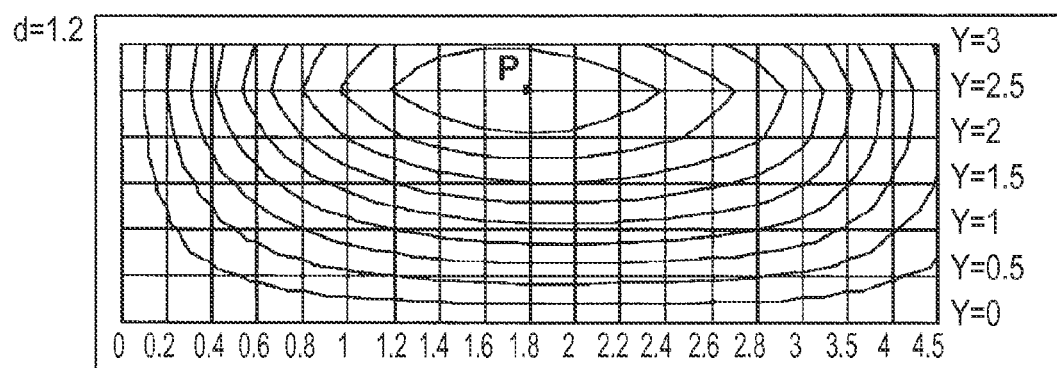
FIG. 42 is a distribution contour map of a Y-axis direction magnetic field component when the width of the current inlet/outlet is changed.
Figure 43:
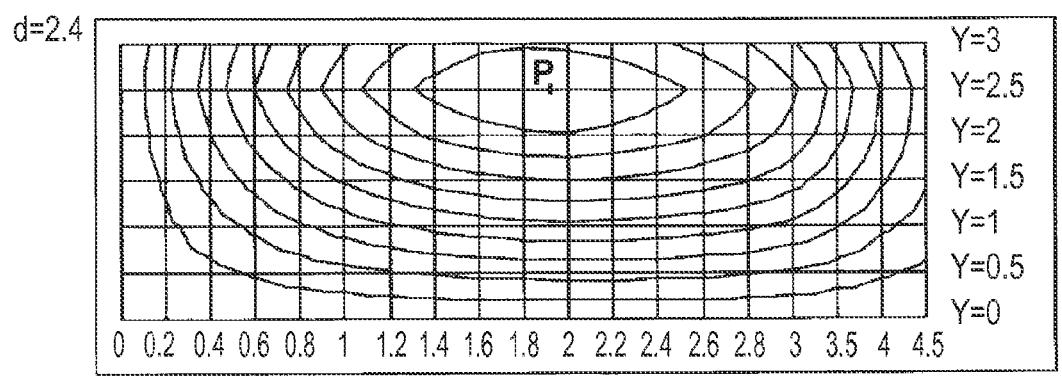
FIG. 43 is a distribution contour map of a Y-axis direction magnetic field component when the width of the current inlet/outlet is changed.
Figure 44:
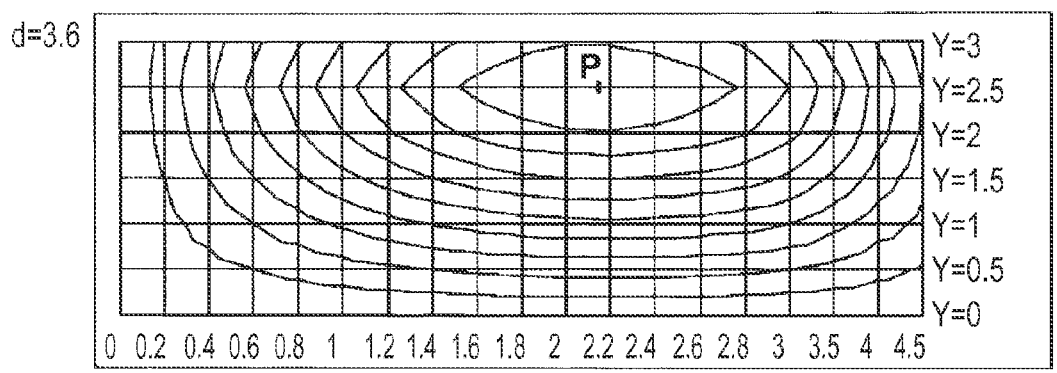
FIG. 44 is a distribution contour map of a Y-axis direction magnetic field component when the width of the current inlet/outlet is changed.

As shown in FIG. 40, a height h of the detection portions 4a and 4b of the magnetic detection elements 3a and 3b relative to the primary conductor 1 is determined in relation to, for example, the dielectric breakdown voltage based on the space, the spatial distance, the creeping distance, and the like structurally necessary for adjusting the magnitude of a magnetic field to be generated and maintaining the positional relationship between the primary conductor 1 and the magnetic detection elements 3a and 3b.

The circuit configuration shown in FIG. 31 can be employed as the configuration of a detection circuit 100A that functions as a current detection device. This is because even if the detailed configuration of the area to change the current flowing direction, or in other words, the direction change area changes, the basic portion of the current detection device according to the present invention can be used as is.

FIGS. 41, 42, 43, 44, and 45 show the results of simulations of the Y-axis magnetic field component Hy associated with the diffusion current from the narrow inlet and outlet. The primary conductor 1 has a cross section with an X-axis width W0=8 mm and a Z-axis thickness t=0.8 mm. The interval L between the inlet 9a and the outlet 9b is 7.5 mm. The inlet and outlet are located at the center of the width W0 in the width direction. Setting the widths of the inlet 9a and the outlet 9b to W1=W2=d, the magnetic field Hy in the main direction in which the current flowed on the surface (height H=1.6 mm) of the primary conductor was calculated while changing d to 0.8, 1.2, 2.4, and 3.6 mm. The measurement current I was set to 1 ampere (A).

FIGS. 41 to 44 show the result of simulations when d=0.8, 1.2, 2.4, and 3.6 mm, respectively. In the first quadrant where the coordinates X≥0 and Y≥0, the apex of the vector component Hy is set to 100%, and the contours are plotted in 10% increments. In each of the remaining quadrants, a magnetic field distribution symmetric about the X- or Y-axis is formed. In the third quadrant, a magnetic field having the same polarity as in the first quadrant is formed. In each of the second and fourth quadrants, a magnetic field having a polarity opposite to that in the first quadrant is formed.

A peak position P is almost unchanged at 2.5 mm in the Y direction and gradually moves from 1.7 mm to 2.15 mm in the X direction as the width of the inlet/outlet increases.

It is assumed that the distance from the inlet/outlet is L. The peak position P is at L=7.5 mm and 1.25 (=L/2−2.5) mm. The peak position calculated for L=11.5 mm is 1.35 mm, and the difference is not so large. The practical distance L is determined considering that the peak can clearly be formed, and no interference with the adjacent peak in an opposite phase occurs. For example, the distance L should be equal to or greater than 1.25 mm*4=5 mm.

Figure 45:
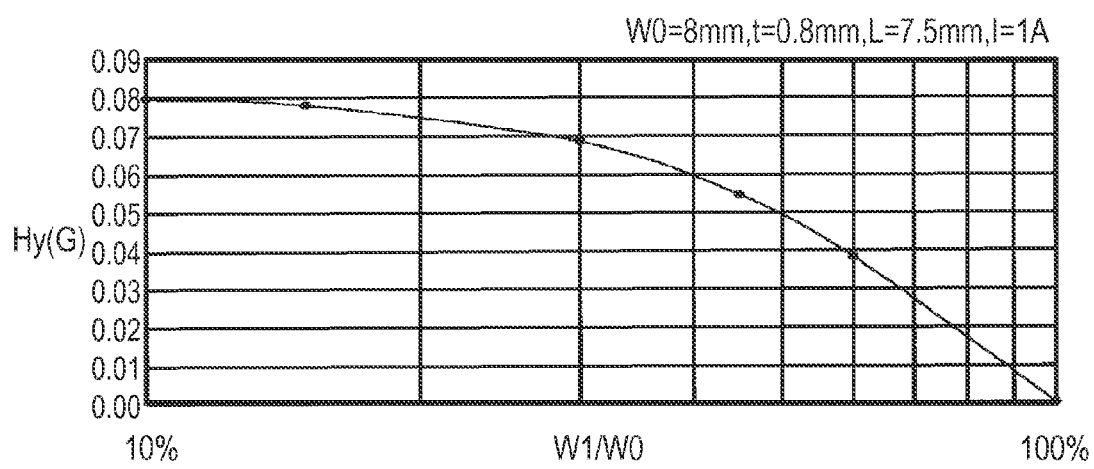
FIG. 45 is a diagram showing the relationship between the width of the current inlet/outlet and the peak value of the Y-axis direction magnetic field component.

FIG. 45 is a graph showing the magnetic field Hy at the peak position. As can be seen from FIG. 45, when the ratio of the width W1 of the inlet 9a and the outlet 9b to the width W0 is 10% (W0=8 mm, and d=0.8 mm), a magnetic field of 0.08 gauss per 1 A is generated. A magnetic detection element capable of detecting a magnetic field on the order of milligauss or less can detect even a small measurement current of 1 A or less at a sufficient S/N ratio when it is placed at the peak position.

As the widths W1 and W2 of the inlet 9a and the outlet 9b are increased, current components spreading in the width direction decrease, as a result of which the magnetic field Hy abruptly lowers. Thus, to detect a large current, the widths W1 and W2 may be increased. When the ratio of the width W1 to the width W0 is 100%, or in other words, d=8 mm, the magnetic field becomes zero. This means that the adjustment range for a large current can be widened. As is apparent from the above description, fixing the magnetic detection element at a position corresponding to X=2 mm and Y=2.5 mm makes it possible to cope with various current detection range specifications only by changing the widths W1 and W2.

Such characteristics are very convenient for an element such as a magnetic impedance element or orthogonal fluxgate sensor whose detection magnetic field range needs to be managed within a certain range from the viewpoint of magnetic saturation or linearity. From the viewpoint of productivity as well, when several types of devices are prepared by changing the width of the inlet/outlet of the primary conductor while fixing the position of the element, it is possible to cope with various kinds of current specifications and greatly contribute to cost reduction of the current sensor.

Figure 46:
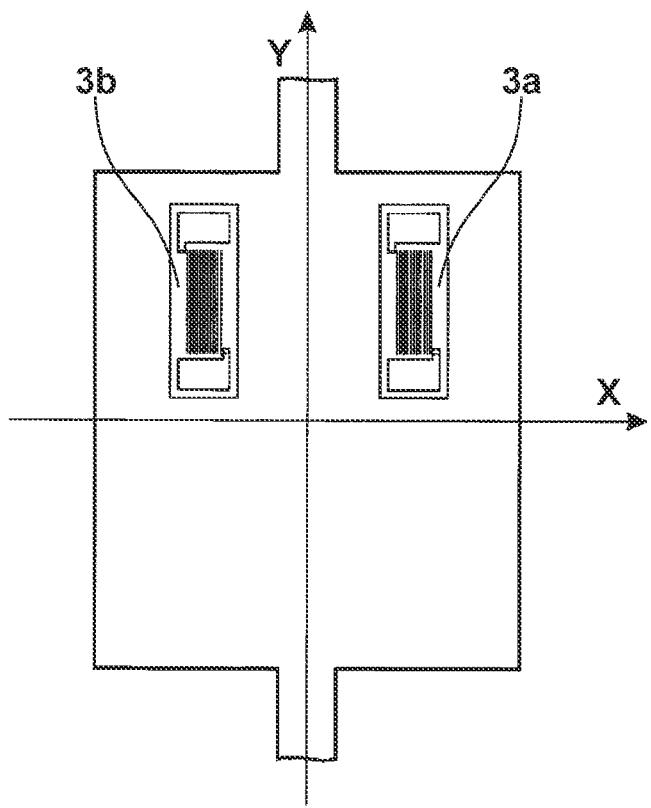
FIG. 46 is a diagram showing the configuration of a variation in which current measurement is performed on a measurement current.
Figure 47:
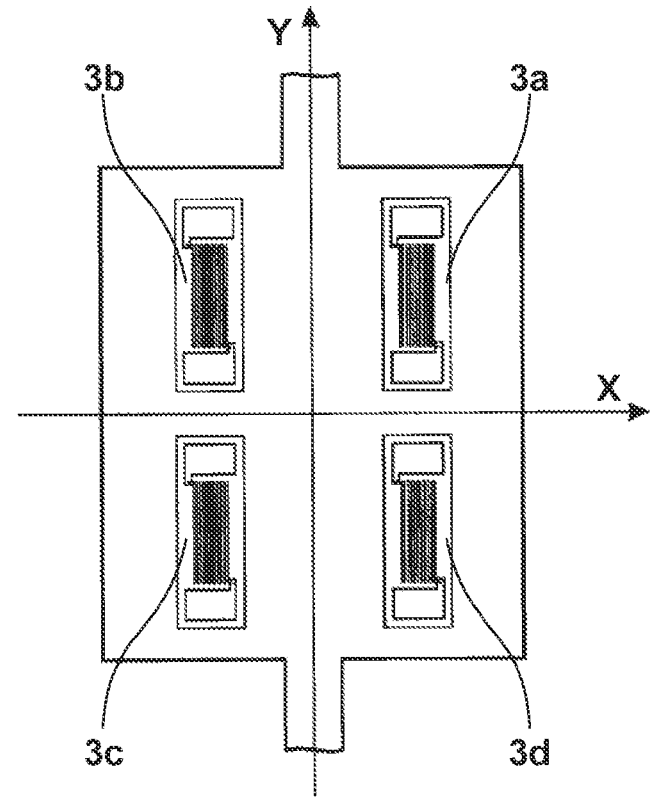
FIG. 47 is a diagram showing the configuration of a variation in which current measurement is performed on a measurement current.

Referring to FIG. 38, the magnetic detection elements 3a and 3b are provided in the first and fourth quadrants on the X-Y plane, respectively. However, they may, of course, be arranged adjacently in other quadrants because of the symmetry. FIG. 46 shows an example in which the magnetic detection element 3a is provided in the first quadrant, and the magnetic detection element 3b is disposed in the second quadrant. FIG. 47 shows an example in which magnetic detection elements are provided in all quadrants.

Referring to FIG. 47, in a magnetic detection element unit in which four magnetic detection elements 3a to 3d are integrated, detection portions 4a, 4b, 4c, and 4d are disposed in the first, second, third, and fourth quadrants, respectively. When the detection portions 4a, 4b, 4c, and 4d are operated as a bridge arrangement as shown in FIG. 31, the S/N ratio of the detection circuit 100A can be improved. When the detection portions 4a to 4d are arranged on both sides of the origin O to be symmetric about the X- and Y-axes, the vector components Hy are symmetric about the X- and Y-axes.

Accordingly, differential detection of the outputs of the detection portions 4a and 4d and differential detection of the outputs of the detection portions 4b and 4c for the X-axis and differential detection of the outputs of the detection portions 4a and 4b and differential detection of the outputs of the detection portions 4d and 4c for the Y-axis can simultaneously be performed. Averaging the detection results enables further improvement of the measurement accuracy.

When the inlet 9a and the outlet 9b are located at the center in the width direction of the primary conductor 1, elements adjusted to have the same sensitivity are installed to be symmetric about the X- or Y-axis and differentially operated. The output by the magnetic field from the primary conductor 1 is thus doubled, and the external magnetic field in phase is canceled.

Figure 48:
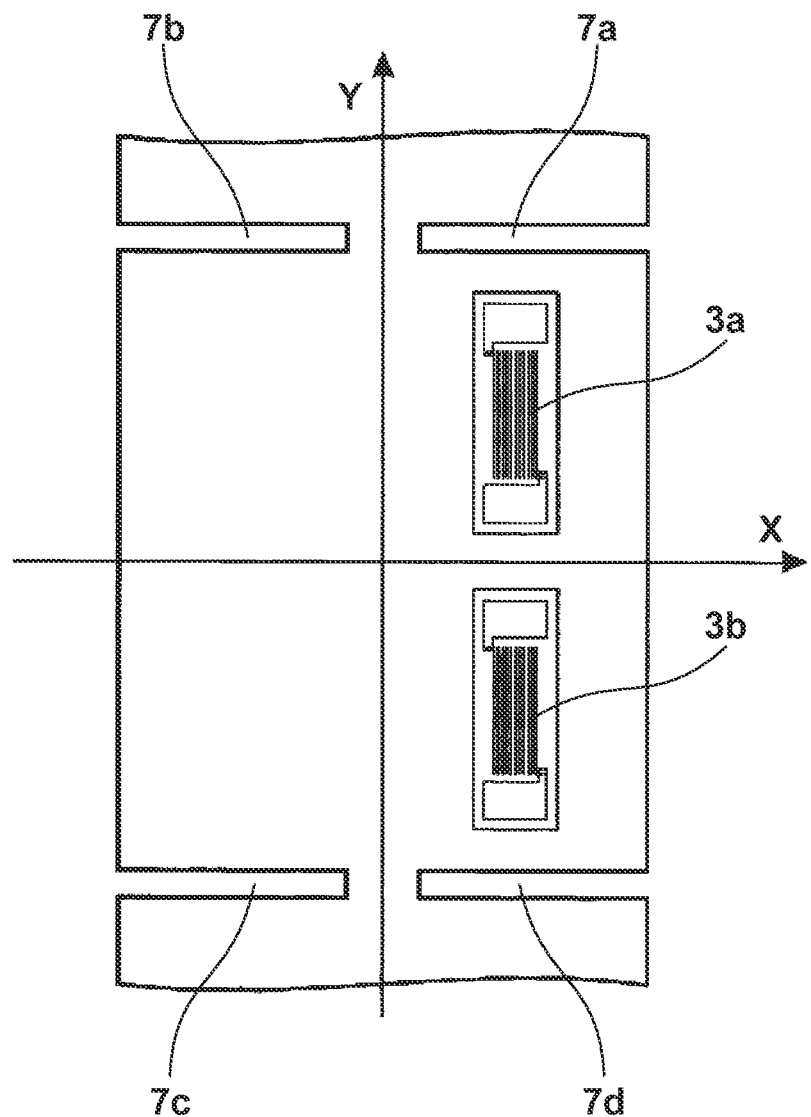
FIG. 48 is a diagram showing the configuration of a variation in which current measurement is performed on a measurement current.

FIG. 48 shows a variation. If the conductor up to the inlet 9a or the conductor from the outlet 9b is too narrow, a problem of heat generation may arise at the time of application of a large current. To prevent this, the current inlet and outlet are regulated by slit grooves 7a, 7b, 7c, and 7d as shown in FIG. 48, thereby suppressing heat generation itself and improving thermal diffusion. Note that as can be understood from FIG. 48, when the slit grooves 7a, 7b, 7c, and 7d are formed in the primary conductor 1, the above-described main portion, inlet 9a, and outlet 9b are formed.

Embodiment 7

In Embodiment 6, when the detection portions 4a and 4b of the magnetic detection elements 3a and 3b are placed near the coordinate positions (2, 2.5) and (2, −2.5), only changing the widths W1 and W2 of the inlet 9a and the outlet 9b makes it possible to cope with the specifications of the measurement current. As another method, the arrangement positions of an inlet 9a and an outlet 9b may be offset in the width direction of a primary conductor 1. FIG. 49 shows the layout. The inlet 9a and the outlet 9b are shifted by dw in the width direction from the layout shown in FIG. 39. Since the spread of a current changes accordingly, the direction of a magnetic field at the arrangement positions of detection portions 4a and 4b of magnetic detection elements 3a and 3b can be changed.

Figure 50:
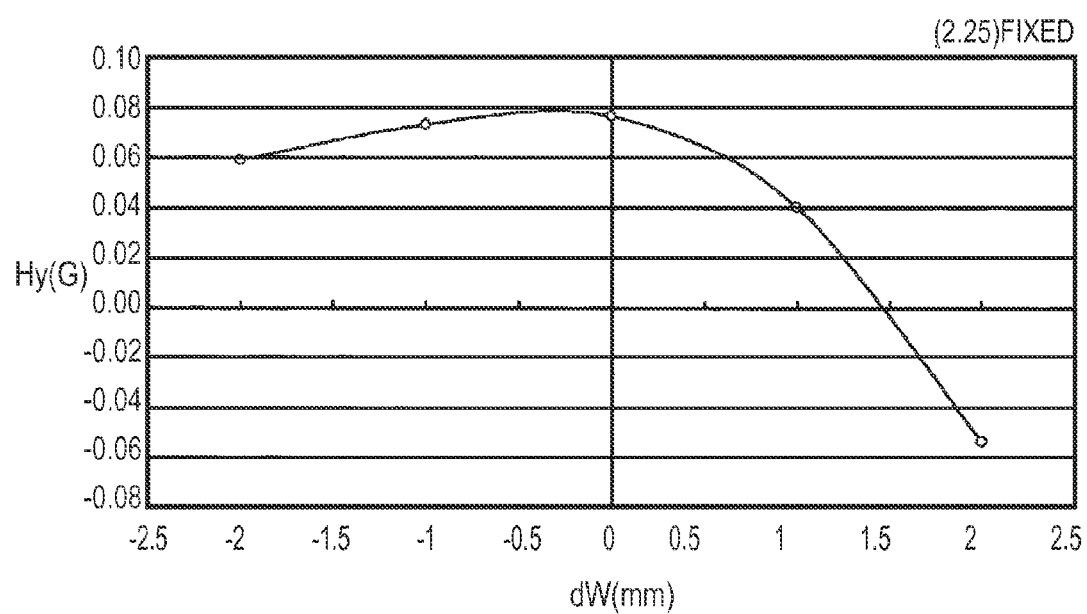
FIG. 50 is a diagram showing the relationship between the position of a current inlet/outlet and a Y-axis direction magnetic field component (fixed point).

FIG. 50 shows the result of a simulation of a Y-axis magnetic field component Hy according to Embodiment 7.

The primary conductor 1 has an X-axis width W0=8 mm and a Z-axis thickness t=0.8 mm. Both widths W1 and W2 of the inlet 9a and the outlet 9b are 1.2 mm. A Y-axis length L of the primary conductor 1 serving as a magnetic detection unit is 7.5 mm. When the inlet 9a and the outlet 9b are located at the center of the width W0 as in Embodiment 6, the offset amount dw=0. In Embodiment 7, simulations were conducted for the offset amount dw=−2, −1, 0, 1, and 2 mm.

The coordinate positions of the magnetic detection element 3a is fixed to X=2 mm and Y=2.5 mm. The adjustment margin of the magnetic field of the magnetic field component Hy in the direction in which the current mainly flows is small when the offset amount has a negative value as shown in FIG. 50. On the other hand, when the offset amount has a positive value, or in other words, when the distance between the inlet 9a or outlet 9b and the magnetic detection element shortens, the magnetic field abruptly lowers and reaches the opposite polarity. Accordingly, the magnetic field component Hy can be adjusted to a large extent in an area where the offset amount has a positive value.

Embodiment 8

Figure 51:
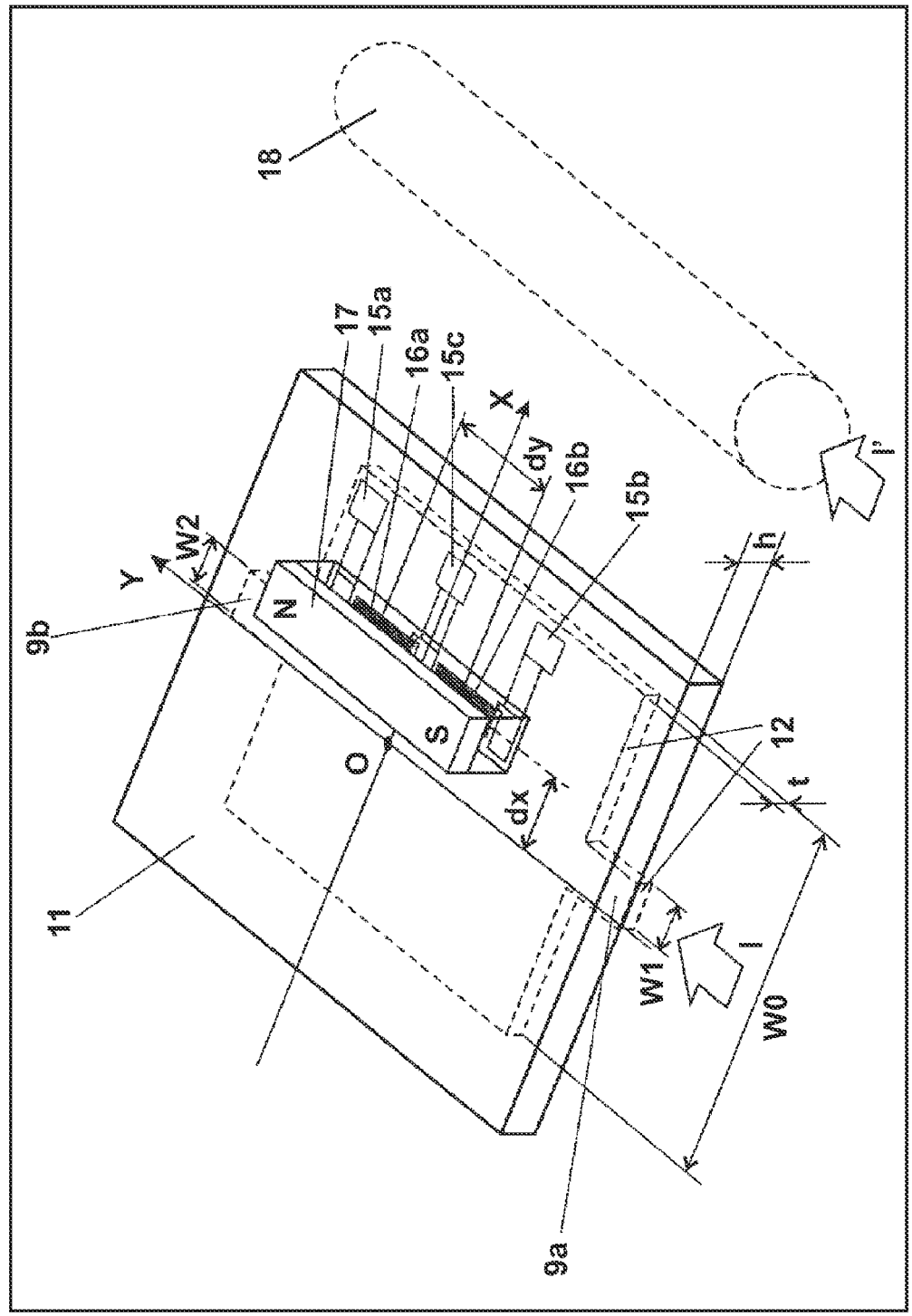
FIG. 51 is a diagram showing the configuration of Embodiment 8 in which current measurement is performed on a measurement current.

FIG. 51 is a diagram showing the configuration of a current sensor according to Embodiment 8. A sensor board 11 is made of a glass epoxy material and has a thickness of 1.6 mm. A primary conductor 12 is provided on one side of the sensor board 11. The primary conductor 12 is formed from a copper pattern having an X-axis width of 8 mm, a Y-axis length of 7.5 mm, and a Z-axis thickness of 70 µm. An origin O of the X- and Y-axes is set at the center of the primary conductor 12.

An inlet 9a and an outlet 9b of the primary conductor 12 are extended along the Y-axis from the center of a width W in the X-axis direction while having a width W1=W2=1.2 mm. If the inlet 9a and the outlet 9b are extended long while keeping the width of 1.2 mm, heat generation may occur on a large current side. In an experiment, a cable having a core diameter of 1.6 mm was soldered immediately near the inlet 9a and the outlet 9b, and a measurement current was applied.

A magnetic detection unit 14 in which two magnetic detection elements are integrated is disposed on the other side of the sensor board 11. Electrodes 15a to 15c for soldering are drawn from the magnetic detection unit 14 onto the sensor board 11.

A magnetic impedance element is used as the magnetic detection unit 14. Each of detection portions 16a and 16b formed from a Fe—Ta—C-based thin magnetic film includes 11 elongated and juxtaposed patterns each having a width of 18 µm, a thickness of 2.65 µm, and a length of 1.2 mm. The detection portions 16a and 16b have the magnetic field detection direction in the Y-axis direction.

As shown in FIG. 51, the position of each of the detection portions 16a and 16b is offset from the center of a through hole 13 by a distance dx=2 mm in the X-axis direction. A center interval dy between the detection portions 16a and 16b is 5 mm. Thus, the magnetic detection unit 14 is disposed so as to be symmetric about the X-axis.

Although not illustrated, the plurality of thin magnetic film patterns of each of the detection portions 16a and 16b are electrically connected in series to form a meandering pattern. The ends of the thin magnetic film patterns connected in series are connected to corresponding electrodes. As shown in FIG. 51, the ends of the thin magnetic film patterns are soldered to the electrodes 15a to 15c on the sensor board 11, and connected to a detection circuit 100A. Referring to FIG. 51, a high-frequency pulse is applied to a pair of electrodes 15a and 15c and a pair of electrodes 15b and 15c drawn onto the sensor board 11.

The magnetic detection unit 14 is provided with an axis of easy magnetization in the X-axis direction (width direction). When a high-frequency pulse is applied to the thin magnetic film patterns, the impedance is changed by an external magnetic field. The voltage across the magnetic detection unit 14 is converted into a sensor signal by amplitude detection. The differential detection effect can be enhanced by adjusting the bias magnetic field or circuit gain of each element such that no relative difference is generated.

To evaluate the influence of a current other than a measurement current I that flows in parallel, a copper rod 18 having a diameter of 2 mm was disposed parallel to and at an interval of 10 mm from an end of the primary conductor 12. The measurement was performed while supplying a 50-Hz current I' of 10 Arms to the copper rod 18 but supplying no current to the primary conductor 12. The level of the current I' flowing through the copper rod 18 was equal to or lower than the noise level (equal to or lower than 10 mVpp) in the magnetic detection unit 14. A magnetic field from the adjacent parallel current line has only an X- or Z-axis component and no Y-axis component, and the distances between the adjacent copper rod 18 and the detection portions 16a and 16b are equal. For these reasons, it was confirmed that the differential removal function effectively acted, and the influence of the noise-like magnetic field was almost completely removed.

Figure 52:
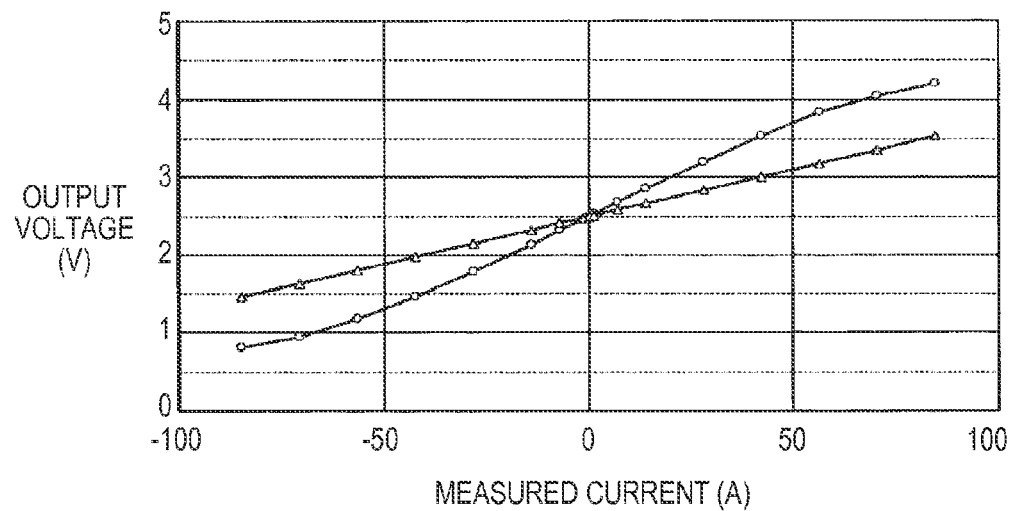
FIG. 52 is a graph showing the relationship between a measured current and an output when the inlet/outlet width is changed.

FIG. 52 shows the relationship between a measured current and an output voltage when the width W1 (=W2) of the inlet 9a and the outlet 9b of the primary conductor 1 is changed to 1.2 mm and 4.8 mm. Note that since the detection circuit 100A is driven by a single power supply of 5 V, the output voltage to a measured current of 0 A is adjusted to 2.5 V.

As shown in FIG. 45, a magnetic field Hy in the Y direction applied to the element is 0.078 gauss per 1 A. In the above-described sensor whose linearity is ensured in the range of ±3 gauss, the linearity degrades beyond ±38.5 A. Even in the actual measured data shown in FIG. 52, beyond about 40 A the linear accuracy decreases as can be seen. Under this condition, the current is ±40 A in the specifications.

To widen the range with excellent linearity, the widths of the inlet 9a and the outlet 9b may be increased. When the inlet 9a and the outlet 9b have widths W1 and W2 of 4.8 mm, a magnetic field Hy of 0.038 gauss per 1 A is generated, indicating that linear accuracy can be ensured up to ±79 A. The actual measured data also demonstrates that linear accuracy is ensured at ±80 A. The sensitivity difference may be adjusted by the gain of differential amplification.

This means that changing only the width of the current inlet/outlet while using the same magnetic detection element and circuit configuration makes it possible to ensure the linear accuracy within a desired measured current range.

Thus, the current detection circuits described in Embodiments 1 to 8 can achieve a considerable size reduction, as compared with a current transformer or the like.

The magnetic field from the current path may be relatively too large if the sensitivity of the magnetic detection element 110 is too high. In this case, a sufficiently long distance may be provided between the magnetic detection element 110 and the current path. However, providing a sufficiently long distance between the magnetic detection element 110 and the current path results in an increase in the size of the measurement module 100. By using the method of causing the current path to bypass in the width direction (direction orthogonal to the length direction) described in Embodiments 1 to 8, the distance between the magnetic detection element 110 and the current path does not need to be increased. Thus, it is possible to reduce the size of the measurement module 100.

Figure 53:
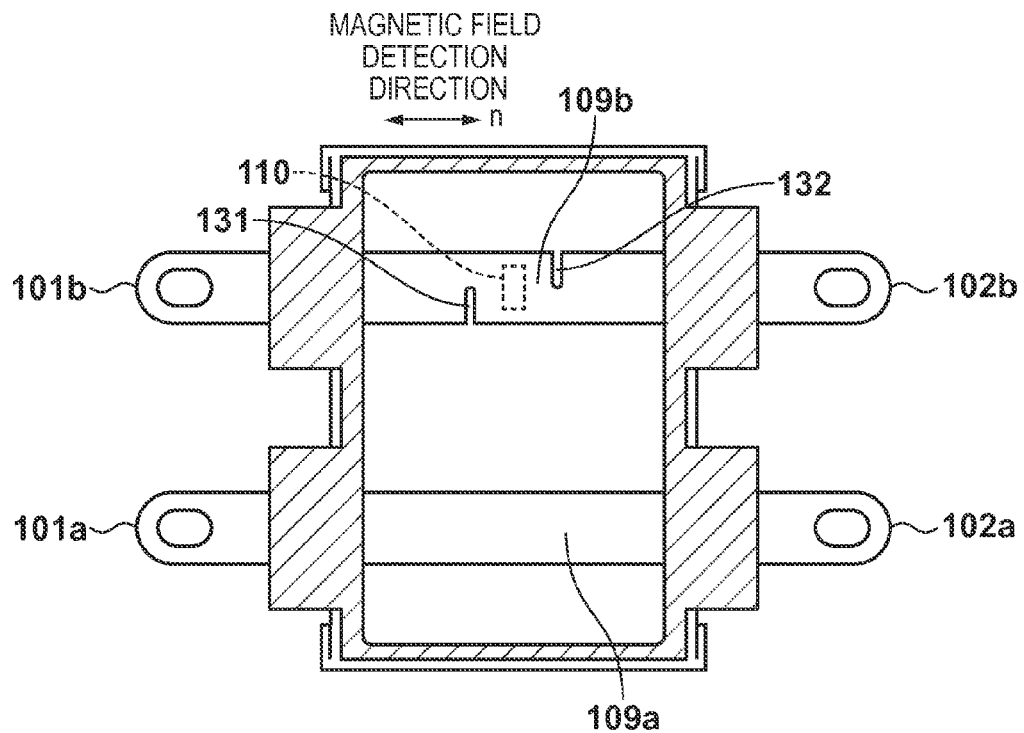
FIG. 53 is a diagram showing an example in which a current path is provided with a non-energized area.

As an example, notches 131 and 132 that function as a non-energized area are provided in the current path 109b as shown in FIG. 53. This allows the direction of the magnetic field generated from the current path 109b to be changed to a direction that is angled 90° from the magnetic field detection direction m shown in FIG. 3. Note that 90° is merely an example, and thus the difference in angle may be 60° or 45°. This is because it is sufficient that the relationship between the magnitude of the magnetic field generated by the current path and the sensitivity of the magnetic detection element 110 is sufficiently adjusted. Note that the magnetic detection element 110 is disposed such that the magnetic field detection direction n of the magnetic detection element 110 extends along the magnetic field direction.

Thus, the current bypass amount may be adjusted by the size and arrangement of the non-energized area such as notches if the magnetic field generated by the current path is too large relative to the sensitivity of the magnetic detection element 110. This eliminates the need for the space for increasing the distance between the magnetic detection element 110 and the current path, thus making it possible to reduce the size of the measurement module 100.

Embodiment E

Embodiment E relates to a terminal block that is a variation of Embodiment A. The terminal block basically has the same structure as that of Embodiment A except that it is configured such that both the input terminal and the output terminal can be screwed.

Figure 55:
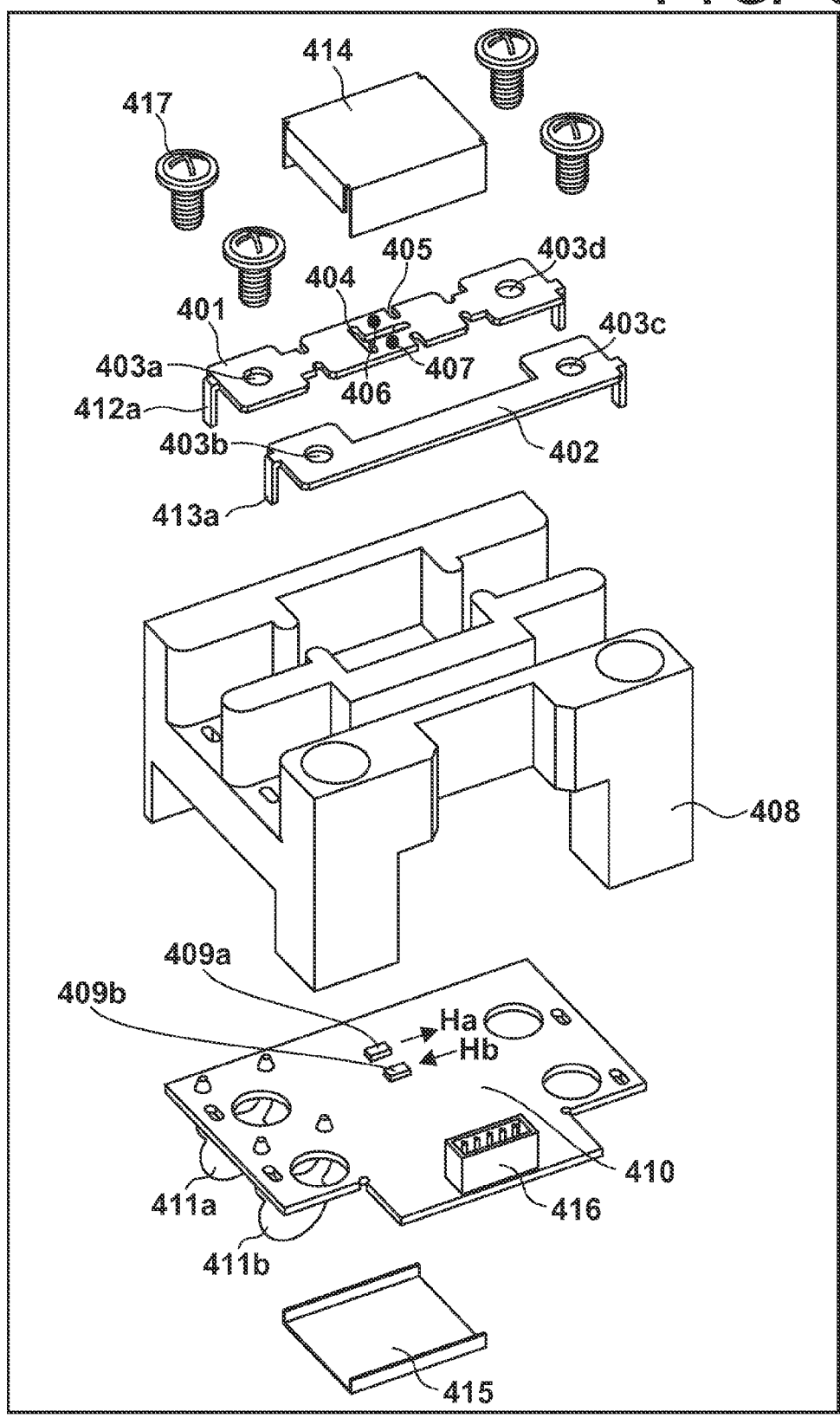
FIG. 55 is an exploded perspective view of the terminal block.

FIG. 54A is an external perspective view of the terminal block. FIG. 54B is a cross-sectional view of the terminal block taken along the line A-B. FIG. 55 is an exploded perspective view of the terminal block. Screwing portions 403a and 403d are provided at both ends of a current path 401. Screwing portions 403b and 403c are provided at both ends of a current path 402. A cable connected to a power supply is screwed to the screwing portions 403a and 403b with screws 417. A cable connecting to the load side is screwed to the screwing portions 403c and 403d with screws 417.

Measures for detecting the magnetic field with magnetic detection elements are taken for the current path 401. More specifically, the current path 401 is provided with a T-shaped notch 404 and linear notches 405. Accordingly, the current bypasses in the width direction of the current path 401, and therefore, magnetic fields of opposite directions (magnetic fields following the current flowing directions) are generated near points 406 and 407.

The current paths 401 and 402 are fixed, for example, with an adhesive or screws to a body 408 of the terminal block formed of a mold member or the like. A circuit board 410 is installed on the side of the body 408 that is opposite to the side on which the current paths 401 and 402 are installed. Magnetic detection elements 409a and 409b are surface-mounted to the circuit board 410.

As shown in FIG. 54B, the body 408 is provided with a partition 418 on which the current paths 401 and 402 are installed. The partition 418 provides distinct insulation between the primary side of the current paths 401 and 402 through which a large current flows and the circuit board 410 that is operated by a DC power supply.

The magnetic detection elements 409a and 409b are disposed at positions opposing the points 406 and 407 with the partition 418 interposed therebetween. As shown in FIG. 55, the directions of magnetic fields Ha and Hb where two currents flowing in different directions are generated are opposite to each other. Accordingly, the S/N ratio can be increased by a differential detection operation.

Terminals 412a and 413a extending from end faces of the current paths 401 and 402 are extended to the circuit board 410. The terminals 412a and 413a are connected to voltage detection capacitors 411a and 411b, respectively. Voltage detection is performed by capacitive voltage division by the capacitor 411a and the capacitor 411b.

As shown in FIG. 55, the terminals 412a and 413a are extended from the current paths 401 and 402 on the primary side to the circuit board 410 on the secondary side. However, the positions of the terminals 412a and 413a are located at an end of the circuit board 410, where the space and the creeping distance can be easily secured. Thus, there is no problem in achieving insulation.

Although a microcomputer that calculates power is not shown on the circuit board 410, the microcomputer installed on the circuit board 410 outputs the result of power calculation from a connector 416. A power supply provided outside of the body 408 supplies operating power to the circuit board 410 through the connector 416.

A magnetic shield may be provided as shown in FIG. 54B, for example. A shield 414 is provided so as to cover the current paths 401 and 402. A shield 415 for covering the circuit board 410 may also be provided. The shields 414 and 415 form a magnetic shield so as to sandwich the magnetic detection elements 409a and 409b. A shield effect similar to that of a box shield can be achieved by sandwiching the magnetic detection elements 409a and 409b between the shields 414 and 415.

The effects of Embodiment A and so forth can be maintained in Embodiment E. That is, in Embodiment E as well, sensors for current detection and voltage detection, including the microcomputer for power calculation, are mounted on a single substrate. This results in very high built-in efficiency, making it possible to achieve cost reduction.

Embodiment F

As described in the background art section, to incorporate a monitoring device into each apparatus, an extra space for mounting the monitoring device needs to be provided in the apparatus. For this reason, the apparatus may have a large-scale configuration, or it may be necessary to change the specifications of the apparatus or remodel the apparatus.

Therefore, it is an object of the present invention to provide an AC inlet having a current detection function and capable of achieving space saving.

In order to achieve the above-described object, the present invention is directed to, for example, an AC inlet into which a power supply cable is inserted, including: a pair of input terminals configured to receive input of a current through the power supply cable; a terminal holding portion configured to hold the pair of input terminals; a pair of output terminals configured to output the current input by the pair of input terminals; an insulating portion provided at an end of the terminal holding portion, the end being at the pair of output terminals; current paths provided on one surface of the insulating portion and configured to connect the pair of input terminals to the pair of output terminals; and a magnetic detection element provided on another surface of the insulating portion and configured to detect a magnetic field generated from the current paths.

It is preferable that the insulating portion has two surfaces formed along an insertion direction of the power supply cable, and the current paths are provided on one of the two surfaces, and the magnetic detection element is provided on the other surface. Furthermore, it is preferable that the insulating portion is provided integrally with the terminal holding portion so as to protrude from the end of the terminal holding portion at the pair of output terminals. It is also preferable that the current paths and the magnetic detection element are covered by a case, the insulating portion functions as a partitioning portion configured to partition an inner space of the case into first and second spaces, the current paths are disposed in the first space, and the magnetic detection element is disposed in the second space. Note that it is preferable that the case includes a shield case.

The present invention is also directed to an AC inlet into which a power supply cable is inserted, including: a pair of input terminals configured to receive input of a current through the power supply cable; a terminal holding portion configured to hold the pair of input terminals; a pair of output terminals configured to output the current input by the pair of input terminals; current paths configured to connect the pair of input terminals to the pair of output terminals, a magnetic detection element configured to detect a magnetic field generated from the current paths; a case configured to cover the current paths and the magnetic detection element; and a partitioning member configured to partition an interior of the case into a plurality of compartments, wherein the current paths are disposed on one surface of the partitioning member inside the case, and the magnetic detection element is disposed on another surface of the partitioning member inside the case.

Furthermore, the present invention is directed to an AC inlet into which a power supply cable is inserted, including: a pair of input terminals configured to receive input of a current from outside through the power supply cable; a terminal holding portion configured to hold the pair of input terminals; a shield case disposed rearward of the terminal holding portion in a direction in which the power supply cable is removed; a pair of output terminals configured to output the current input by the pair of input terminals to outside of the shield case; current paths configured to connect the pair of input terminals to the pair of output terminals; a partitioning member configured to partition an interior of the shield case into a plurality of compartments; and a magnetic detection element provided in a second compartment of the plurality of compartments that is different from a first compartment through which the current paths pass, and configured to detect a magnetic field generated from the current paths.

Here, in the present invention described above, it is preferable that the partitioning member is an insulating and non-magnetic body. It is also preferable that a low-current component that is operated by a direct current supplied thereto is mounted in the second compartment. Furthermore, it is preferable that the AC inlet further includes: a leg member attached to the partitioning member in the second compartment; and a circuit board supported by the leg member, wherein the magnetic detection element is mounted to the circuit board. It is also preferable that a conductor configured to connect a ground input terminal surrounded by the terminal holding portion to a ground output terminal exposed to the outside of the shield case is provided in the second compartment.

In the present invention, it is preferable that the AC inlet further includes a voltage detection circuit configured to detect a voltage applied to the pair of input terminals, wherein the voltage detection circuit includes: a first voltage dividing element connected at one end to a first input terminal of the pair of input terminals; and a second voltage dividing element connected at one end to a second input terminal of the pair of input terminals.

Furthermore, in the present invention, it is preferable that the first voltage dividing element and the second voltage dividing element are provided in the first compartment, the partitioning member is provided with hole portions through which another end of the first voltage dividing element and another end of the second voltage dividing element are inserted, the other end of the first voltage dividing element is connected to one end of a third voltage dividing element in the second compartment, the other end of the second voltage dividing element is connected to one end of a fourth voltage dividing element in the second compartment, and a differential amplification circuit configured to differentially amplify a voltage divided by the first voltage dividing element and the third voltage dividing element and a voltage divided by the second voltage dividing element and the fourth voltage dividing element is further provided in the second compartment.

Note that in the present invention, it is preferable that the AC inlet further includes a power determination circuit configured to determine power from the current detected by the magnetic detection element and the voltage detected by the voltage detection circuit. It is also preferable that the magnetic detection element is a magnetic impedance element, a fluxgate sensor, or a colossal magnetoresistive element.

Furthermore, the present invention is directed to an AC inlet into which a power supply cable is inserted, including: a pair of input terminals configured to receive input of a current from outside through the power supply cable; a terminal holding portion configured to hold the pair of input terminals; a shield case disposed rearward of the terminal holding portion in a direction in which the power supply cable is removed; a pair of output terminals configured to output the current input by the pair of input terminals to outside of the shield case; current paths configured to connect the pair of input terminals to the pair of output terminals; a partitioning member configured to partition an interior of the shield case into a plurality of compartments; and a voltage detection circuit configured to detect a voltage applied to the pair of input terminals; wherein the voltage detection circuit includes: a first voltage dividing element connected at one end to a first input terminal of the pair of input terminals; and a second voltage dividing element connected at one end to a second input terminal of the pair of input terminals, and the first voltage dividing element and the second voltage dividing element are provided in a first compartment through which the current paths pass, of the plurality of compartments.

Here, in the present invention described above, it is preferable that the first voltage dividing element and the second voltage dividing element are provided in the first compartment, the partitioning member is provided with hole portions through which another end of the first voltage dividing element and another end of the second voltage dividing element are inserted, the other end of the first voltage dividing element is connected to one end of a third voltage dividing element in a second compartment that is different from the first compartment, the other end of the second voltage dividing element is connected to one end of a fourth voltage dividing element in the second compartment, and a differential amplification circuit configured to differentially amplify a voltage divided by the first voltage dividing element and the third voltage dividing element and a voltage divided by the second voltage dividing element and the fourth voltage dividing element is further provided in the second compartment.

The present invention is also directed to a current detection device that is attached to an AC inlet into which a power supply cable is inserted, the AC inlet including a pair of input terminals configured to receive input of a current from outside through the power supply cable, and a terminal holding portion configured to hold the pair of input terminals, the current detection device including: a shield case disposed rearward of the terminal holding portion in a direction in which the power supply cable is removed; a pair of output terminals configured to output the current input by the pair of input terminals to the outside of the shield case; current paths configured to connect the pair of input terminals to the pair of output terminals; a partitioning member configured to partition an interior of the shield case into a plurality of compartments; and a magnetic detection element provided in a second compartment that is different from a first compartment through which the current paths pass, of the plurality of compartments, and configured to detect a magnetic field generated from the current paths.

Furthermore, the present invention is directed to a voltage detection device that is attached to an AC inlet into which a power supply cable is inserted, the AC inlet including a pair of input terminals configured to receive input of a current from the outside through the power supply cable, and a terminal holding portion configured to hold the pair of input terminals, the voltage detection device including: a shield case disposed rearward of the terminal holding portion in a direction in which the power supply cable is removed; a pair of output terminals configured to output the current input by the pair of input terminals to the outside of the shield case; current paths configured to connect the pair of input terminals to the pair of output terminals; a partitioning member configured to partition an interior of the shield case into a plurality of compartments; and a voltage detection circuit configured to detect a voltage applied to the pair of input terminals, wherein the voltage detection circuit includes: a first voltage dividing element connected at one end to a first input terminal of the pair of input terminals; and a second voltage dividing element connected at one end to a second input terminal of the pair of input terminals, and the first voltage dividing element and the second voltage dividing element are provided in a first compartment through which the current paths pass, of the plurality of compartments.

The present invention is applicable to an electronic apparatus including any of the above-described AC inlets. Alternatively, the invention is also applicable to a power supply tap including at least one socket configured to output a current supplied from the AC inlet.

According to the present invention, it is possible to provide an AC inlet having a current detection function and capable of achieving space saving. The AC inlet according to the present invention does not require the large-scale remodeling or the like of an electric apparatus, and can be easily assembled to the electric device or the like. Furthermore, mounting a shield case to the AC inlet makes it possible to provide a highly functional AC inlet having a current detection function and capable of reducing the influence of the magnetic field and noise from a power supply unit and achieving space saving.

The following describes an AC inlet according to an embodiment with reference to FIGS. 56 to 59. FIGS. 56 to 59 are a perspective view showing an external appearance of an AC inlet 540, a side cross-sectional view, a plan cross-sectional view, and a bottom cross-sectional view, respectively, of the AC inlet 540.

Referring to FIG. 56, the AC inlet 540 into which a power supply cable is inserted includes a pair of input terminals 501a and 501b that receive input of a current from the outside through the power supply cable, a ground input terminal 502, an insulating member 503, and a shield case 516 that is disposed rearward of the insulating member 503 in the direction in which the power supply cable is removed. The shield case 516 is provided with a window portion 541 for connector connection. A cable for outputting a result of detection of a current, voltage, or power is connected to a connector 542 through the window portion 541. The insulating member 503 is a terminal holding portion that holds the first input terminal 501a, the second input terminal 501b, and the ground input terminal 502. In the embodiment, the insulating member 503 has the shape of a surrounding tube.

Referring to FIG. 57, the pair of input terminals 501a and 501b for receiving supply of power from the outside of an electronic apparatus and the ground input terminal 502 are provided on the front side of the AC inlet 540. The insulating member 503 is formed of, for example, an insulating resin material, and constitutes a socket portion (receptacle portion) where the plug of the power supply cable is inserted and removed. The dimensions and the like of the input terminals 501a and 501b, the ground input terminal 502, and the insulating member 503 are defined in, for example, the international standard IEC 60320-1 Standard sheet C14. Needless to say, compliance with this standard is not essential for the present invention.

A pair of output terminals 504a and 504b that output the current input by the pair of input terminals 501a and 501b to the outside of the shield case 516 are provided on the rear side of the AC inlet 540. The current output from the pair of output terminals 504a and 504b is supplied to the power supply unit of an electronic apparatus such as an image forming apparatus and an image reading apparatus. Note that the AC inlet 540 may be directly mounted to the power supply unit, or mounted to a casing of the electronic apparatus.

As shown in FIG. 57, the AC inlet 540 is provided with a partitioning member 510 that partitions the interior of the shield case 516 into a plurality of compartments. The partitioning member 510 is, for example, an insulating and non-magnetic body, and provides insulation between the alternating current side (primary side) and the direct current side (secondary side). If the partitioning member 510 is parallel to the surface constituted by the bottom ends of the pair of input terminals 501a and 501b as shown in FIG. 57, the space efficiency in the interior of the shield case 516 is increased.

The partitioning member 510 partitions the inside of the shield case 516 into a first space (first compartment 507) and a second space (second compartment 511). A pair of current paths 506a and 506b that connect the pair of input terminals 501a and 501b to the pair of output terminals 504a and 504b are disposed in the first compartment 507. The pair of input terminals 501a and 501b and the pair of output terminals 504a and 504b are integrally molded members formed of copper or a copper alloy, for example. The input terminals 501a and 501b and the current paths 506a and 506b are electrically connected with solder 508, for example. The input terminals 501a and 501b and the current paths 506a and 506b may be shaped such that they are fitted to one another. The input terminals 501a and 501b and the current paths 506a and 506b may be soldered with solder 508 after they are fitted to one another. As shown in FIG. 58, the current paths 506a and 506b are fixed to the top side of the partitioning member 510 with an adhesive 514.

Low-current components that are operated by a direct current supplied thereto, such as a magnetic detection element 509 and a microprocessor 543 for calculating a current, a voltage, or power, are mounted to the second compartment 511 defined by the partitioning member 510. The second compartment 511 is provided with a conductor 515. The conductor 515 connects the ground input terminal 502 surrounded by the tubular insulating member 503 to a ground output terminal 505 exposed to the outside of the shield case 516. The conductor 515 is electrically connected to the shield case 516. Thereby, the shield case 516 can easily function as a shield that protects the internal circuit from an electromagnetic wave noise and a magnetic field.

The magnetic detection element 509 is mounted to a circuit board 512, and detects the current flowing through the current path 506a by detecting the magnetic field generated from the current path 506a. Note that to operate the magnetic detection element 509, a DC power supply needs to be separately provided. To directly detect the magnetic field from the current path 506a, a highly sensitive magnetic sensor capable of detecting a magnetic field on the order of microtesla may be adopted as the magnetic detection element 509. For example, it is possible to adopt a magnetic impedance element, a fluxgate sensor, or a colossal magnetoresistive element as disclosed in Patent Document 1.

Figure 59:
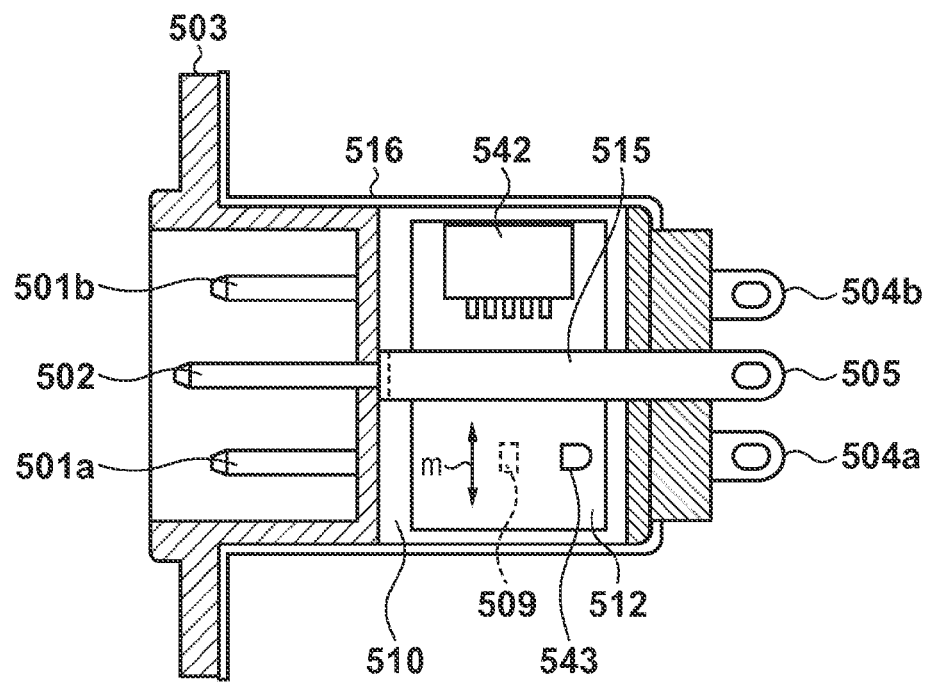
FIG. 59 is a bottom cross-sectional view of the AC inlet.

As shown in FIG. 59, the magnetic field detection direction of the magnetic detection element 509 is the direction indicated by the arrow m. The magnetic detection element 509 is mounted on the circuit board 512 so as to oppose the current path 506a with the partitioning member 510 interposed in between.

The magnetic field generated from the current path 506a is dependent on the amount of current flowing through the current path 506a and the distance from the magnetic detection element 509. Therefore, this distance is defined so as to provide a magnetic field range suitable for the magnetic detection element 509. Additionally, the directions of the currents flowing through the current paths 506a and 506b are opposite to each other. Thus, the position at which the magnetic detection element 509 is placed is set in consideration of influence of the current paths.

To maintain the dimensional relationship of the magnetic detection element 509, the current paths 506a and 506b are fixed to the partitioning member 510. Furthermore, the circuit board 512 is supported by height restriction protruding portions 513, which are leg members attached to the partitioning member 510. Thereby, the fluctuation in the distance of the magnetic detection element 509 to the current paths 506a and 506b is restricted, and it is thus possible to achieve a current sensor with little variation.

Although the current paths 506a and 506b are fixed to the partitioning member 510 with the adhesive 514 in Embodiment F, they may be press-fitted into the resin material used for the partitioning member 510 or may be insert-molded integrally therewith.

In Embodiment F, the magnetic detection element 509 is mounted to the circuit board 512. However, the magnetic detection element 509 from which the terminals extend may be directly bonded to the partitioning member 510 without the circuit board 512.

The output/input from or to the circuit board 512 is performed via the connector 542. The input terminals 501a and 501b and so forth occupy the front side of the AC inlet 540, and the output terminals 504a and 504b occupy the rear surface thereof. Additionally, in relation to ensuring the distance for insulation, a window portion 541 for the connector 542 may be provided on a side surface (the top surface, the bottom surface, the left surface, or the right surface) other than these surfaces.

In the case of using a highly sensitive magnetic detection element 509, the shield case 516 is covered on surfaces other than the front surface of the AC inlet 540. The shield case 516 of Embodiment F is obtained by deep-drawing an iron-based material. However, the shield case 516 may be formed in the shape of a box by using a high-permeability thin plate such as permalloy.

The AC inlet 540 is composed of a receptacle and a current detection device. The receptacle is composed of the pair of input terminals 501a and 501b, the ground input terminal 502, and the insulating member 503. The receptacle has been standardized, and is available from a plurality of manufacturers in the market. Therefore, only the current detection device portion of the AC inlet 540 described in Embodiment F may be implemented. In this case, the production of the AC inlet 540 can be completed by freely choosing and purchasing a receptacle portion, and retrofitting the current detection device to the receptacle.

As such, according to the present embodiment, the current paths 506a and 506b are disposed on one surface of the partitioning member 510 serving as the insulating portion, and the magnetic detection element 509 is disposed on the other surface of the partitioning member 510. That is, the magnetic detection element 509 can be protected by the partitioning member 510 from the alternating current flowing through the current paths 506a and 506b. Note that one surface and the other surface of the partitioning member 510 correspond to two surfaces (a surface on the alternating current side, and a surface on the direct current side) formed on the partitioning member 510 along the insertion direction of the power supply cable. The magnetic detection element 509 can be protected from the alternating current, and it is thus possible to reduce the size of the AC inlet. Note that the partitioning member 510 may be attached to the end of the insulating member 503 on the output terminal side. Alternatively, the partitioning member 510 may be configured integrally with the insulating member 503. In the latter case, the partitioning member 510 is molded so as to protrude from the insulating member 503 toward the output terminal side.

Since an electronic apparatus includes a power supply unit, it is convenient if the power supply unit can detect a current or power. However, it is necessary to secure a sufficient creeping distance for insulation in the power supply circuit board. For this reason, a sensor and a microcomputer, which are low-current components, cannot be mounted with a high density, and an unexpected space is thus required. The current sensor may not be accurately operated due to the influence of the magnetic field leaking from the transformer of the power supply unit. Furthermore, a noise from the power supply unit may cause an erroneous operation of the microcomputer that calculates power. That is, there are various constraints on the incorporation of the current or power detection circuit onto the power supply circuit board. In view of this, the inventors have found that space saving can be achieved by integration of the detection circuit and an AC inlet provided on the periphery of an apparatus in order to connect a power supply unit within the apparatus to a cable connected to a power supply socket of a commercial AC power supply or the like.

That is, the present embodiment provides the AC inlet 540 in which the magnetic detection element 509 that detects a current is mounted inside the shield case 516 provided on the rear side of the tubular insulating member 503. In particular, the shield case 516 reduces the influence of the magnetic field and noise from the power supply unit included in the electronic apparatus. The inside of the shield case 516 is partitioned into a plurality of compartments by the partitioning member 510. The pair of current paths 506a and 506b pass through the first compartment 507. The magnetic detection element 509 is provided in the second compartment 511. Since the magnetic detection element 509 that detects a current is disposed in the second compartment 511 in this way, space saving for the AC inlet 540 is achieved.

The insulation distance between the primary side and the secondary side can be sufficiently ensured by forming the partitioning member 510 of a material that is insulating and non-magnetic. In particular, low-current components that are operated by a direct current supplied thereto are mounted collectively in the second compartment 511, and it is therefore possible to protect the low-current components from the alternating current.

In the second compartment 511, the leg members are attached to the partitioning member 510, thereby supporting the circuit board 512. The circuit board 512 includes the magnetic detection element 509. This enables the magnetic detection element 509 to be accurately positioned relative to the current path 506a for which current measurement is to be performed. This also enhances the current measurement accuracy. Additionally, the grounding conductor 515 passes through the interior of the second compartment 511. This means that the partitioning member 510 is disposed in a small space located between the current paths 506a and 506b and the grounding conductor 515. This arrangement is useful for reducing the size of the AC inlet 540 that includes at least a current detection function. Note that although the present embodiment has described the configuration in which the compartment on the primary side and the compartment on the secondary side are formed by partitioning the interior of the shield case 516 by the partitioning member 510, the present invention is not limited thereto. For example, it is possible to adopt a configuration in which an insulating portion is provided so as to protrude from an end (specifically, the central portion of an end face) of the insulating member (terminal holding portion) that holds the pair of input terminals, without providing the shield case. In this case, a current path may be provided on one surface (one surface along the insertion direction of the power supply cable) of the insulating portion, and the magnetic detection element may be provided on the other surface (the other surface along the insertion direction of the power supply cable) of the insulating portion. This structure can achieve a further space saving. It is preferable that the above-described insulating portion is provided integrally with the terminal holding portion so as to protrude from an end of the terminal holding portion toward the pair of the output terminals because it can be molded integrally. The present embodiment described above shows a structure that is entirely covered by the shield case 516. However, it is possible to adopt a configuration that is covered by a case that does not have a shielding function. Alternatively, the peripheral edge of the end of the above-described terminal holding portion may be extended in the shape of a tube toward the output terminal, thereby covering the functional portions such as the current paths and the magnetic detection element with a part of the terminal holding portion.

Embodiment G

In Embodiment G, a description will be given of a configuration in which a voltage detection circuit is additionally provided so as to enable power detection. Although power can be roughly evaluated by simply measuring a current, power is dependent on the load. For this reason, power cannot be accurately evaluated based on the current alone. Accordingly, detecting both a current and a voltage enables more accurate determination of power. In the following description, the same components as those in Embodiment F are given the same reference numeral, and the description is thereby simplified.

While the plug of a power supply cable from an external power supply such as a commercial AC power supply are connected to the pair of input terminals 501a and 501b, it is often the case that which of the input terminals 501a and 501b is HOT or COLD is not clearly defined. Therefore, in Embodiment G, the detected voltage can be accurately obtained regardless of the polarity of connection by measuring the voltages of the input terminals 501a and 501b and determining the difference therebetween.

Figure 60:
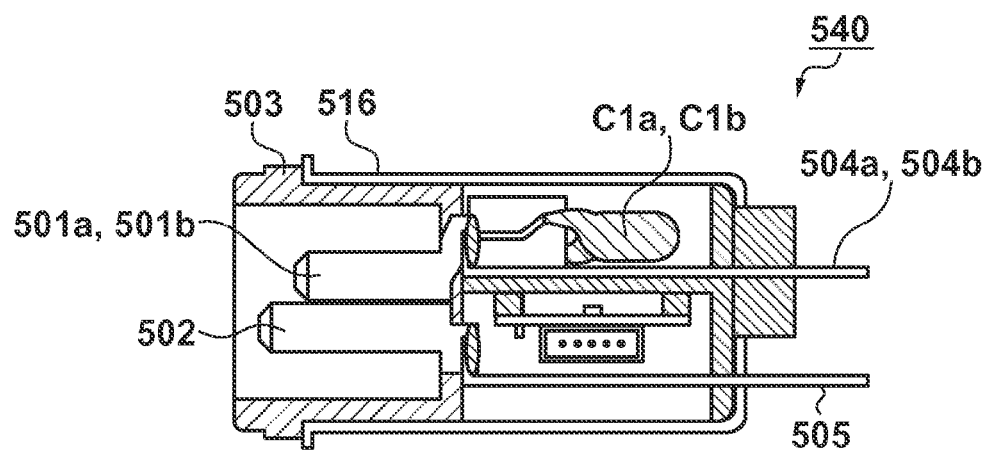
FIG. 60 is a side cross-sectional view of an AC inlet.
Figure 61:
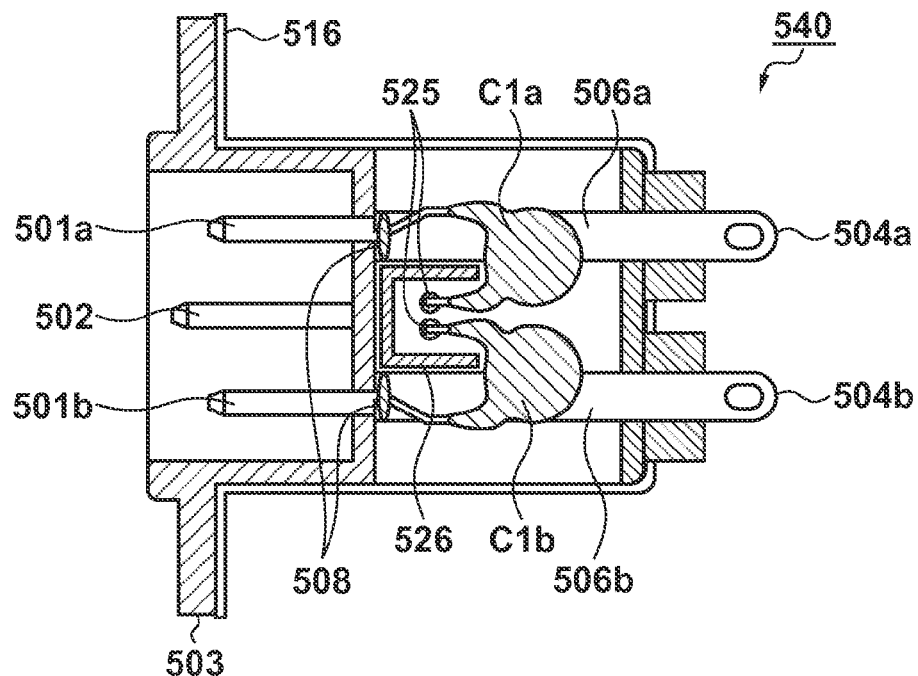
FIG. 61 is a plan cross-sectional view of an AC inlet.
Figure 62:
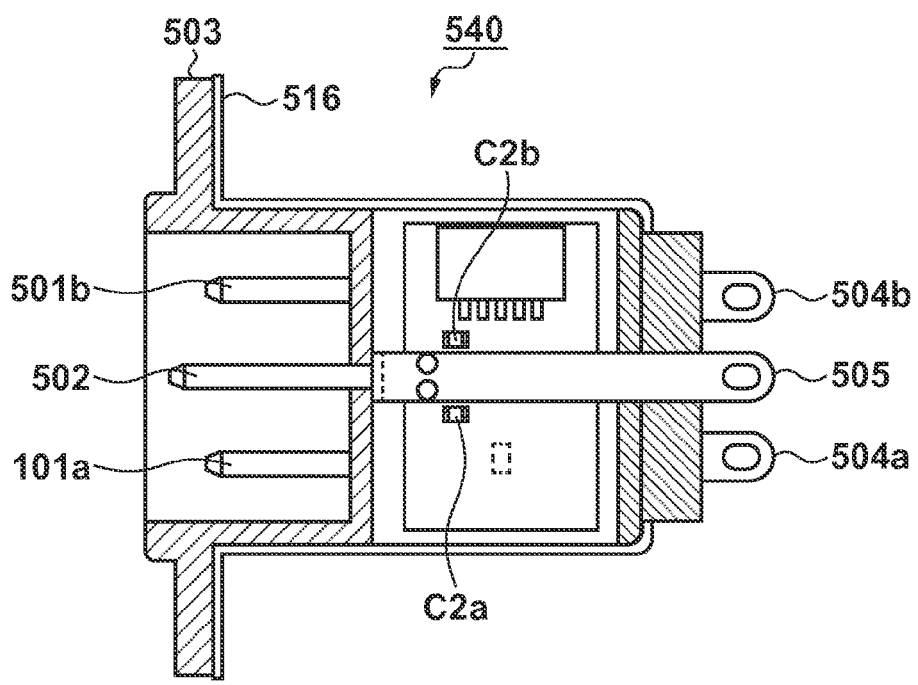
FIG. 62 is a bottom cross-sectional view of the AC inlet.
Figure 63:
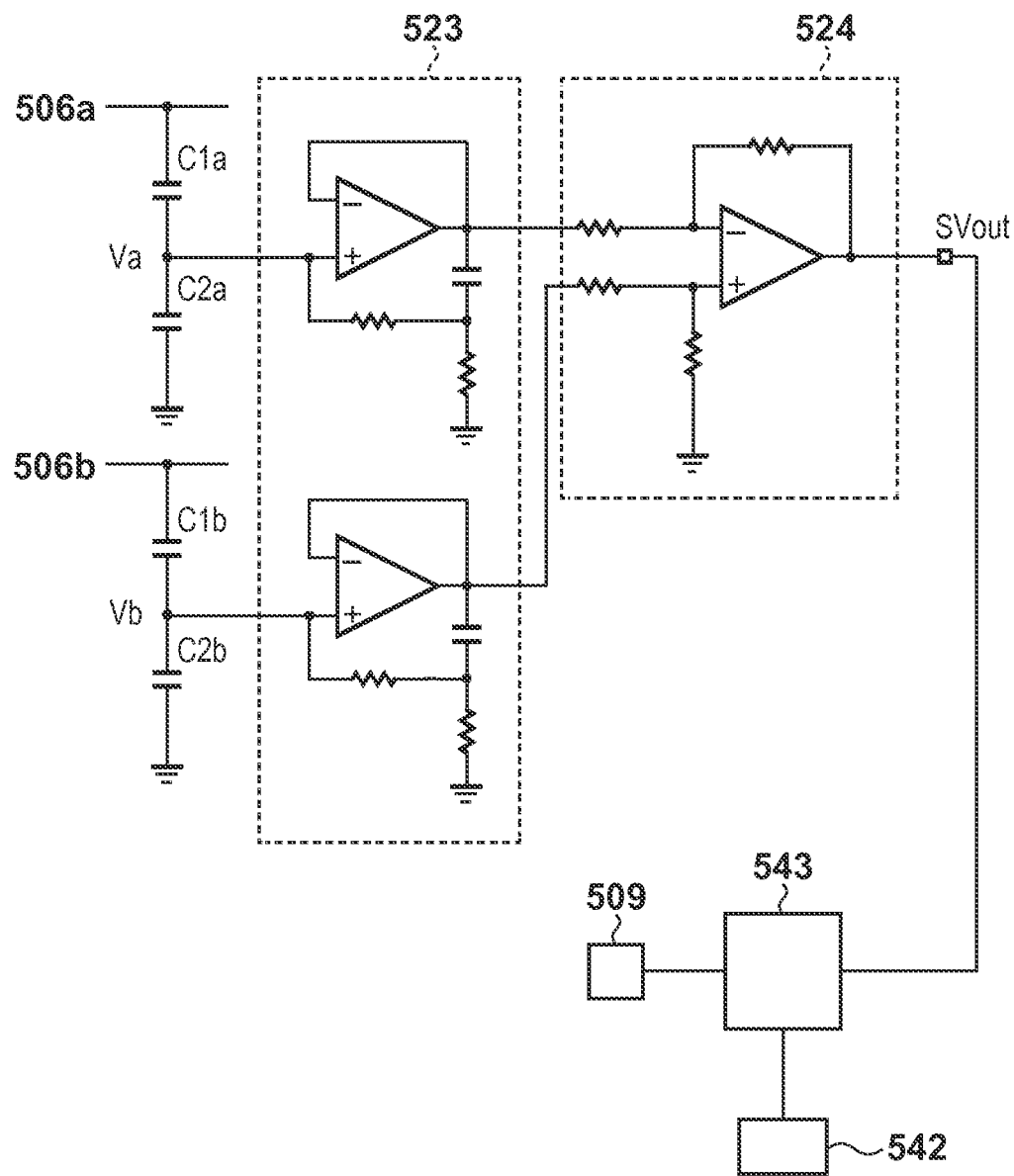
FIG. 63 is a circuit diagram showing a voltage detection circuit.

FIG. 60 is a side cross-sectional view of an AC inlet 540. FIG. 61 is a top cross-sectional view of the AC inlet 540. FIG. 62 is a bottom cross-sectional view of the AC inlet 540. FIG. 63 is a diagram showing a voltage detection circuit that detects a voltage by capacitive voltage division.

As shown in FIGS. 60 and 61, a capacitor C1a is a first voltage dividing element connected at one end to the current path 506a. A capacitor C1b is a second voltage dividing element connected at one end to the current path 506b. Each of the capacitances of the capacitors C1a and C1b is a low capacitance (e.g., 15 pF). The capacitors C1a and C1b are provided in the first compartment 507. The capacitors C1a and C1b that are respectively connected to the current paths 506a and 506b are disposed in the first compartment 507 because this is advantageous in terms of insulation. From the viewpoint of routing terminals, a capacitor with a lead is suitably used as the capacitors C1a and C1b. In addition, from the viewpoint of the surge resistance, it is necessary to use a capacitor having high resistance to a high voltage as the capacitors C1a and C1b. Consequently, the size of the capacitors C1a and C1b tends to be large, but the capacitors C1a and C1b can be fitted in the first compartment 507 by placing them horizontally side by side.

Meanwhile, as shown in FIG. 62, a capacitor C2a serving as a third voltage dividing element and a capacitor C2b serving as a fourth voltage dividing element are mounted on the circuit board 512 in the second compartment 511. The capacitors C2a and C2b are large capacitance (e.g., 15000 pF) capacitors. One ends of the capacitors C2a and C2b are connected to the other ends of the capacitors C1a and C1b, respectively. The other end of each of the capacitors C2a and C2b is connected to a ground.

Of the two terminals of each of the capacitors C1a and C1b, the other end, which is not connected to the current path 506a or 506b, is inserted through a through-hole portion 525 provided in the partitioning member 510, and is connected to the circuit in the second compartment 511. Note that if the creeping distance of the other ends of the capacitors C1a and C1b to the current paths 506a and 506b is insufficient, a surrounding wall 526 may be provided as shown in FIG. 61. The surrounding wall 526 is also formed of an insulating member. The surrounding wall 526 may be formed integrally with the partitioning member 510.

As shown in FIG. 63, the capacitors C1a and C2a form a first voltage dividing circuit, and the capacitors C1b and C2b form a second voltage dividing circuit. The voltages at these dividing points are represented by Va and Vb. For example, when an alternating current of 100 V is applied to the current paths 506a and 506b, voltages corresponding to the impedance ratio appear in the voltages Va and Vb at the dividing points. When the impedance ratio is 1000:1, a voltage of ±0.28 Vpp appears.

An impedance conversion circuit 523 such as a bootstrap circuit is provided at the subsequent stage of the voltage dividing circuits. Further, a differential amplification circuit 524 is provided at the subsequent stage of the impedance conversion circuit 523. The differential amplification circuit 524 differentially amplifies the voltage divided by the first voltage dividing element and the third voltage dividing element and the voltage divided by the second voltage dividing element and the fourth voltage dividing element. The impedance conversion circuit 523 and the differential amplification circuit 524 are also provided in the second compartment 511. Thereby, SVout is obtained as an output of the voltage detection circuit. SVout is input to an A/D port of the microprocessor 543. A detection result from the magnetic detection element 509 is input to another A/D port included in the microprocessor 543. The microprocessor 543 calculates power from the detected voltage and current, and outputs the calculated power to a display device or an external computer through the connector 542. Thus, the microprocessor 543 functions as a power determination circuit that determines power from the current detected by the magnetic detection element 509 and the voltage detected by the voltage detection circuit.

There is a little variation in capacitance of the capacitors, and a sensitivity difference between Va and Vb may pose a problem. In this case, the sensitivity balance may be fine-tuned by placing an attenuator between the impedance conversion circuit 523 and the differential amplification circuit 524. In the case of operating the voltage detection circuit shown in FIG. 63 with a single power supply, the grounds shown in FIG. 63 may be set to a sensor GND (midpoint potential).

Although the voltage detection is performed by using capacitors in Embodiment G, a resistive voltage dividing circuit may be adopted by replacing the capacitors by resistors.

The AC inlet 540 of Embodiment G is composed of a receptacle, a current detection device, and a voltage detection device. If only the voltage needs to be detected, the current detection device may be omitted from the AC inlet 540. In other words, an AC inlet 540 containing only the voltage detection device may be provided. As described in Embodiment F, the current detection device and the voltage detection device in Embodiment G, excluding the receptacle, may be provided as a power detection device. In this case, the production of the AC inlet 540 can be completed by freely choosing and purchasing a receptacle portion, and retrofitting the voltage detection device or the current detection device to the receptacle.

According to the present invention, it is possible to provide an AC inlet 540 having a voltage detection function by providing, in the AC inlet 540, a voltage detection circuit that detects the voltage applied to a pair of input terminals 501a and 501b. Furthermore, mounting this voltage detection circuit in the AC inlet 540 together with the above-described current detection circuit makes it possible to more accurately measure power from a result of detection of the voltage and the current.

In particular, of the voltage detection circuit, the capacitor C1a serving as the first voltage dividing element and the capacitor C1b serving as the second voltage dividing element are disposed in the first compartment 507. On the other hand, the capacitor C2a serving as the third voltage dividing element and the capacitor C1b serving as the fourth voltage dividing element are disposed in the second compartment 511. To form a voltage dividing circuit, these dividing elements needs to be connected. Therefore, the partitioning member 510 is provided with hole portions through which the other end of the first capacitive element and the other end of the second capacitive element are inserted. This facilitates voltage measurement, while ensuring the insulation distance. In addition, space saving is achieved by disposing the voltage dividing elements so as to be distributed in a plurality of compartments.

Embodiment H

In Embodiment H, a description will be given of an exemplary application of the AC inlets 540 described in Embodiments F and G. The receptacle portion of the AC inlets 540 is defined in an international standard, and is widely used. Thus, for electronic apparatuses and electronic taps that are marketed in several countries, the conversion cords (power supply cables) matching the power supply plugs of the corresponding countries may be packaged with the electronic apparatuses and electronic taps before being offered for sale. This makes it possible to use the same body for electronic apparatuses and electronic taps. In particular, the use of the AC inlets 540 of Embodiments F and G in these electronic apparatuses and electronic taps enables easy power monitoring and control, regardless of the power supply circuit.

Figure 64:
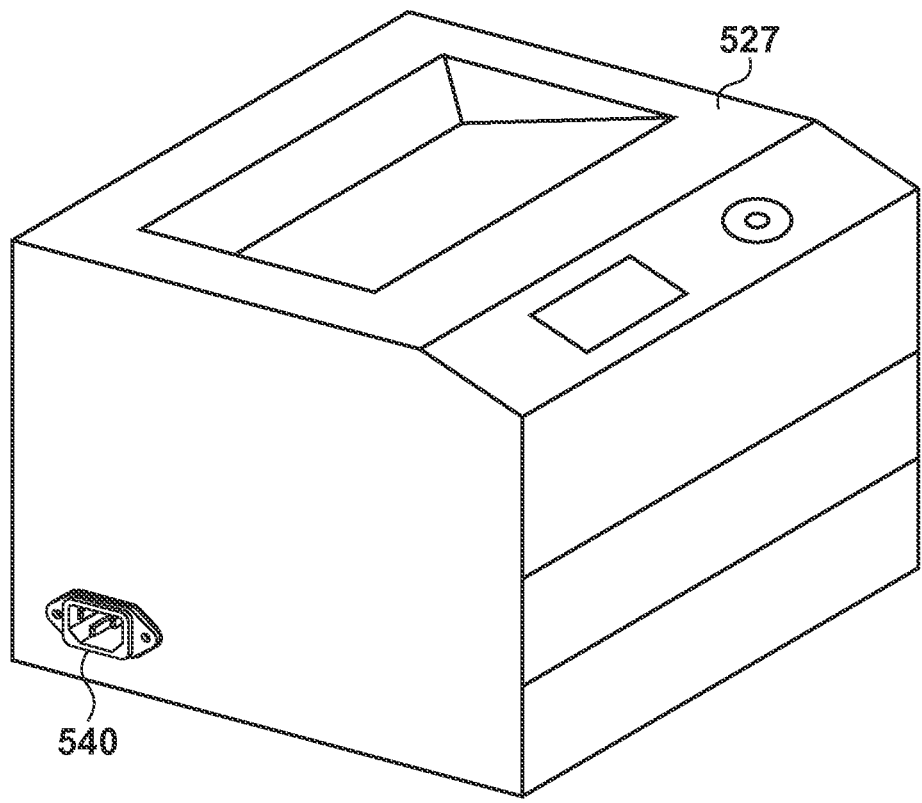
FIG. 64 is an external view showing an exemplary electronic apparatus.

For example, in the case of an image forming apparatus 527 as shown in FIG. 64, the AC inlet 540 is provided on the periphery thereof. FIG. 65 shows a block diagram of the image forming apparatus 527.

There are various types of power supply sockets for an external power supply. Examples thereof include power supply sockets 158a and 528b. A conversion cord 529 is a plug having one end that matches a country-specific power supply socket and the other end that matches the receptacle of the AC inlet 540. A power supply circuit 530 is connected to the pair of output terminals 504a and 504b and the ground output terminal 505 of the AC inlet 540. The power supply circuit 530 converts an input alternating current, thereby generating a plurality of direct currents required by the electronic apparatus.

In the AC inlet 540, the microprocessor 543 determines an alternating current, a voltage, power, or the like, and outputs the determined values to a control circuit 531 via an interface such as a UART or SPI. The control circuit 531 grasps the overall power amount of the electronic apparatus, and controls a driving unit 532 such that a pre-set upper limit will not be exceeded. Alternatively, the control circuit 531 may visualize the power usage amount by sending display data indicating the power amount to the display unit 533. Additionally, the control circuit 531 may distribute the power data to an external computer or the like by using a LAN connector 534. This also makes it possible to manage the power amount by using a network.

By detecting a current, a voltage, or power by the AC inlet 540 including a widely used receptacle, it is possible to easily grasp the status of the power supply, with little burden on the hardware design of the body of the electronic apparatus.

As shown in FIG. 66, the AC inlet 540 may be incorporated into a power supply tap 535. The power supply tap 535 includes at least one socket 536 that outputs the current supplied from the AC inlet 540. The current, voltage or power data may be monitored by an external computer from the connector 542 of the AC inlet 540 of the power supply tap 535 via a USB or a LAN line. The data transfer may be performed through wired or wireless communication.

Thus, the present invention can provide an electronic apparatus or power supply tap 535 that includes the AC inlet 540. The AC inlet 540 has the function of detecting a current, a voltage, or power, and thus is advantageous in that a detection function can be easily added to the electronic apparatus or the like. Additionally, because of its highly compact configuration, the AC inlet 540 can easily ensure the degree of freedom of the space on the electronic apparatus side.

Meanwhile, to incorporate the above-described current detection circuit into the AC inlet 540, the size of the current detection circuit has to be reduced so as to be fully accommodated inside the second compartment 511 within the shield case 516. Further, more severe space constraints will be imposed in order to incorporate the current detection circuit and the like within the shield case 516 together with a noise filter. Examples of the current detection circuit include a circuit that uses a current transformer. However, a current transformer is required to have a certain size so as not to saturate the magnetic substance core. Therefore, the current detection circuit that uses a current transformer is not suitable for applications where it needs to be incorporated into the AC inlet 540. A current detection circuit that uses a Hall element requires a magnetic flux collecting core, and therefore, the size of this core cannot be reduced from the viewpoint of magnetic saturation. The size problem does not easily occur if a shunt resistor is placed in an AC line. However, it is necessary to provide insulation for a signal to be extracted, and therefore the use of a photocoupler or the like is essential. Accordingly, there is a problem in terms of size reduction. Further, a shunt resistor generates a large amount of heat when the current is large, and thus the shunt resistor can only cope with a current of several amperes. Therefore, the present invention provides a magnetic detection element that detects a current by directly detecting a magnetic field from the current paths.

Thus, the current detection circuits described in Embodiments 1 to 8 can be made highly compact, as compared with a current transformer or the like. Accordingly, they can also be incorporated into the AC inlets 540 described in Embodiments F to H.

The following is a list of aspects derived from Embodiments F to H.

Aspect 1

An AC inlet into which a power supply cable is inserted, comprising:

a pair of input terminals configured to receive input of a current through the power supply cable;

a terminal holding portion configured to hold the pair of input terminals;

a pair of output terminals configured to output the current input by the pair of input terminals;

an insulating portion provided at an end of the terminal holding portion, the end being at the pair of output terminals;

current paths provided on one surface of the insulating portion and configured to connect the pair of input terminals to the pair of output terminals; and a magnetic detection element provided on another surface of the insulating portion and configured to detect a magnetic field generated from the current paths.

Aspect 2

The AC inlet according to aspect 1, wherein the one surface of the insulating portion and the other surface of the insulating portion are two surfaces formed on the insulating portion along an insertion direction of the power supply cable.

Aspect 3

The AC inlet according to aspect 1 or 2, wherein the insulating portion is provided integrally with the terminal holding so as to protrude from the end of the terminal holding portion at the pair of output terminals.

Aspect 4

The AC inlet according to any one of aspects 1 to 3, wherein the current paths and the magnetic detection element are covered by a case, the insulating portion functions as a partitioning portion configured to partition an inner space of the case into first and second spaces, the current paths are disposed in the first space, and the magnetic detection element is disposed in the second space.

Aspect 5

The AC inlet according to aspect 4, wherein the case comprises a shield case.

Aspect 6

An AC inlet into which a power supply cable is inserted, comprising:

a pair of input terminals configured to receive input of a current through the power supply cable;

a terminal holding portion configured to hold the pair of input terminals;

a pair of output terminals configured to output the current input by the pair of input terminals;

current paths configured to connect the pair of input terminals to the pair of output terminals, a magnetic detection element configured to detect a magnetic field generated from the current paths;

a case configured to cover the current paths and the magnetic detection element; and a partitioning member configured to partition an interior of the case into a plurality of compartments, wherein the current paths are disposed on one surface of the partitioning member inside the case, and the magnetic detection element is disposed on another surface of the partitioning member inside the case.

Aspect 7

An AC inlet into which a power supply cable is inserted, comprising:

a pair of input terminals configured to receive input of a current from outside through the power supply cable;

a terminal holding portion configured to hold the pair of input terminals;

a shield case disposed rearward of the terminal holding portion in a direction in which the power supply cable is removed;

a pair of output terminals configured to output the current input by the pair of input terminals to outside of the shield case;

current paths configured to connect the pair of input terminals to the pair of output terminals;

a partitioning member configured to partition an interior of the shield case into a plurality of compartments; and a magnetic detection element provided in a second compartment of the plurality of compartments that is different from a first compartment through which the current paths pass, and configured to detect a magnetic field generated from the current paths.

Aspect 8

The AC inlet according to aspect 6 or 7, wherein the partitioning member is an insulating and non-magnetic body.

Aspect 9

The AC inlet according to aspect 7 or 8, wherein a low-current component that is operated by a direct current supplied thereto is mounted in the second compartment.

Aspect 10

The AC inlet according to any one of aspects 7 to 9, further comprising:

a leg member attached to the partitioning member in the second compartment; and a circuit board supported by the leg member, wherein the magnetic detection element is mounted to the circuit board.

Aspect 11

The AC inlet according to any one of aspects 7 to 10, wherein a conductor configured to connect a ground input terminal surrounded by the terminal holding portion to a ground output terminal exposed to the outside of the shield case is provided in the second compartment.

Aspect 12

The AC inlet according to any one of aspects 7 to 11, further comprising a voltage detection circuit configured to detect a voltage applied to the pair of input terminals, wherein the voltage detection circuit includes:

a first voltage dividing element connected at one end to a first input terminal of the pair of input terminals; and a second voltage dividing element connected at one end to a second input terminal of the pair of input terminals.

Aspect 13

The AC inlet according to aspect 12, wherein the first voltage dividing element and the second voltage dividing element are provided in the first compartment, the partitioning member is provided with hole portions through which another end of the first voltage dividing element and another end of the second voltage dividing element are inserted, the other end of the first voltage dividing element is connected to one end of a third voltage dividing element in the second compartment, the other end of the second voltage dividing element is connected to one end of a fourth voltage dividing element in the second compartment, and a differential amplification circuit configured to differentially amplify a voltage divided by the first voltage dividing element and the third voltage dividing element and a voltage divided by the second voltage dividing element and the fourth voltage dividing element is further provided in the second compartment.

Aspect 14

The AC inlet according to aspect 12 or 13, further comprising a power determination circuit configured to determine power from the current detected by the magnetic detection element and the voltage detected by the voltage detection circuit.

Aspect 15

The AC inlet according to any one of aspects 1 to 14, wherein the magnetic detection element is a magnetic impedance element, a fluxgate sensor, or a colossal magnetoresistive element.

Aspect 16

An AC inlet into which a power supply cable is inserted, comprising:

a pair of input terminals configured to receive input of a current from outside through the power supply cable;

a terminal holding portion configured to hold the pair of input terminals;

a shield case disposed rearward of the terminal holding portion in a direction in which the power supply cable is removed;

a pair of output terminals configured to output the current input by the pair of input terminals to outside of the shield case;

current paths configured to connect the pair of input terminals to the pair of output terminals;

a partitioning member configured to partition an interior of the shield case into a plurality of compartments; and a voltage detection circuit configured to detect a voltage applied to the pair of input terminals;

wherein the voltage detection circuit includes:

a first voltage dividing element connected at one end to a first input terminal of the pair of input terminals; and a second voltage dividing element connected at one end to a second input terminal of the pair of input terminals, and the first voltage dividing element and the second voltage dividing element are provided in a first compartment through which the current paths pass, of the plurality of compartments.

Aspect 17

The AC inlet according to aspect 16, wherein the first voltage dividing element and the second voltage dividing element are provided in the first compartment, the partitioning member is provided with hole portions through which another end of the first voltage dividing element and another end of the second voltage dividing element are inserted, the other end of the first voltage dividing element is connected to one end of a third voltage dividing element in a second compartment that is different from the first compartment, the other end of the second voltage dividing element is connected to one end of a fourth voltage dividing element in the second compartment, and a differential amplification circuit configured to differentially amplify a voltage divided by the first voltage dividing element and the third voltage dividing element and a voltage divided by the second voltage dividing element and the fourth voltage dividing element is further provided in the second compartment.

Aspect 18

A current detection device that is attached to an AC inlet into which a power supply cable is inserted, the AC inlet including a pair of input terminals configured to receive input of a current from outside through the power supply cable, and a terminal holding portion configured to hold the pair of input terminals, the current detection device comprising:

a shield case disposed rearward of the terminal holding portion in a direction in which the power supply cable is removed;

a pair of output terminals configured to output the current input by the pair of input terminals to the outside of the shield case;

current paths configured to connect the pair of input terminals to the pair of output terminals;

a partitioning member configured to partition an interior of the shield case into a plurality of compartments; and a magnetic detection element provided in a second compartment that is different from a first compartment through which the current paths pass, of the plurality of compartments, and configured to detect a magnetic field generated from the current paths.

Aspect 19

A voltage detection device that is attached to an AC inlet into which a power supply cable is inserted, the AC inlet including a pair of input terminals configured to receive input of a current from the outside through the power supply cable, and a terminal holding portion configured to hold the pair of input terminals, the voltage detection device comprising:

a shield case disposed rearward of the terminal holding portion in a direction in which the power supply cable is removed;

a pair of output terminals configured to output the current input by the pair of input terminals to the outside of the shield case;

current paths configured to connect the pair of input terminals to the pair of output terminals;

a partitioning member configured to partition an interior of the shield case into a plurality of compartments; and a voltage detection circuit configured to detect a voltage applied to the pair of input terminals, wherein the voltage detection circuit includes:

a first voltage dividing element connected at one end to a first input terminal of the pair of input terminals; and a second voltage dividing element connected at one end to a second input terminal of the pair of input terminals, and the first voltage dividing element and the second voltage dividing element are provided in a first compartment through which the current paths pass, of the plurality of compartments.

Aspect 20

An electronic apparatus comprising the AC inlet according to any one of aspects 1 to 17.

Aspect 21

A power supply tap comprising:

the AC inlet according to any one of aspects 1 to 17; and at least one socket configured to output a current supplied from the AC inlet.

The present invention is not limited to the above-described embodiments, and various changes and modifications can be made within the spirit and scope of the present invention. Therefore, to apprise the public of the scope of the present invention, the following claims are made.

What is claimed is:

1. A measurement module for measuring a current, comprising:

a pair of input terminals configured to receive input of a current;

current paths connected to the pair of input terminals, a pair of output terminals connected to the current paths and configured to output the current input by the pair of input terminals;

a terminal holding portion configured to hold the pair of input terminals;

an insulating portion provided along the current paths; and a magnetic detection element configured to detect a current flowing through the current paths by detecting a magnetic field transmitted through the insulating portion from the current paths, wherein the insulating portion is further configured to partition an inner space of the measurement module between the pair of input terminals and the pair of output terminals into a first space serving as a space on one surface and a second space serving as a space on another surface, the terminal holding portion is disposed on the one surface of the insulating portion, the current paths are fixed on said one surface of the insulating portion, and the magnetic detection element is disposed on a circuit board supported by a leg member fixed on said another surface of the insulating portion.

2. The measurement module according to claim 1, further comprising a magnetic shield disposed so as to cover, the second space.

3. The measurement module according to claim 1, wherein a low-current component that is operated by a direct current supplied thereto is mounted in the second space.

4. The measurement module according to claim 1, further comprising a voltage detection circuit configured to detect a voltage applied to the pair of input terminals, wherein the voltage detection circuit includes:

a first voltage dividing element connected at one end to a first input terminal of the pair of input terminals; and a second voltage dividing element connected at one end to a second input terminal of the pair of input terminals.

5. The measurement module according to claim 4, wherein the first voltage dividing element and the second voltage dividing element are provided on the one surface, the insulating portion is provided with hole portions through which another end of the first voltage dividing element and another end of the second voltage dividing element are inserted, the other end of the first voltage dividing element is connected to one end of a third voltage dividing element on the other surface, the other end of the second voltage dividing element is connected to one end of a fourth voltage dividing element on the other surface, and a differential amplification circuit configured to differentially amplify a voltage divided by the first voltage dividing element and the third voltage dividing element and a voltage divided by the second voltage dividing element and the fourth voltage dividing element is further provided on the other surface.

6. The measurement module according to claim 4, further comprising a power determination circuit provided on the other surface and configured to determine power from the current detected by the magnetic detection element and the voltage detected by the voltage detection circuit.

7. The measurement module according to claim 1, wherein the magnetic detection element is a magnetic impedance element, a fluxgate sensor, or a colossal magnetoresistive element.

8. The measurement module according to claim 1, wherein at least one of the current paths includes a non-energized area for generating a magnetic field in a direction in which the current path extends, and the magnetic detection element is disposed such that a magnetic field detection direction of the magnetic detection element extends along the direction in which the current path extends.

9. A measurement module for measuring a current, comprising:

a pair of input terminals configured to receive input of a current through a power supply cable;

a terminal holding portion configured to hold the pair of input terminals:

a pair of output terminals configured to output the current input by the pair of input terminals;

a case configured to cover a space located between the terminal holding portion and the pair of output terminals:

an insulating portion provided between the terminal holding portion and the pair of output terminals, and configured to partition the space;

current paths fixed on one surface of the insulating portion and configured to connect the pair of input terminals and the pair of output terminals;

a conductor provided on another surface of the insulating portion and configured to connect a ground input terminal located at the terminal holding portion to a ground output terminal exposed to outside of the case and located adjacent to the pair of output terminals; and a magnetic detection element provided on a circuit board provided on another side of the insulating portion and configured to detect a magnetic field generated by the current paths.

10. A measurement module for measuring a voltage, comprising:

a pair of input terminals configured to receive input of a current;

current paths connected to the pair of input terminals;

a pair of output terminals connected to the current paths and configured to output the current input by the pair of input terminals;

an insulating portion provided along the current paths; and a voltage detection circuit configured to detect a voltage applied to the pair of input terminals, wherein the voltage detection circuit includes:

a first voltage dividing element connected at one end to a first input terminal of the pair of input terminals;

a second voltage dividing element connected at one end to a second input terminal of the pair of input terminals;

a third voltage dividing element to which another end of the first voltage dividing element is connected;

a fourth voltage dividing element to which another end of the second voltage dividing element is connected; and a differential amplification circuit configured to differentially amplify a voltage divided by the first voltage dividing element and the third voltage dividing element and a voltage divided by the second voltage dividing element and the fourth voltage dividing element, the insulating portion is provided with hole portions through which the other end of the first voltage dividing element and the other end of the second voltage dividing element are inserted, the current paths, the first voltage dividing element, and the second voltage dividing element are provided on one surface of the insulating portion, and the third voltage dividing element, the fourth voltage dividing element, and the differential amplification circuit are disposed on another surface of the insulating portion.

11. An electronic apparatus comprising a measurement module for measuring a current including:

a pair of input terminals configured to receive input of a current;

current paths connected to the pair of input terminals, a pair of output terminals connected to the current paths and configured to output the current input by the pair of input terminals;

a terminal holding portion configured to hold the pair of input terminals;

an insulating portion provided along the current paths; and a magnetic detection element configured to detect a current flowing through the current paths by detecting a magnetic field transmitted through the insulating portion from the current paths, wherein the insulating portion is further configured to partition an inner space of the measurement module and located between the pair of input terminals and the pair of output terminals into a first space serving as a space on one surface and a second space serving as a space on another, the terminal holding portion is disposed on the one surface of the insulating portion, the current paths are fixed on said one surface of the insulating portion, and the magnetic detection element is disposed on a circuit board supported by a leg member fixed on said another surface of the insulating portion.

12. A power supply tap comprising a measurement module for measuring a current including:

a pair of input terminals configured to receive input of a current;

current paths connected to the pair of input terminals, a pair of output terminals connected to the current paths and configured to output the current input by the pair of input terminals;

a terminal holding portion configured to hold the pair of input terminals;

an insulating portion provided along the current paths; and a magnetic detection element configured to detect a current flowing through the current paths by detecting a magnetic field transmitted through the insulating portion from the current paths, wherein the insulating portion is further configured to partition an inner space of the measurement module and located between the pair of input terminals and the pair of output terminals into a first space serving as a space on one surface and a second space serving as a space on another surface, the terminal holding portion is disposed on the one surface of the insulating portion, the current paths are fixed on said one surface of the insulating portion, and the magnetic detection element is disposed on a circuit board supported by a leg member fixed on said another surface of the insulating portion.

13. A power supply unit comprising a measurement module for measuring a current including:

a pair of input terminals configured to receive input of a current;

current paths connected to the pair of input terminals, a pair of output terminals connected to the current paths and configured to output the current input by the pair of input terminals;

a terminal holding portion configured to hold the pair of input terminals;

an insulating portion provided along the current paths; and a magnetic detection element configured to detect a current flowing through the current paths by detecting a magnetic field transmitted through the insulating portion from the current paths, wherein the insulating portion is further configured to partition an inner space of the measurement module and located between the pair of input terminals and the pair of output terminals into a first space serving as a space on one surface and a second space serving as a space on another surface, the terminal holding portion is disposed on the one surface of the insulating portion, the current paths are fixed on said one surface of the insulating portion, and the magnetic detection element is disposed on a circuit board supported by a leg member fixed on said another surface of the insulating portion.

14. A built-in measurement module comprising a measurement module for measuring a current as a module for being incorporated into an electronic apparatus, the measurement module including:

a pair of input terminals configured to receive input of a current;

current paths connected to the pair of input terminals, a pair of output terminals connected to the current paths and configured to output the current input by the pair of input terminals;

a terminal holding portion configured to hold the pair of input terminals;

an insulating portion provided along the current paths; and a magnetic detection element configured to detect a current flowing through the current paths by detecting a magnetic field transmitted through the insulating portion from the current paths, wherein the insulating portion is further configured to partition an inner space of the measurement module and located between the pair of input terminals and the pair of output terminals into a first space serving as a space on one surface and a second space serving as a space on another surface, the terminal holding portion is disposed on the one surface of the insulating portion, the current paths are fixed on said one surface of the insulating portion, and the magnetic detection element is disposed on a circuit board supported by a leg member fixed on said another surface of the insulating portion.

* * * * *